(12) United States Patent
Hosoda et al.

(10) Patent No.: US 10,347,647 B1
(45) Date of Patent: Jul. 9, 2019

(54) THREE-DIMENSIONAL MEMORY DEVICE CONTAINING MULTI-THRESHOLD-VOLTAGE DRAIN SELECT GATES AND METHOD OF MAKING THE SAME

(71) Applicant: SANDISK TECHNOLOGIES LLC, Plano, TX (US)

(72) Inventors: Naohiro Hosoda, Yokkaichi (JP); Keisuke Shigemura, Yokkaichi (JP); Junichi Ariyoshi, Yokkaichi (JP); Kazuki Kajitani, Yokkaichi (JP); Yuji Fukano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/850,073

(22) Filed: Dec. 21, 2017

(51) Int. Cl.
*H01L 27/115* (2017.01)
*H01L 27/11556* (2017.01)
(Continued)

(52) U.S. Cl.
CPC ...... *H01L 27/11556* (2013.01); *H01L 21/266* (2013.01); *H01L 21/26513* (2013.01);
(Continued)

(58) Field of Classification Search
CPC ......... H01L 27/11556; H01L 21/26513; H01L 21/266; H01L 27/11519; H01L 27/11524; H01L 27/11565; H01L 27/1157; H01L 27/11582; H01L 29/408; H01L 29/0649; H01L 29/792; G11C 16/24
See application file for complete search history.

(56) References Cited

U.S. PATENT DOCUMENTS 5,915,167 A  6/1999 Leedy
9,530,787 B2  12/2016 Tsutsumi et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Shahed Ahmed
(74) *Attorney, Agent, or Firm* — The Marbury Law Group PLLC

(57) ABSTRACT

A memory device contains a stack of insulating layers and electrically conductive word line layers, at least one first drain select gate electrode located over the stack and extending through a first drain select transistor and a second drain select transistor, at least one second drain select gate electrode located between the first drain select electrode and the stack, and extending through a third drain select transistor and a fourth drain select transistor. The first drain select transistor and the third drain select transistor are located in a first NAND memory string. The second drain select transistor and the fourth drain select transistor are located in a second NAND memory string different from the first NAND memory string. The first drain select transistor has a higher threshold voltage than the second drain select transistor. The third drain select transistor has a lower threshold voltage than the fourth drain select transistor.

11 Claims, 43 Drawing Sheets

(51) Int. Cl.
*H01L 27/11519* (2017.01)
*H01L 27/11565* (2017.01)
*H01L 27/11582* (2017.01)
*H01L 27/1157* (2017.01)
*H01L 21/265* (2006.01)
*H01L 21/266* (2006.01)
*H01L 27/11524* (2017.01)
*H01L 29/40* (2006.01)

(52) U.S. Cl.
CPC .... *H01L 27/1157* (2013.01); *H01L 27/11519* (2013.01); *H01L 27/11524* (2013.01); *H01L 27/11565* (2013.01); *H01L 27/11582* (2013.01); *H01L 29/408* (2013.01)

(56) References Cited

U.S. PATENT DOCUMENTS

| | | | |
|---|---|---|---|
| 2017/0236896 A1* | 8/2017 | Lu | H01L 29/0649 257/314 |
| 2017/0278571 A1* | 9/2017 | Chowdhury | G11C 16/0483 |
| 2018/0233513 A1 | 8/2018 | Zhang et al. | |

OTHER PUBLICATIONS

U.S. Appl. No. 15/286,063, filed Oct. 5, 2016, Sandisk Technologies LLC.
U.S. Appl. No. 15/354,067, filed Nov. 17, 2016, Sandisk Technologies LLC.
U.S. Appl. No. 15/354,795, filed Nov. 17, 2016, Sandisk Technologies LLC.
U.S. Appl. No. 15/468,732, filed Mar. 24, 2017, Sandisk Tehcnologies LLC.
U.S. Appl. No. 15/496,359, filed Apr. 25, 2017, Sandisk Technologies LLC.
U.S. Appl. No. 15/628,495, filed Jun. 20, 2017, Sandisk Technologies LLC.
U.S. Appl. No. 15/685,254, filed Aug. 24, 2017, Sandisk Technologies LLC.
U.S. Appl. No. 15/704,286, filed Sep. 14, 2017, Sandisk Technologies LLC.
U.S. Appl. No. 15/784,549, filed Oct. 16, 2017, Sandisk Technologies LLC.
U.S. Appl. No. 15/818,061, filed Nov. 20, 2017, Sandisk Technologies LLC.
U.S. Appl. No. 15/818,146, filed Nov. 20, 2017, Sandisk Technologies LLC.

* cited by examiner

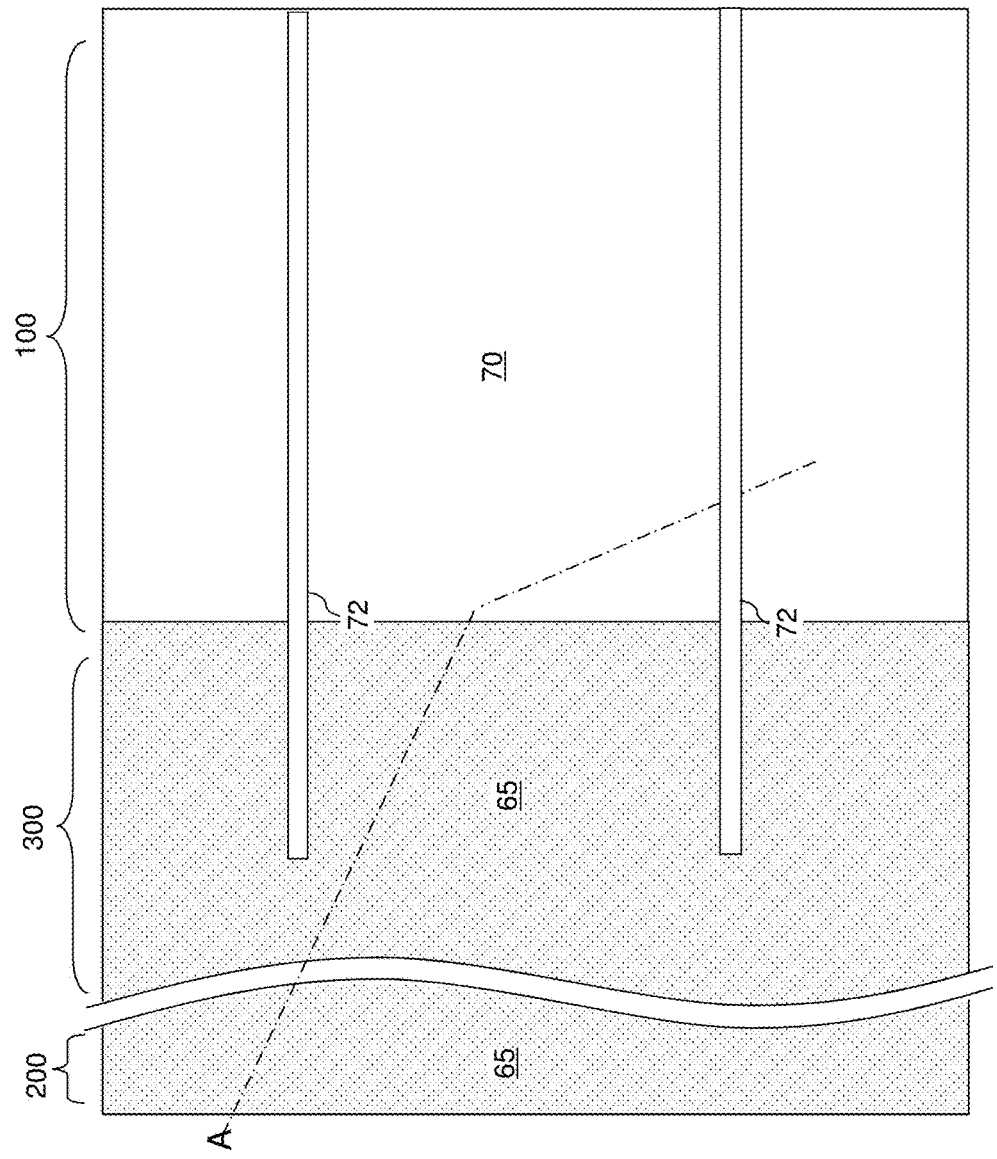

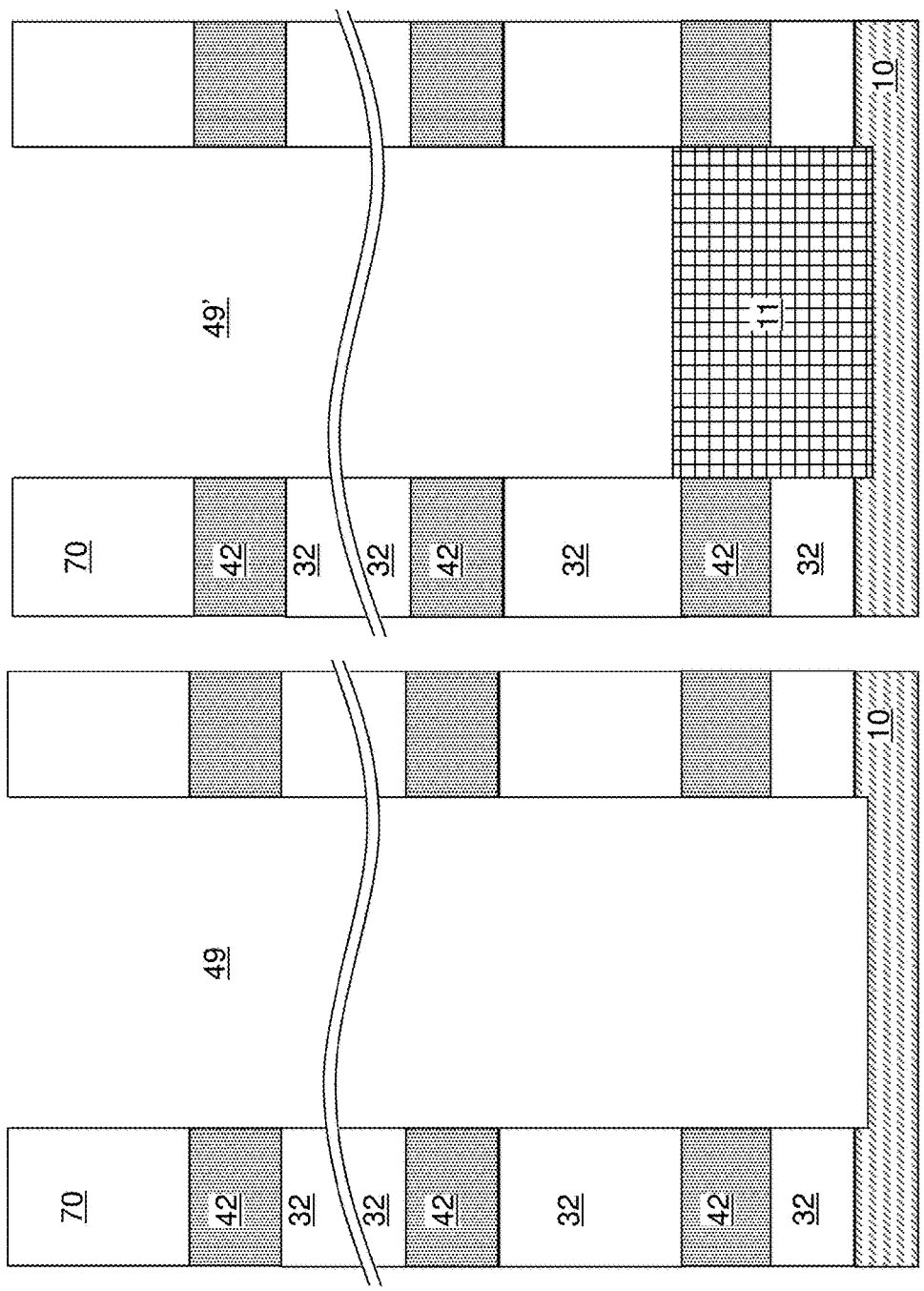

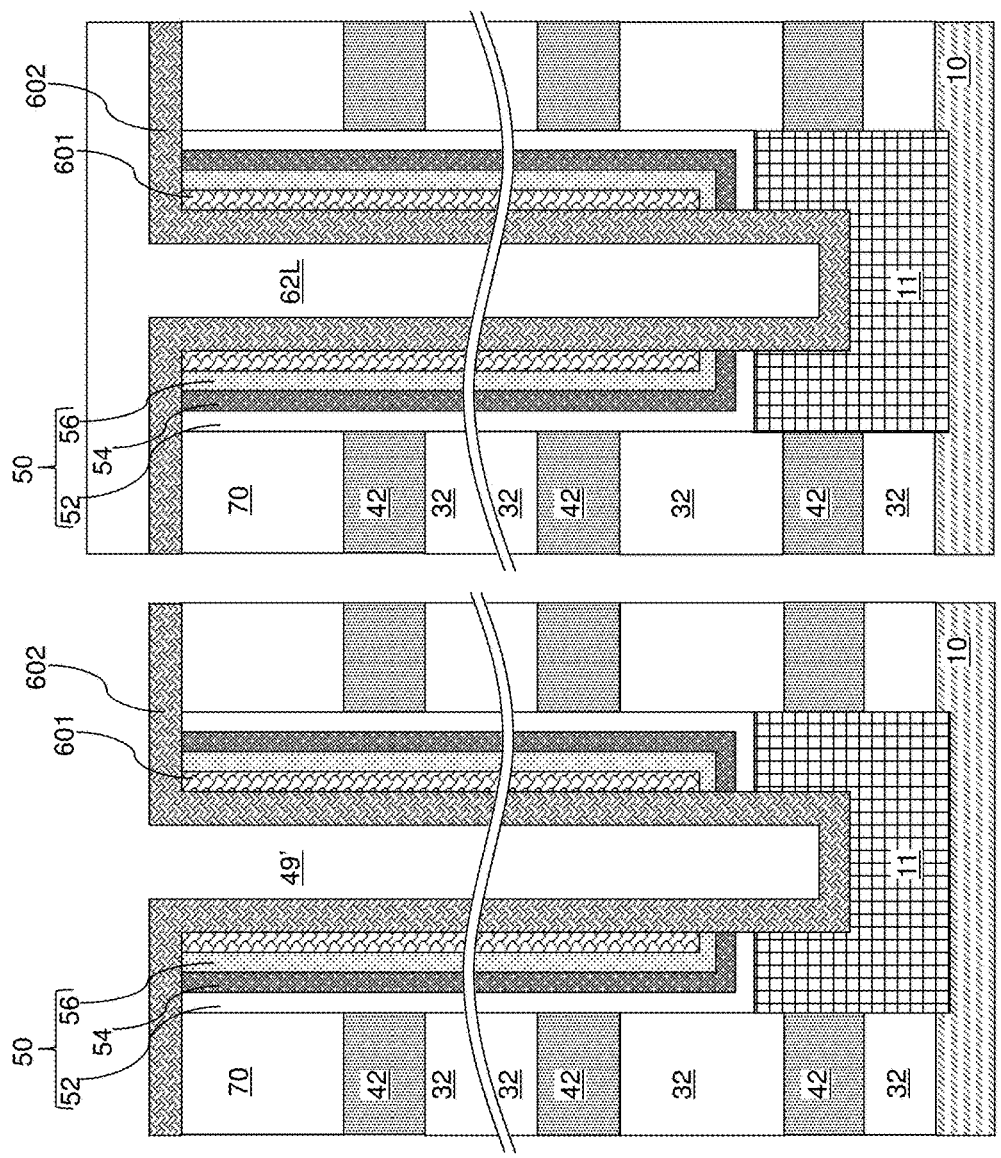

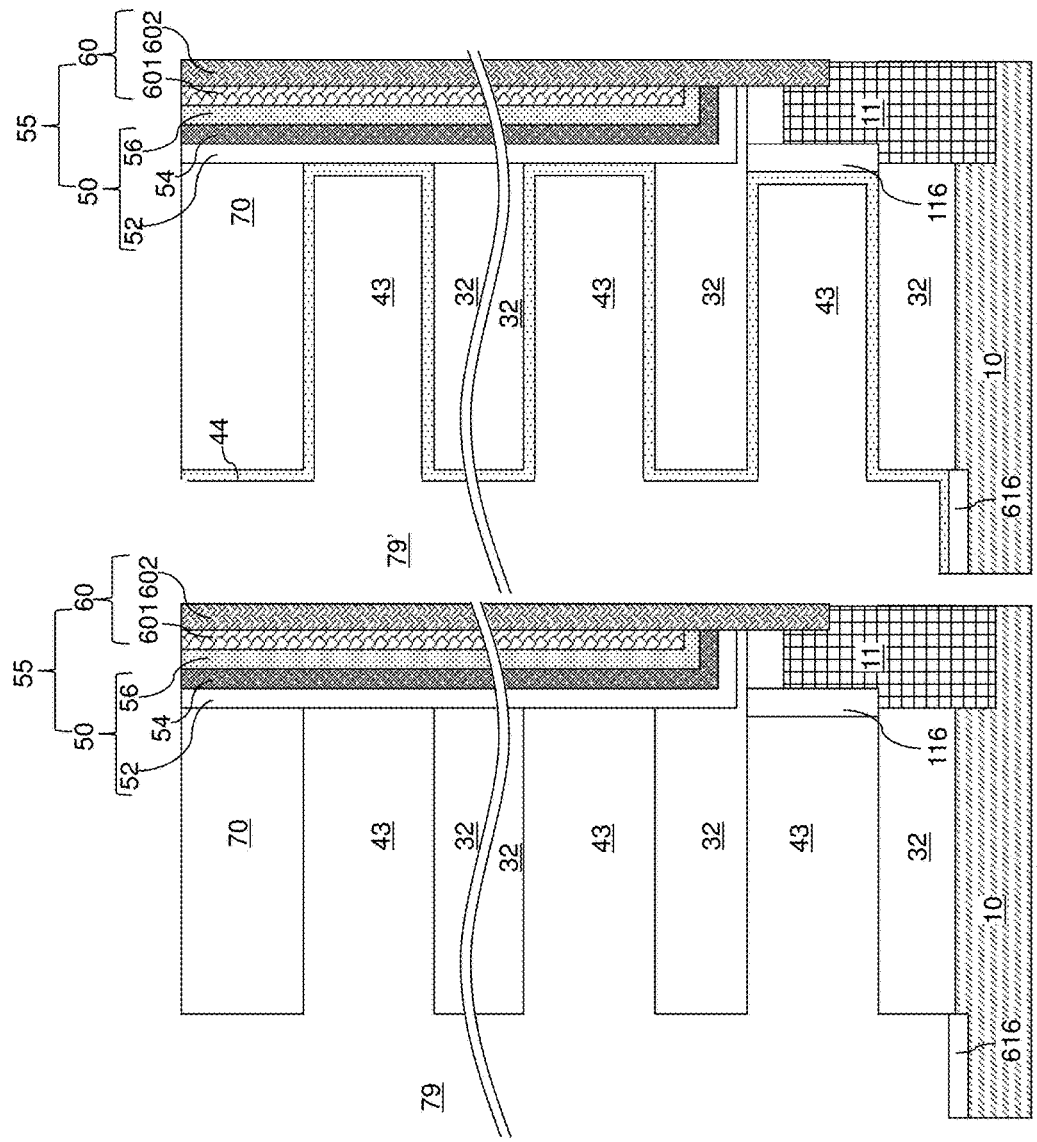

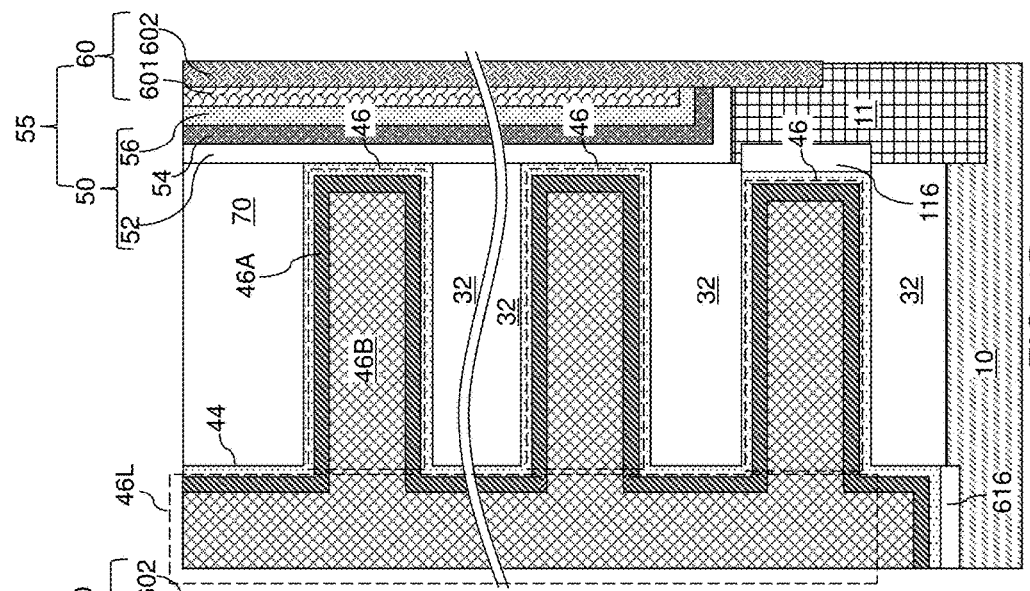
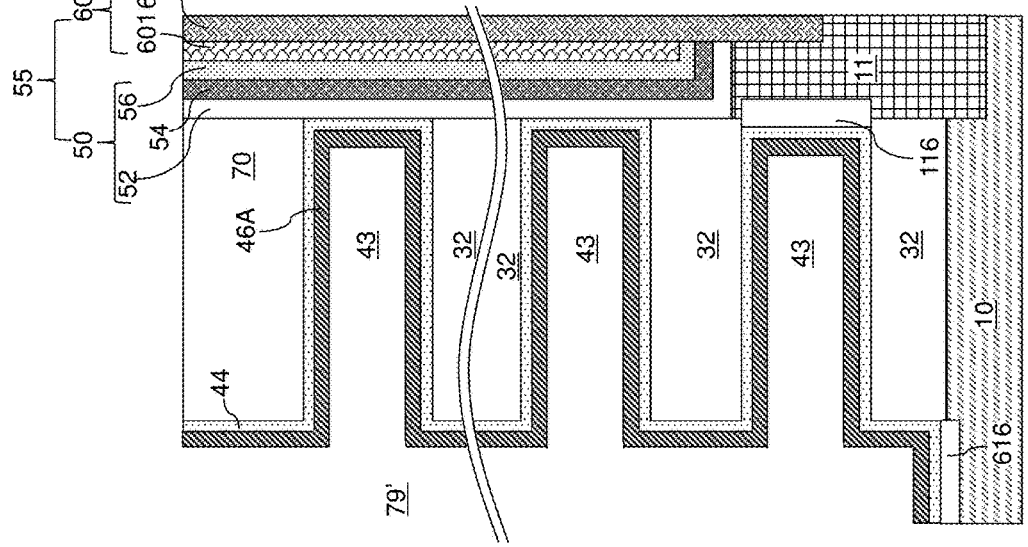

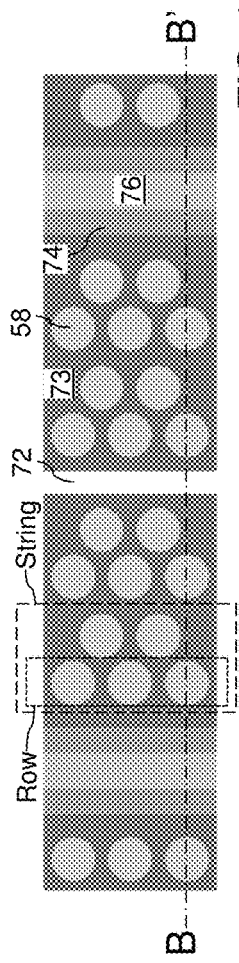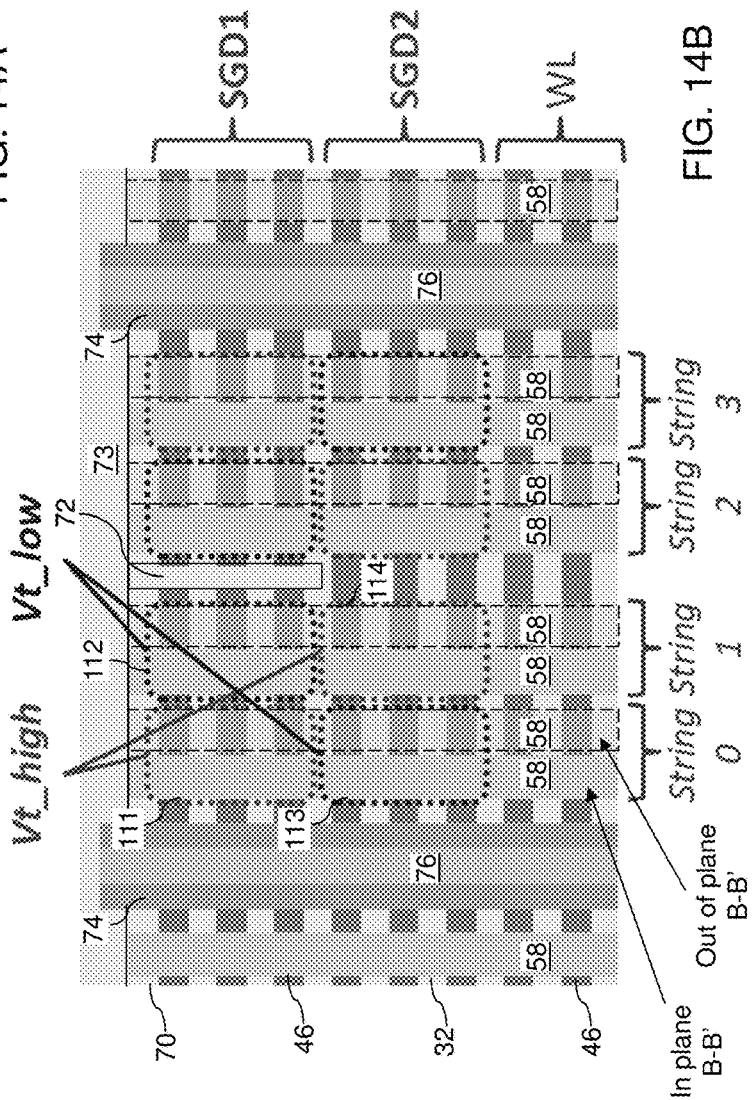

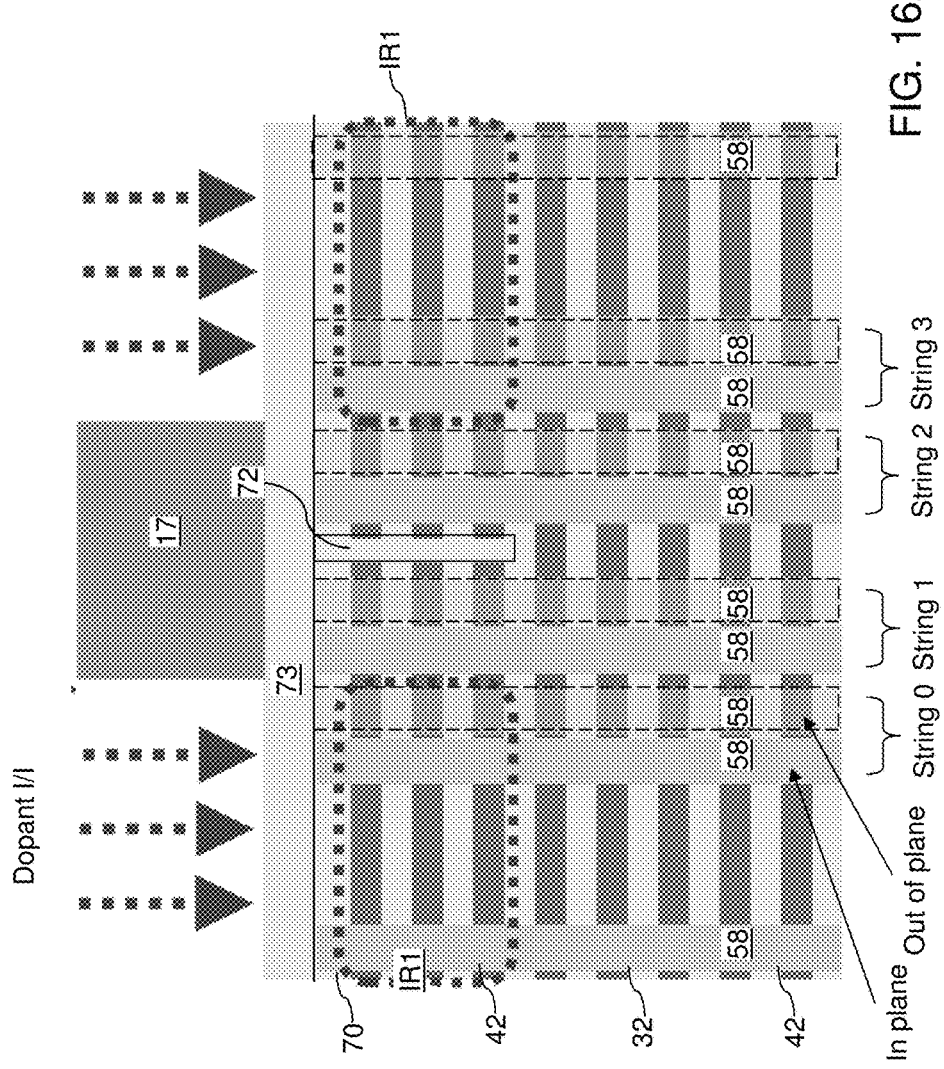

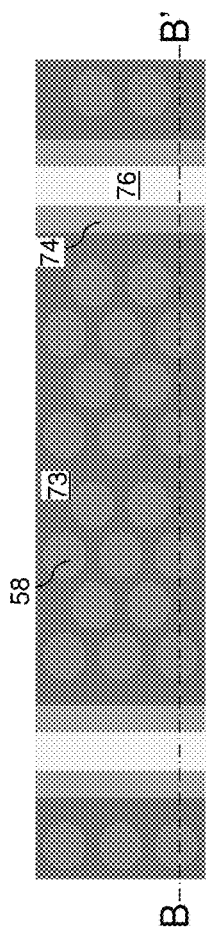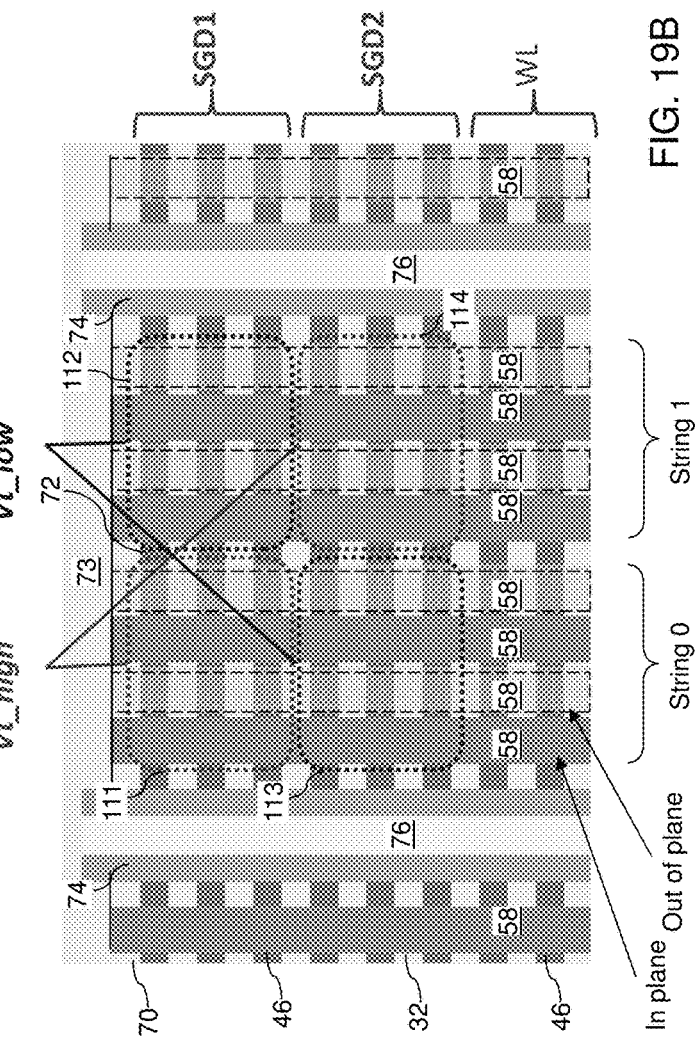

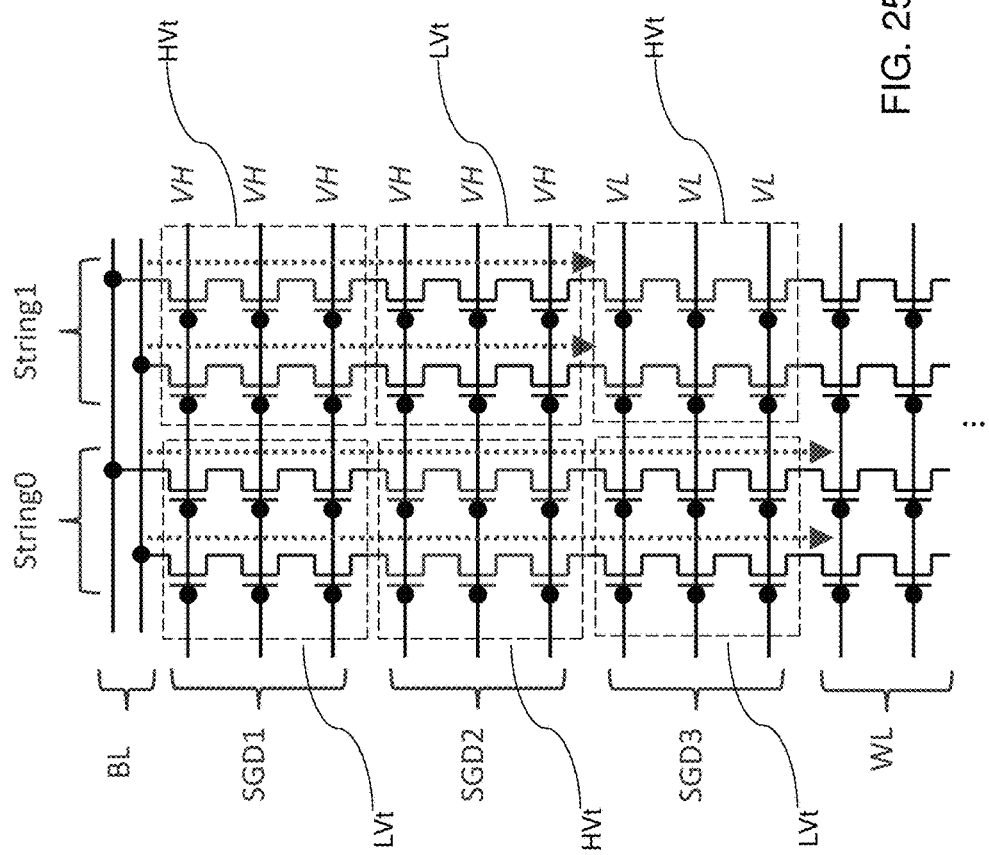

THREE-DIMENSIONAL MEMORY DEVICE
CONTAINING
MULTI-THRESHOLD-VOLTAGE DRAIN
SELECT GATES AND METHOD OF MAKING
THE SAME

FIELD

The present disclosure relates generally to the field of semiconductor devices, and particular to a three-dimensional memory device employing multi-threshold-voltage drain select gates and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and a plurality of rows of memory stack structures extending through the alternating stack, wherein each of the memory stack structures comprises charge storage elements located at levels of the electrically conductive layers and laterally surrounding a respective vertical semiconductor channel. At least one of the electrically conductive layers comprises a first select gate electrode for multiple rows of memory stack structures within the plurality of rows. At least another of the electrically conductive layers comprises a second select gate electrode for the multiple rows of memory stack structures. A first row of memory stack structures among the multiple rows of memory stack structures has a higher threshold voltage for the first select gate electrode than a second row of memory stack structures among the multiple rows of memory stack structures has for the first select gate electrode. The first row of memory stack structures has a lower threshold voltage for the second select gate electrode than the second row of memory stack structures has for the second select gate electrode.

According to another aspect of the present disclosure, a method of forming a three-dimensional memory device is provided, which comprises the steps of: forming an alternating stack of insulating layers and spacer material layers located over a substrate, wherein the spacer material layers are formed as, or are subsequently replaced with, electrically conductive layers; forming a plurality of rows of memory stack structures through the alternating stack, wherein each of the memory stack structures comprises charge storage elements located at levels of the electrically conductive layers and laterally surrounding a respective vertical semiconductor channel, wherein at least one of the electrically conductive layers comprises a first select gate electrode for multiple rows of memory stack structures within the plurality of rows, and at least another of the electrically conductive layers comprise a second select gate electrode for the multiple rows of memory stack structures; and locally modifying threshold voltages for the first and second select gate electrodes for the memory stack structures. A first row of memory stack structures among the multiple rows of memory stack structures has a higher threshold voltage for the first select gate electrode than a second row of memory stack structures among the multiple rows of memory stack structures has for the first select gate electrode. The first row of memory stack structures has a lower threshold voltage for the second select gate electrode than the second row of memory stack structures has for the second select gate electrode.

According to another aspect of the present disclosure, a three-dimensional NAND memory device contains an alternating stack of insulating layers and electrically conductive word line layers located over a substrate, at least one first drain select gate electrode located over the alternating stack and extending through a first drain select transistor and a second drain select transistor, at least one second drain select gate electrode located between the first drain select electrode and the alternating stack and extending through a third drain select transistor and a fourth drain select transistor. The first drain select transistor and the third drain select transistor are located in a first NAND memory string. The second drain select transistor and the fourth drain select transistor are located in a second NAND memory string different from the first NAND memory string. The first drain select transistor has a higher threshold voltage than the second drain select transistor. The third drain select transistor has a lower threshold voltage than the fourth drain select transistor.

BRIEF DESCRIPTION OF THE DRAWINGS

FIG. 3B is a top-down view of the exemplary structure of FIG. 3A. The vertical plane A-A' is the plane of the cross-section for FIG. 3A.

FIGS. 5A-5H are sequential schematic vertical cross-sectional views of a memory opening within the exemplary structure up to the processing step of deposition of a second semiconductor channel layer according to an embodiment of the present disclosure.

FIGS. 9A-9D are sequential vertical cross-sectional views of a region of the exemplary structure during formation of electrically conductive layers according to an embodiment of the present disclosure.

FIG. 14A is a see-through top-down view of a first configuration of the exemplary structure according to a first embodiment of the present disclosure.

FIG. 14B is a vertical cross-sectional view of the first configuration of exemplary structure along the vertical plane B-B' in FIG. 14A.

FIG. 16A is a vertical cross-sectional view of an exemplary structure for providing the first configuration during a first ion implantation step that is performed after formation of the contact level dielectric layer and prior to formation of backside trenches according to the first embodiment of the present disclosure.

FIG. 19A is a see-through top-down view of a second configuration of the exemplary structure according to a second embodiment of the present disclosure.

FIG. 19B is a vertical cross-sectional view of the second configuration of exemplary structure along the vertical plane B-B' in FIG. 19A.

FIG. 25A is a circuit diagram during selection of string 0 of the fourth configuration of the exemplary structure of FIG. 24.

DETAILED DESCRIPTION

Figure 1:
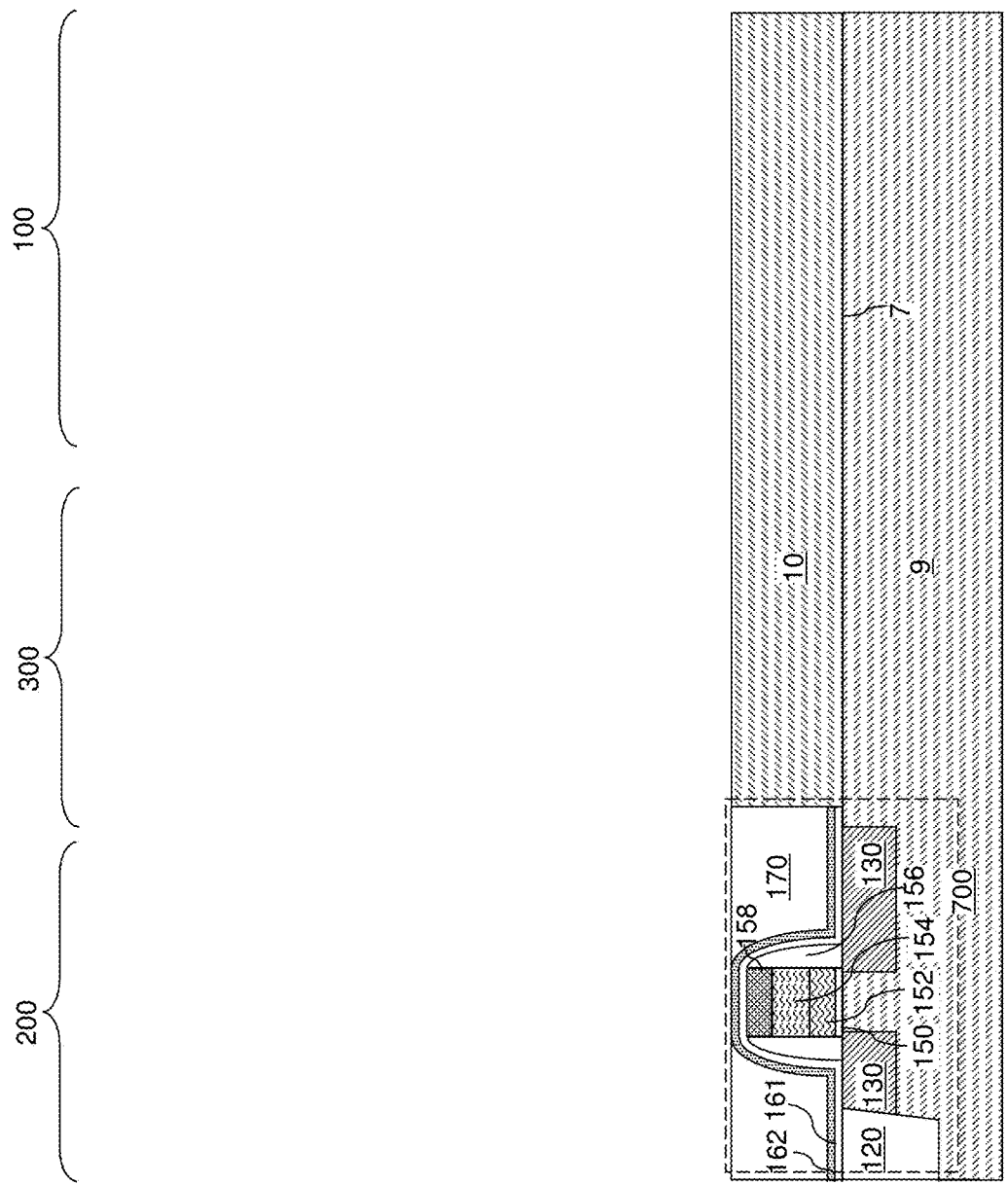
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing multi-threshold-voltage drain select gates and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
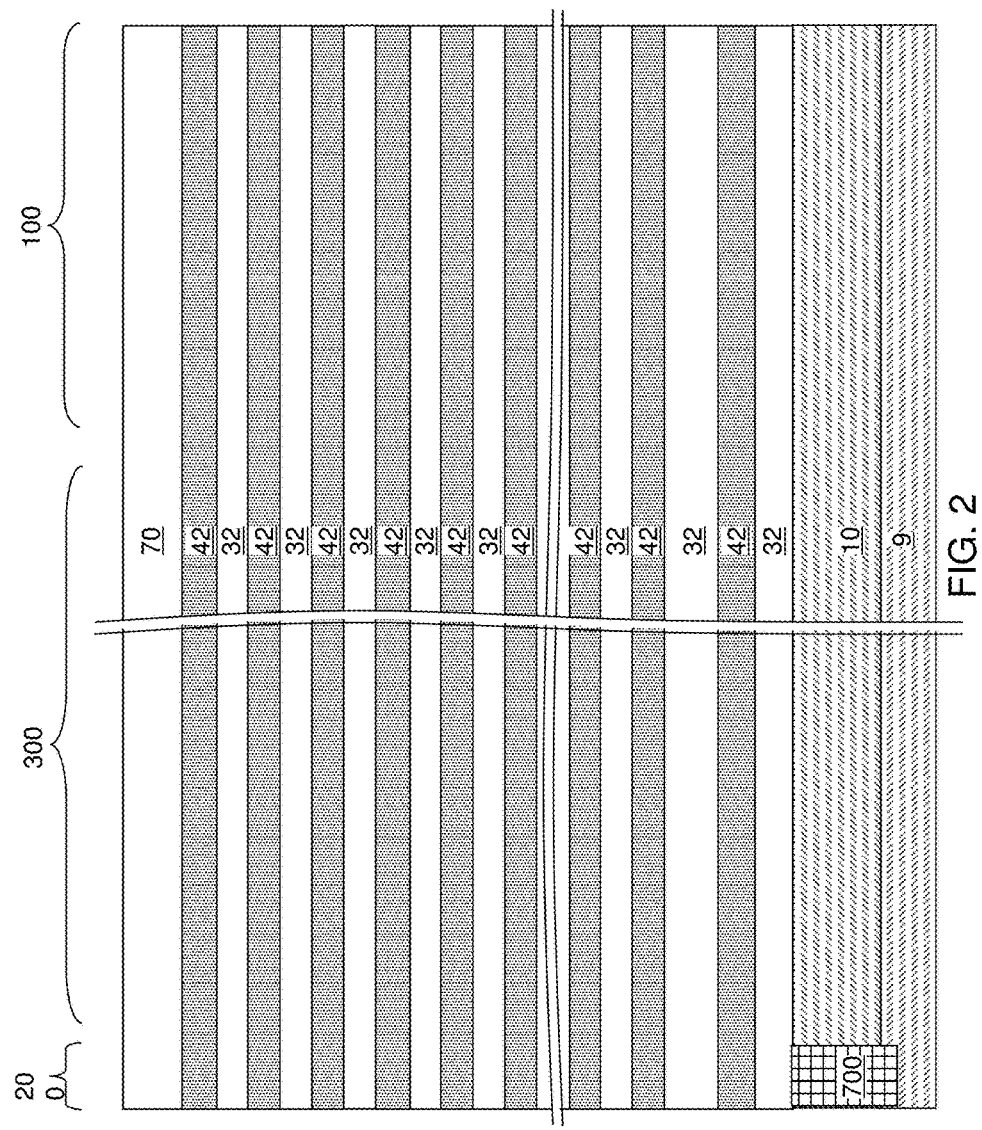
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
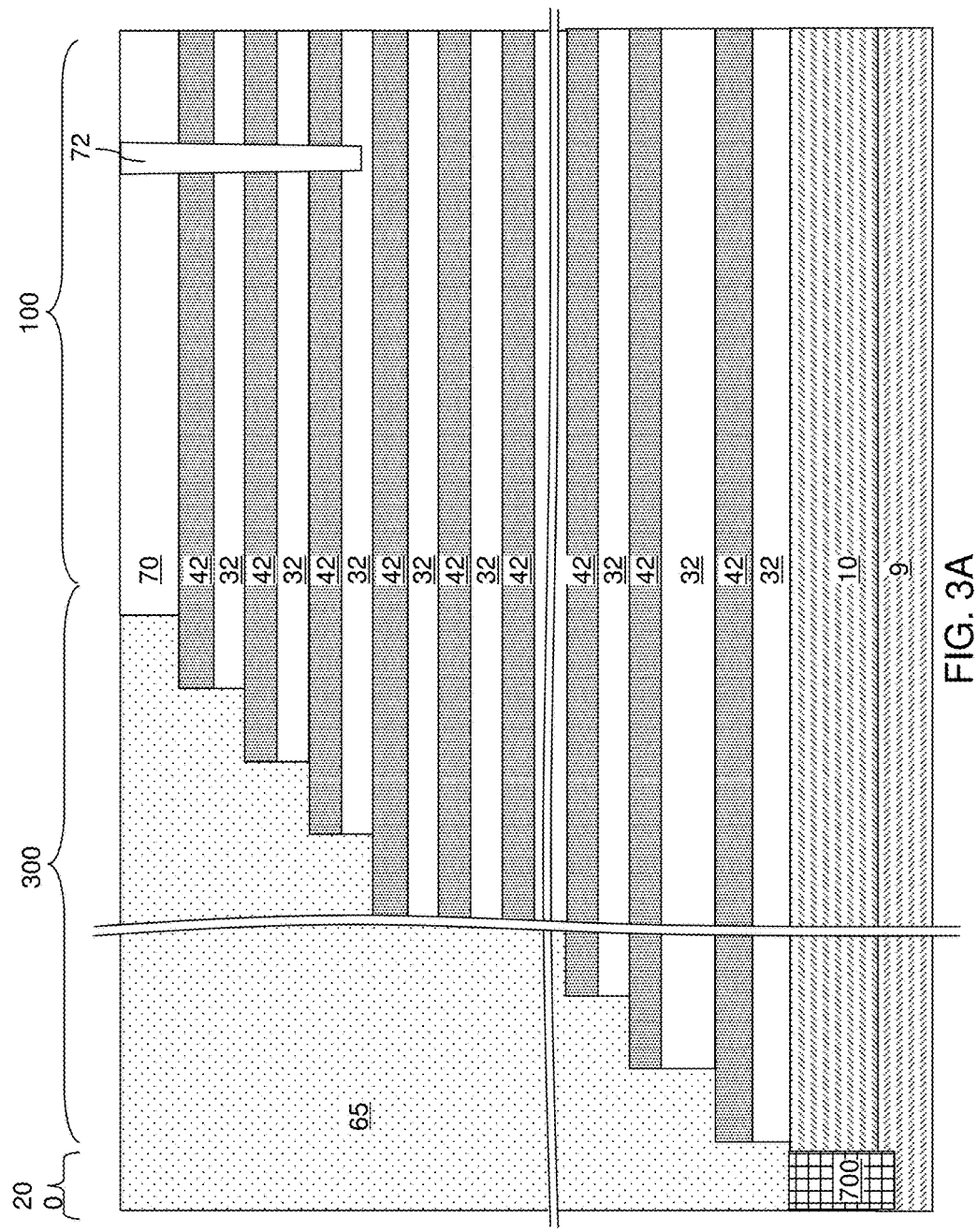
FIG. 3A is a schematic vertical cross-sectional view of the exemplary structure after formation of stepped terraces and a retro-stepped dielectric material portion according to an embodiment of the present disclosure.

Referring to FIGS. 3A and 3B, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than an overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. The drain select level isolation trenches can vertically extend through at least one sacrificial material layer 42, and can vertically extend through multiple sacrificial material layers 42. In one embodiment, the drain select level isolation trenches can extend through a set of at least one sacrificial material layer 42 located at each level of at least one topmost drain select gate electrode to be subsequently formed. Excess portions of the dielectric material can be removed from above the top surface of the insulating cap layer 70.

Figure 4A:
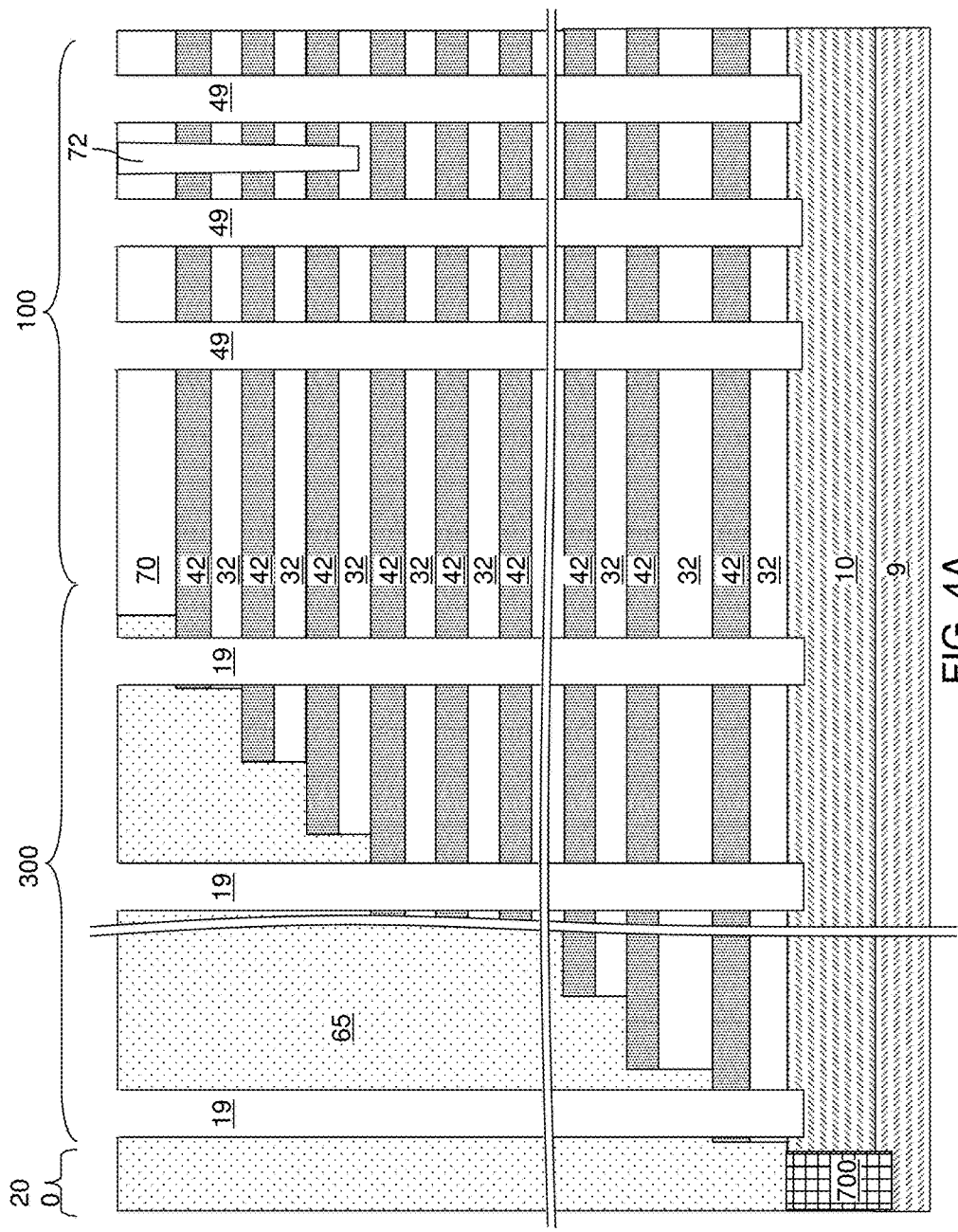
FIG. 4A is a schematic vertical cross-sectional view of the exemplary structure after formation of memory openings and support openings according to an embodiment of the present disclosure.
Figure 4B:
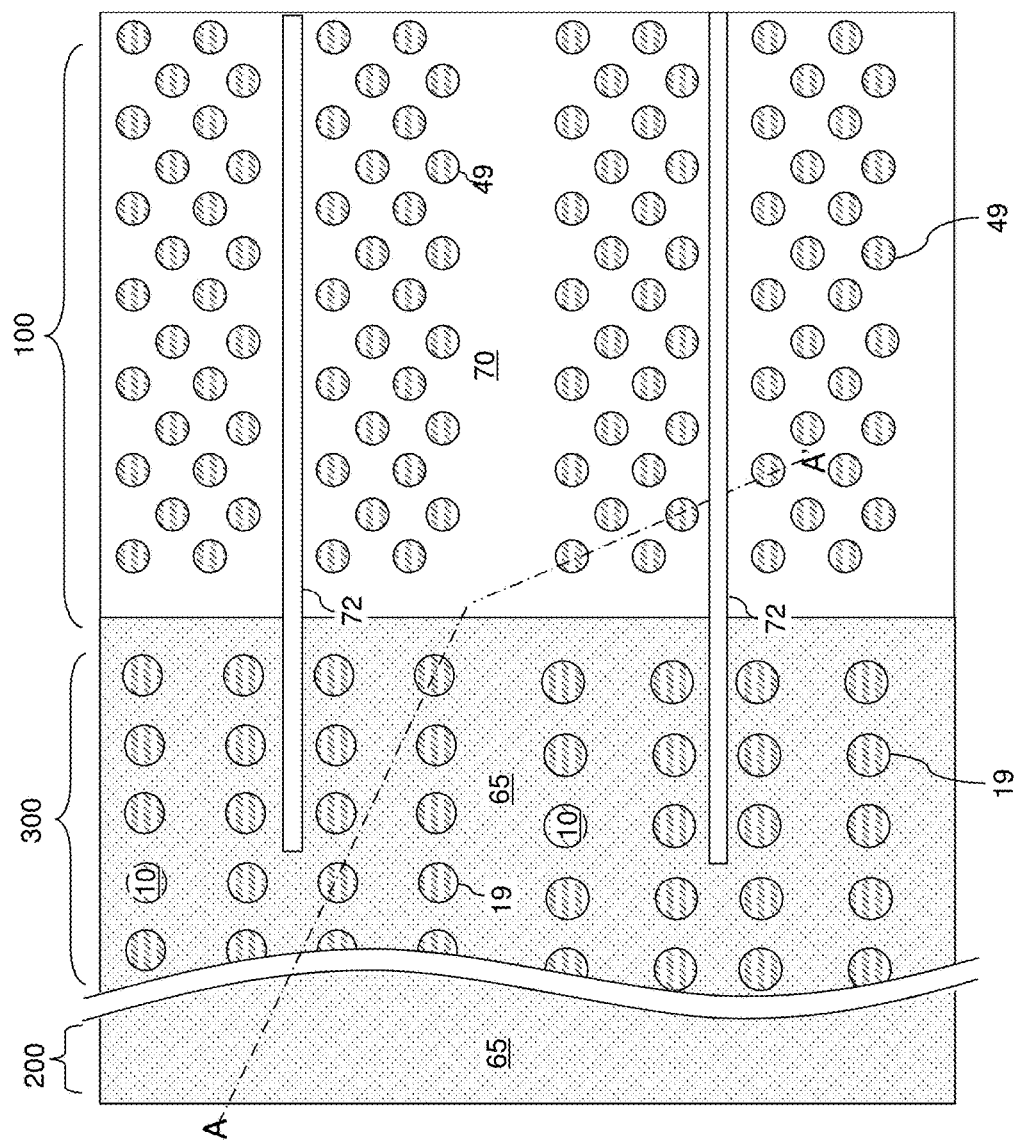
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. The support openings 19 can vertically extend through the retro-stepped dielectric material portion 65, through a portion of the alternating stack (32, 42) that may include less number of layers than the total number of layers in the alternating stack (32, 42), and to a top surface of the substrate (9, 10).

In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
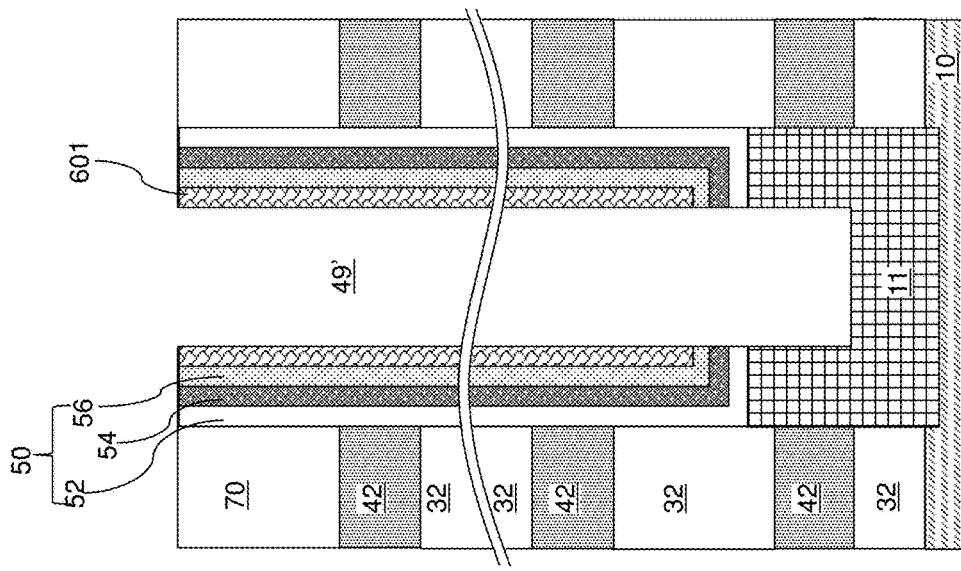

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 5D:
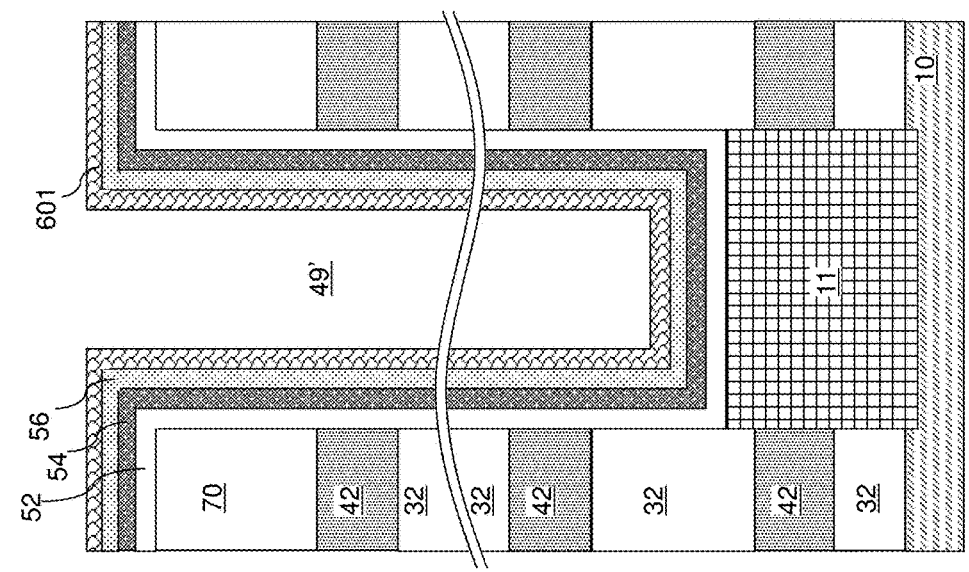

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
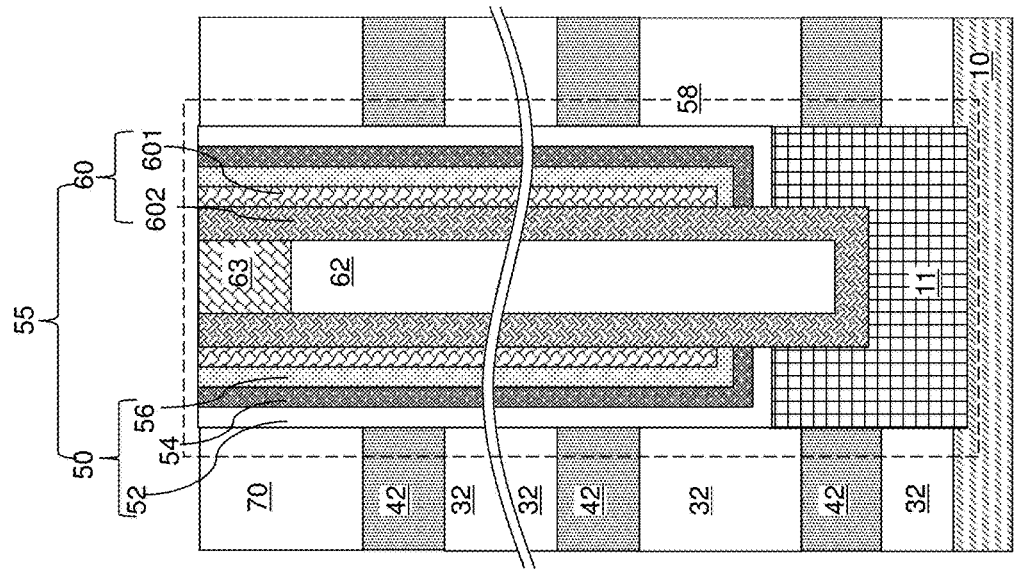

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
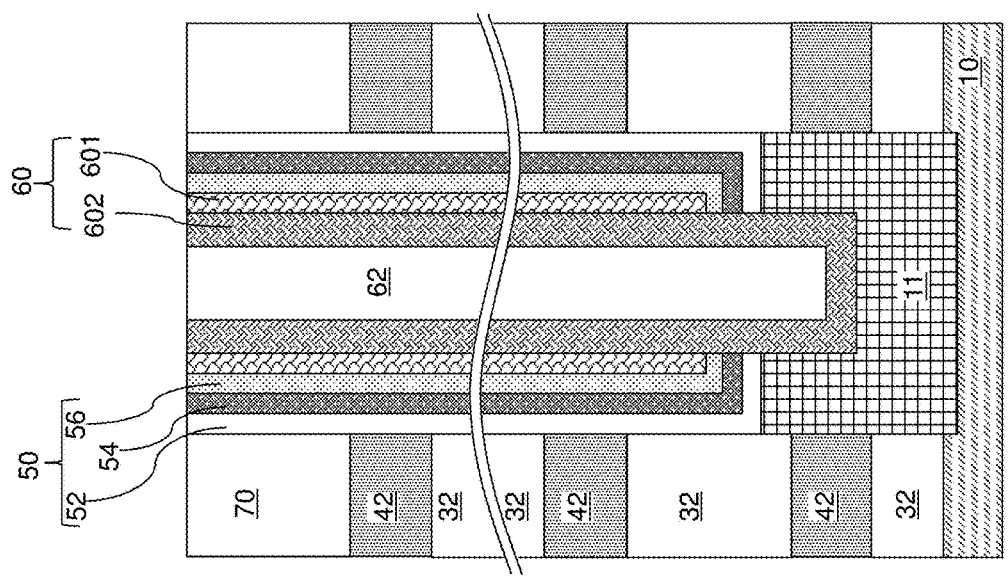

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
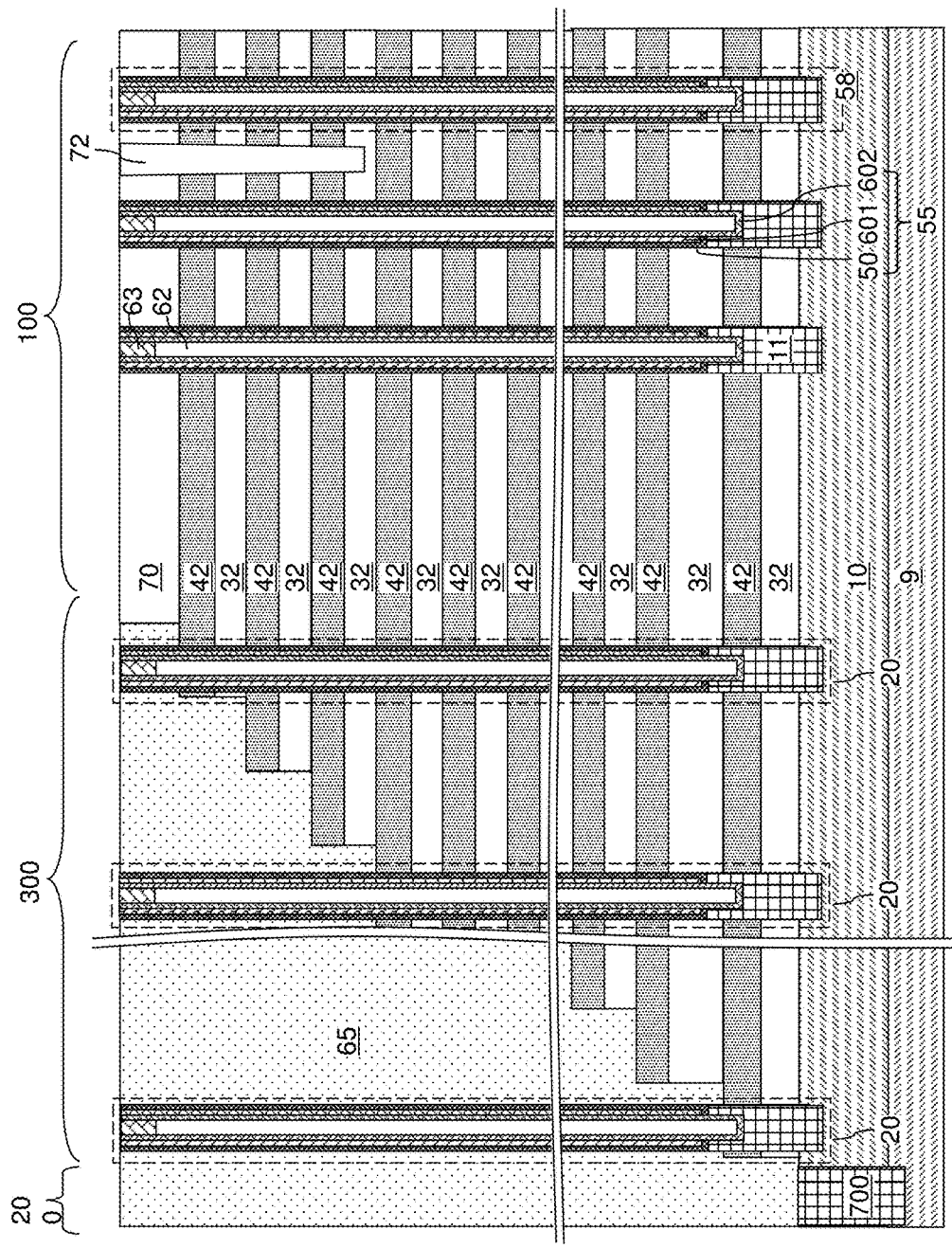
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
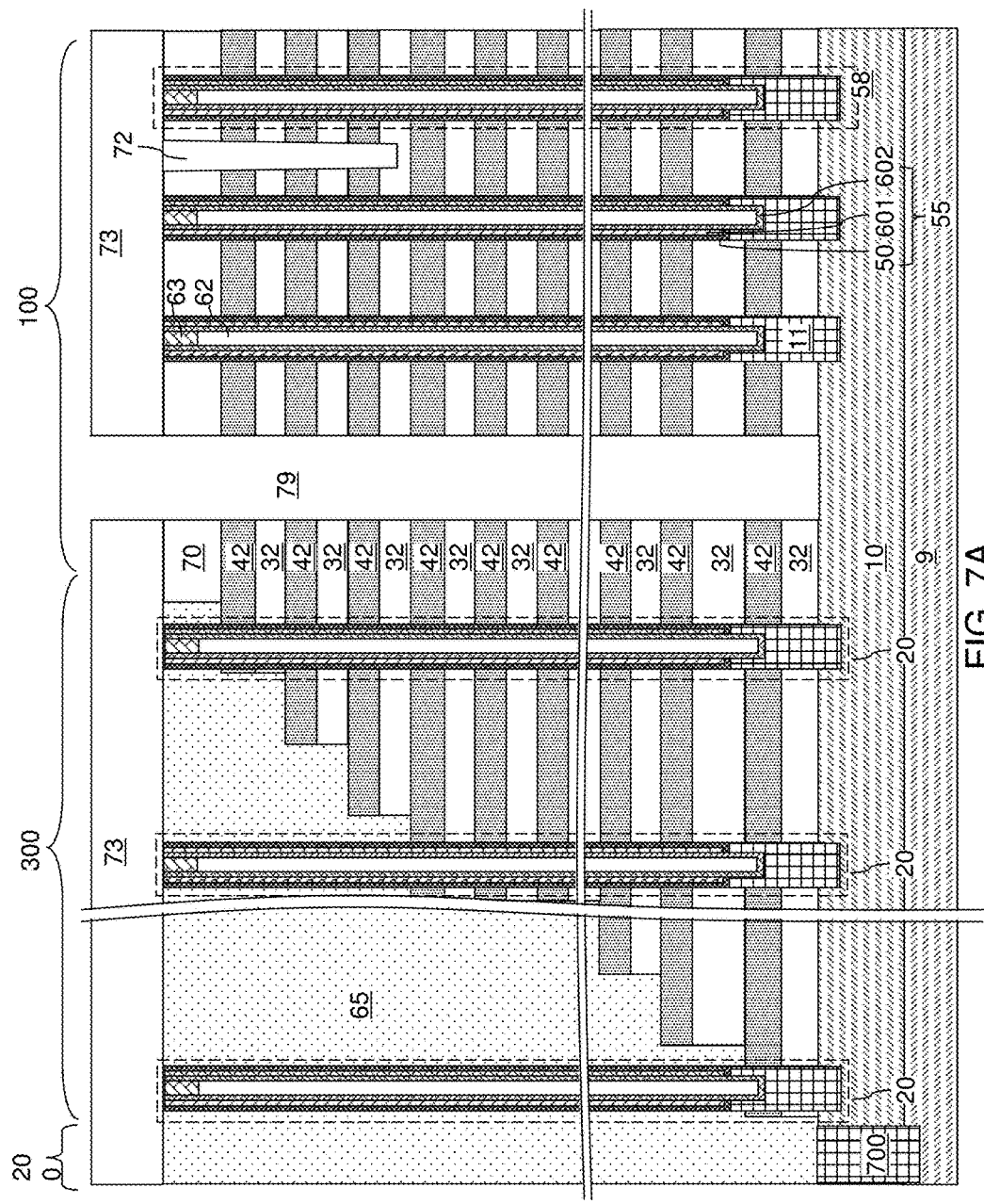
FIG. 7A is a schematic vertical cross-sectional view of the exemplary structure after formation of a backside trench according to an embodiment of the present disclosure.
Figure 7B:
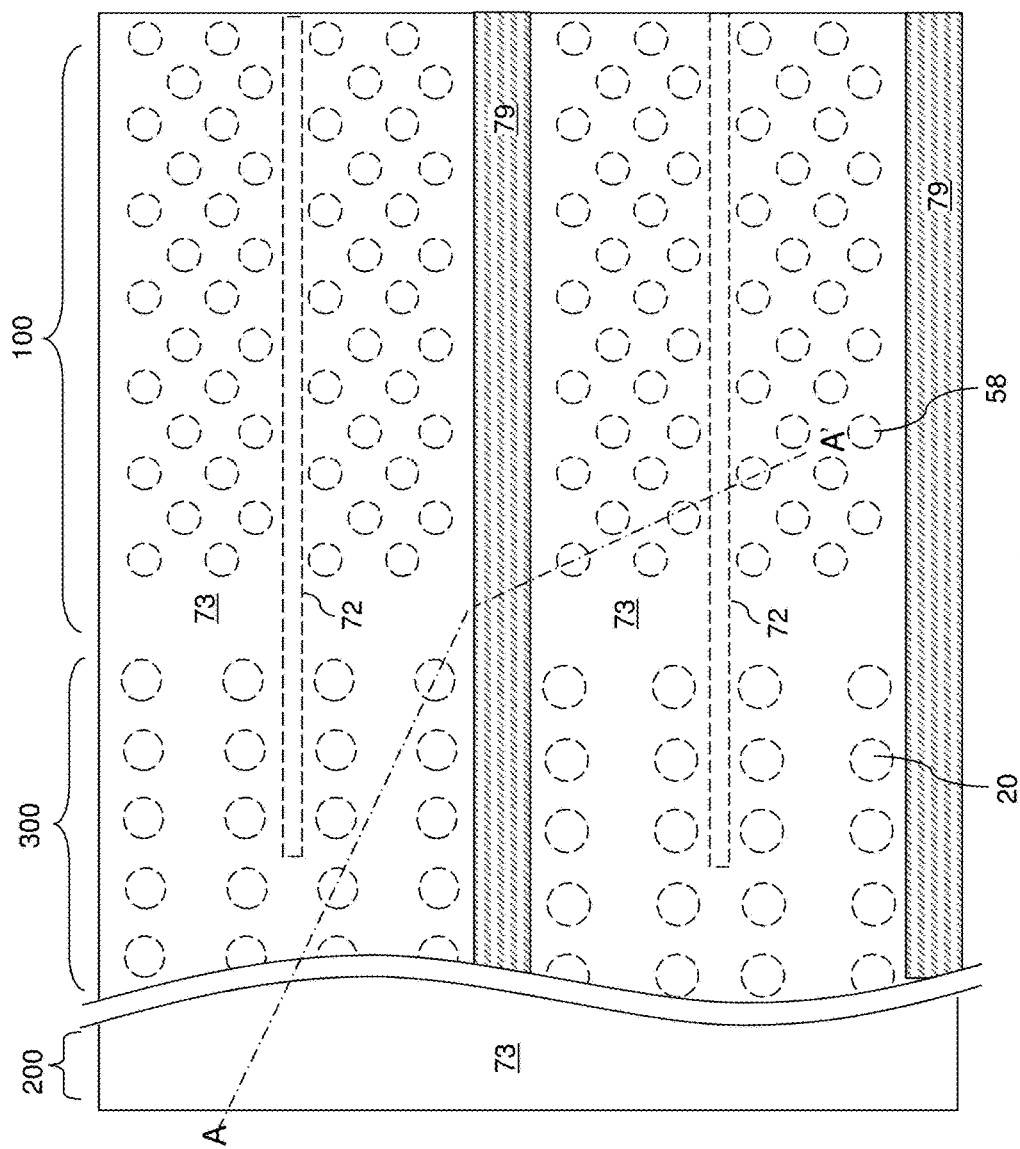
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
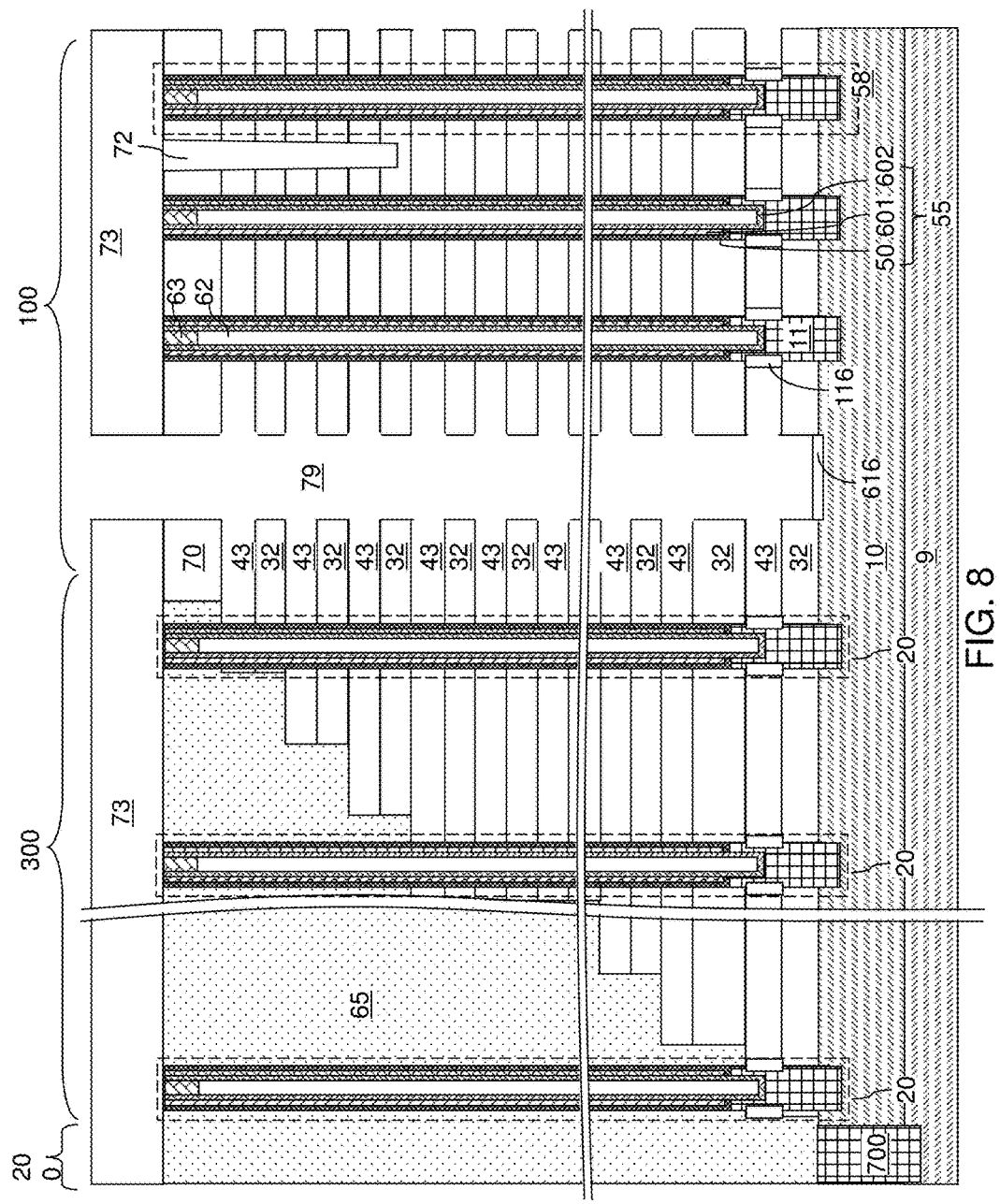
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
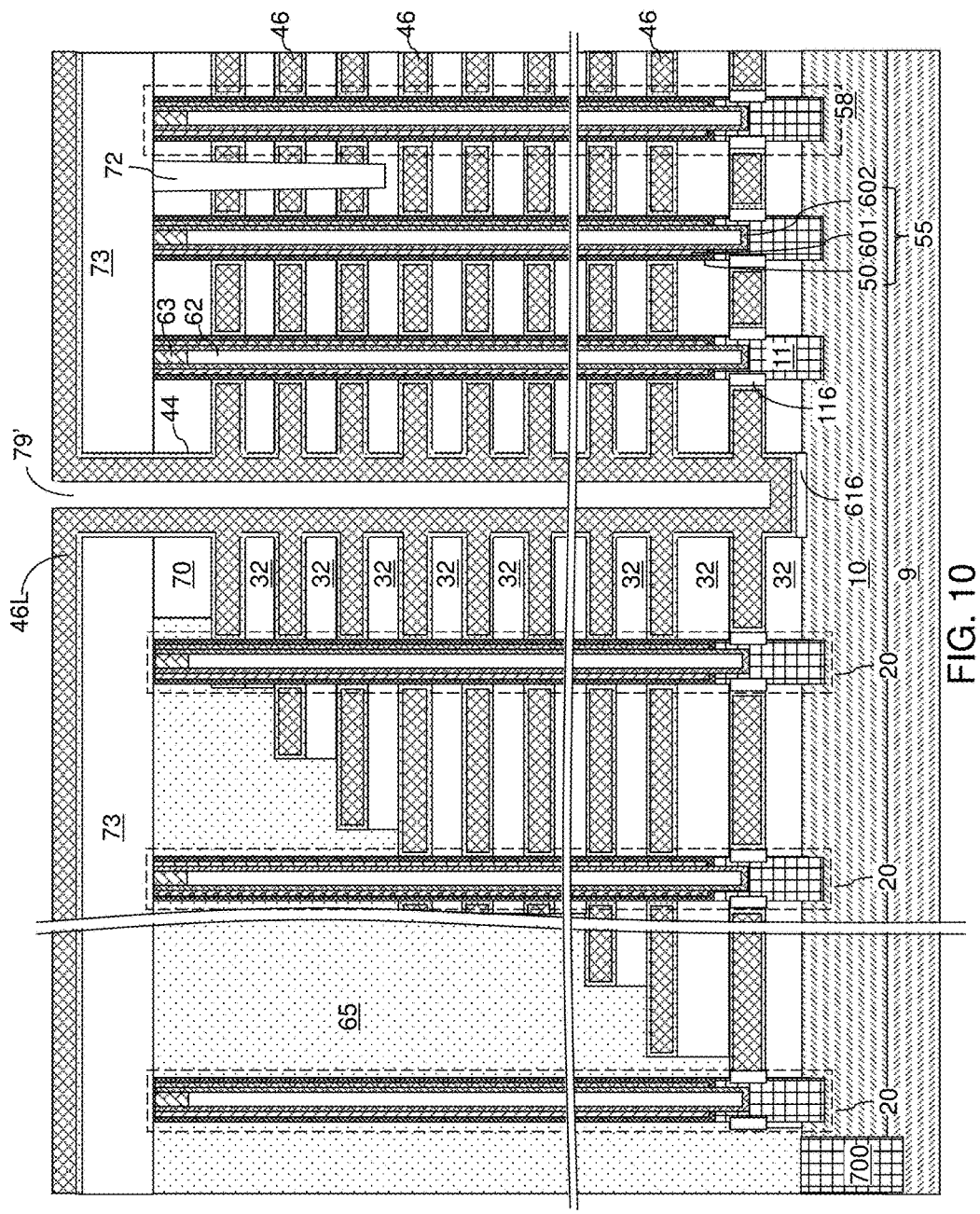
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
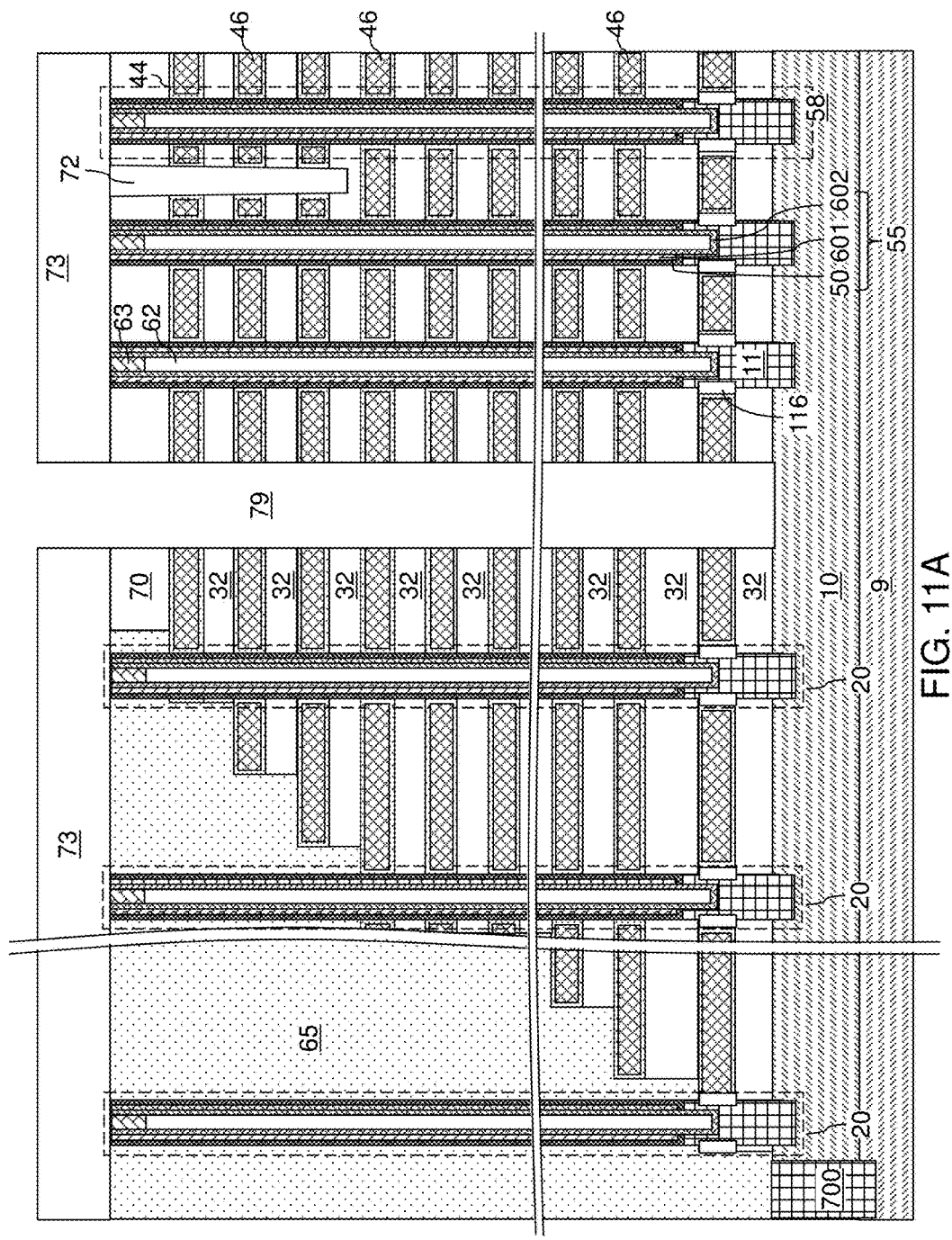
FIG. 11A is a schematic vertical cross-sectional view of the exemplary structure after removal of a deposited conductive material from within the backside trench according to an embodiment of the present disclosure.
Figure 11B:
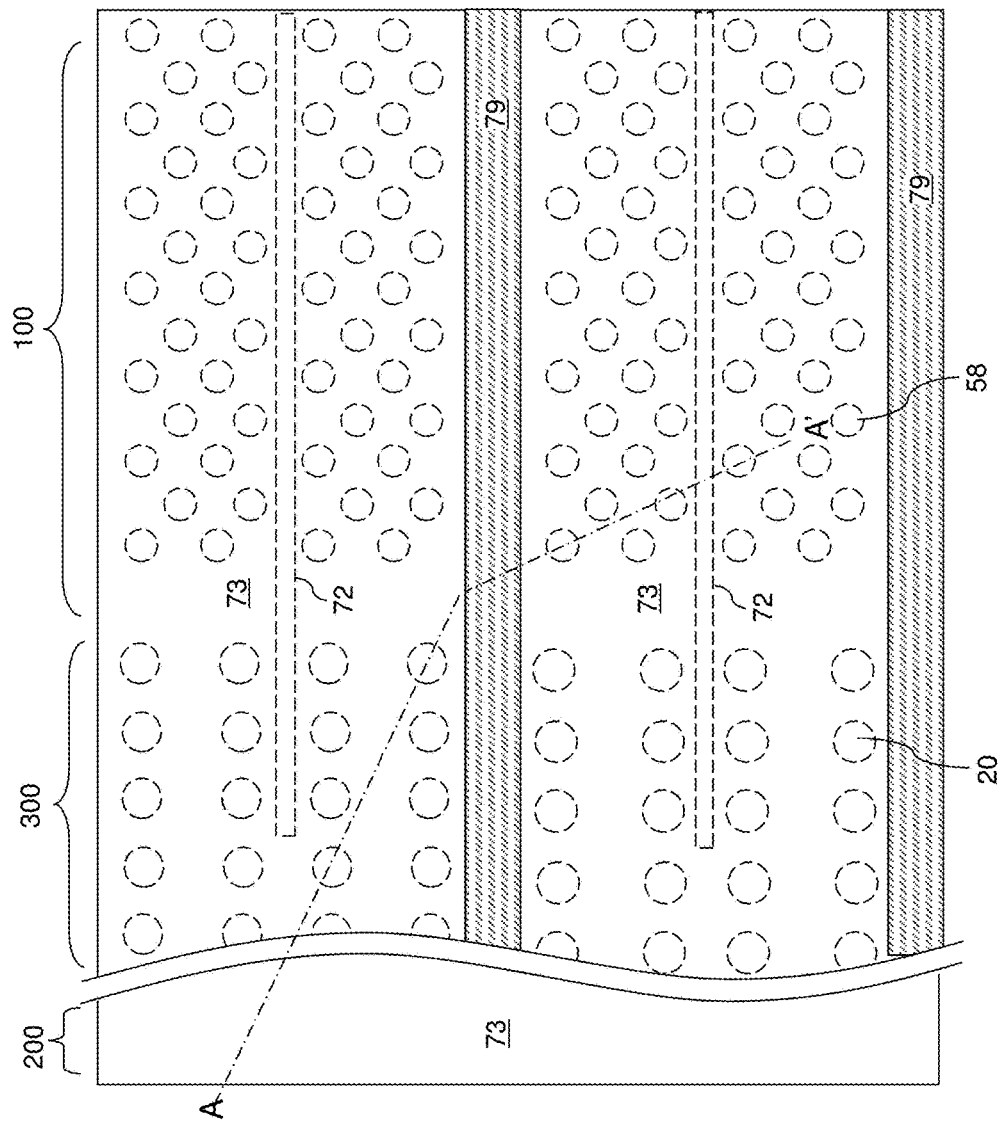
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
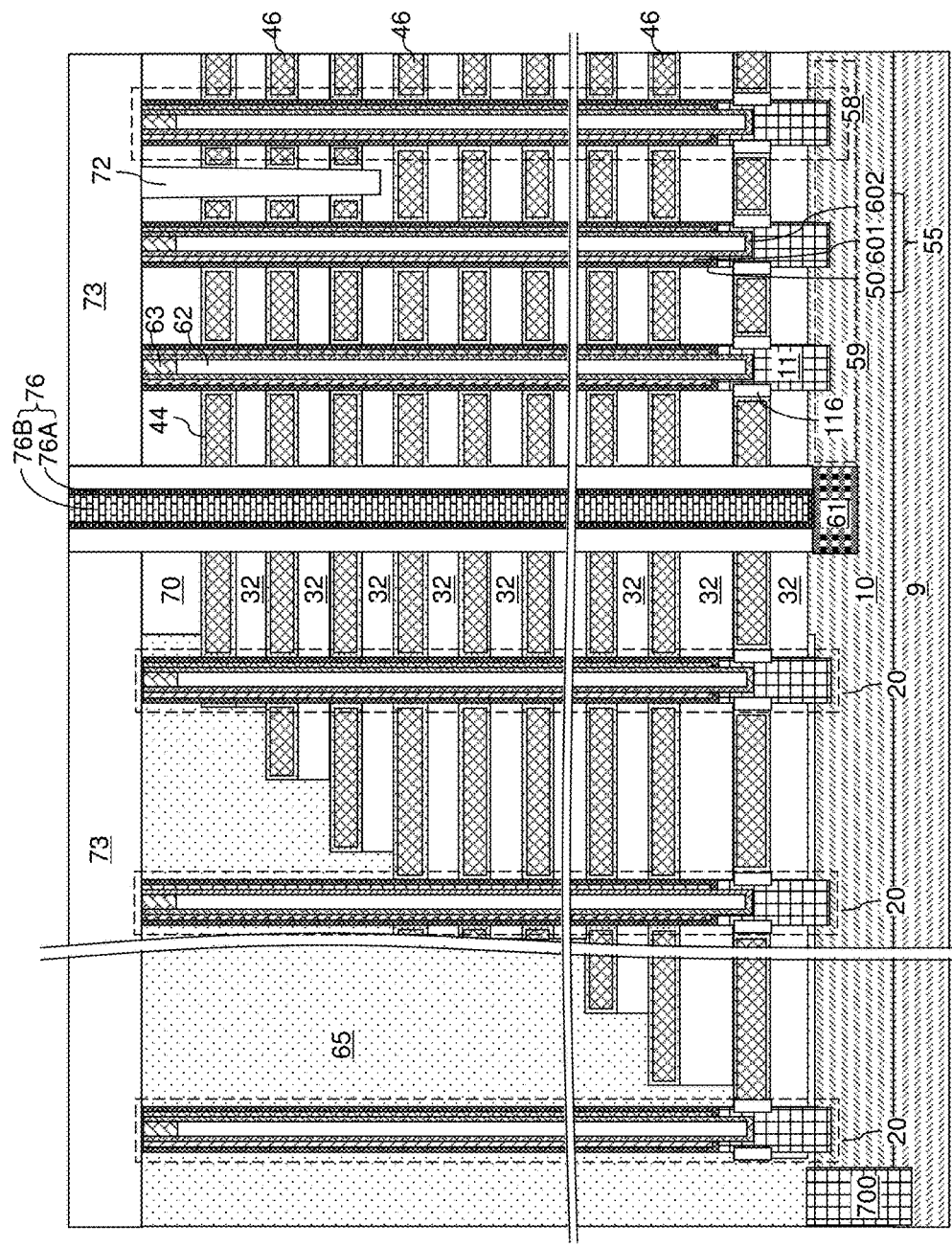
FIG. 12A is a schematic vertical cross-sectional view of the exemplary structure after formation of an insulating spacer and a backside contact structure according to an embodiment of the present disclosure.
Figure 12B:
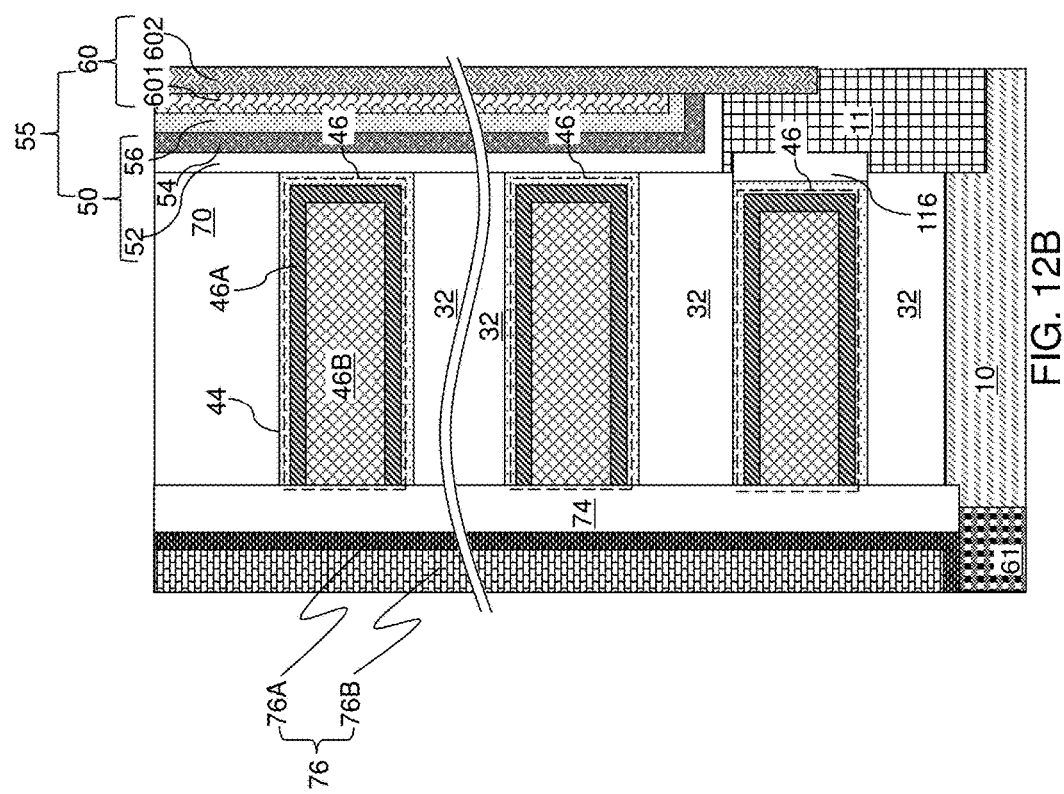
FIG. 12B is a magnified view of a region of the exemplary structure of FIG. 12A.

Referring to FIGS. 12A and 12B, an insulating material portion is formed in each of the backside trenches. For example, a neighboring pair of backside trenches 79 can include a first backside trench and a second backside trench, and the insulating material portions can include a first insulating material portion formed in the first backside trench and a second insulating material portion formed in the second backside trench. A plurality of insulating layers 32 in the alternating stack (32, 46) laterally extends from the first insulating material portion to the second insulating material portion. Each of the first and second insulating material portions may partially or completely fill a respective backside trench.

In one embodiment, the insulating material portions can be insulating spacers 74. An insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
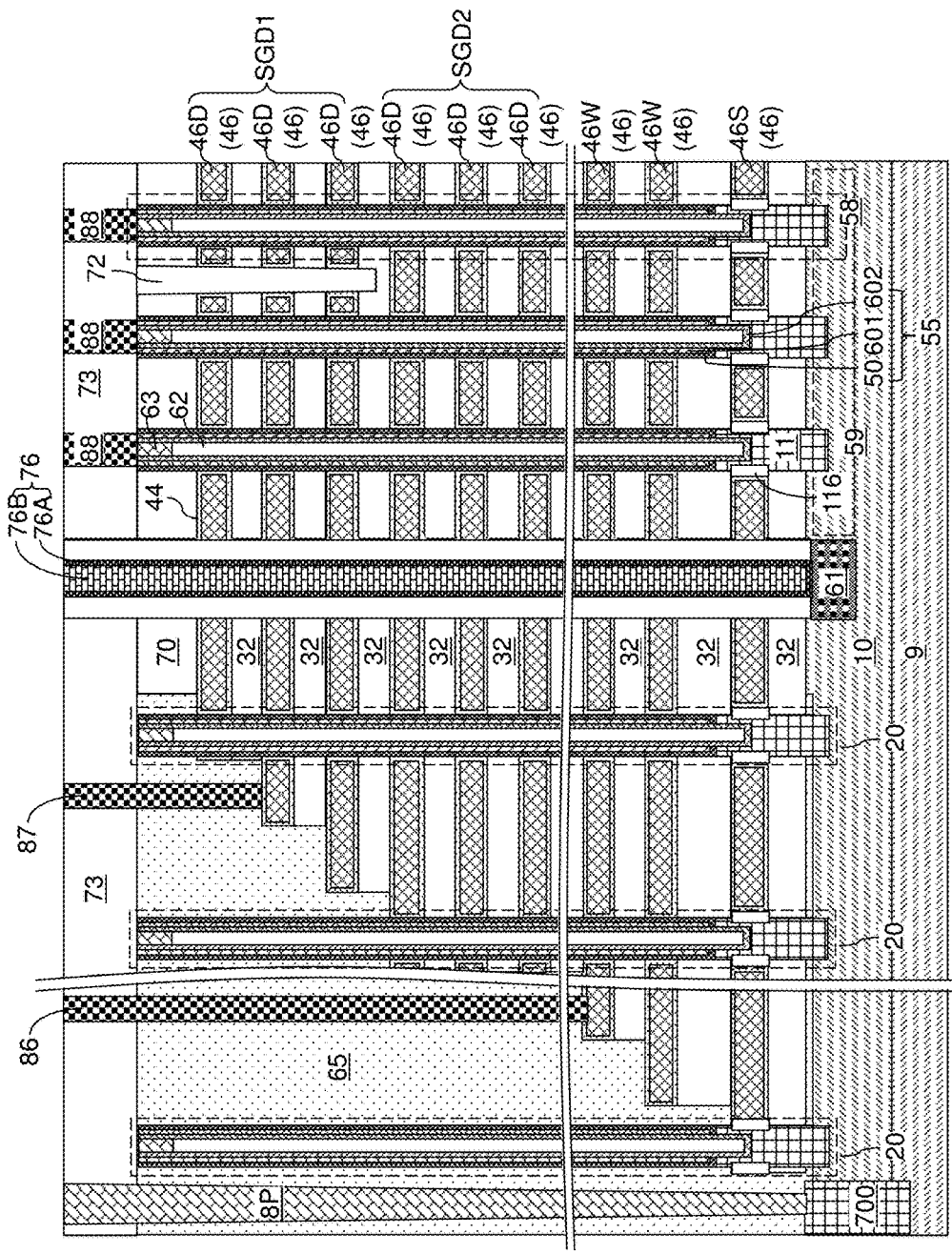
FIG. 13A is a schematic vertical cross-sectional view of the exemplary structure after formation of additional contact via structures according to an embodiment of the present disclosure.
Figure 13B:
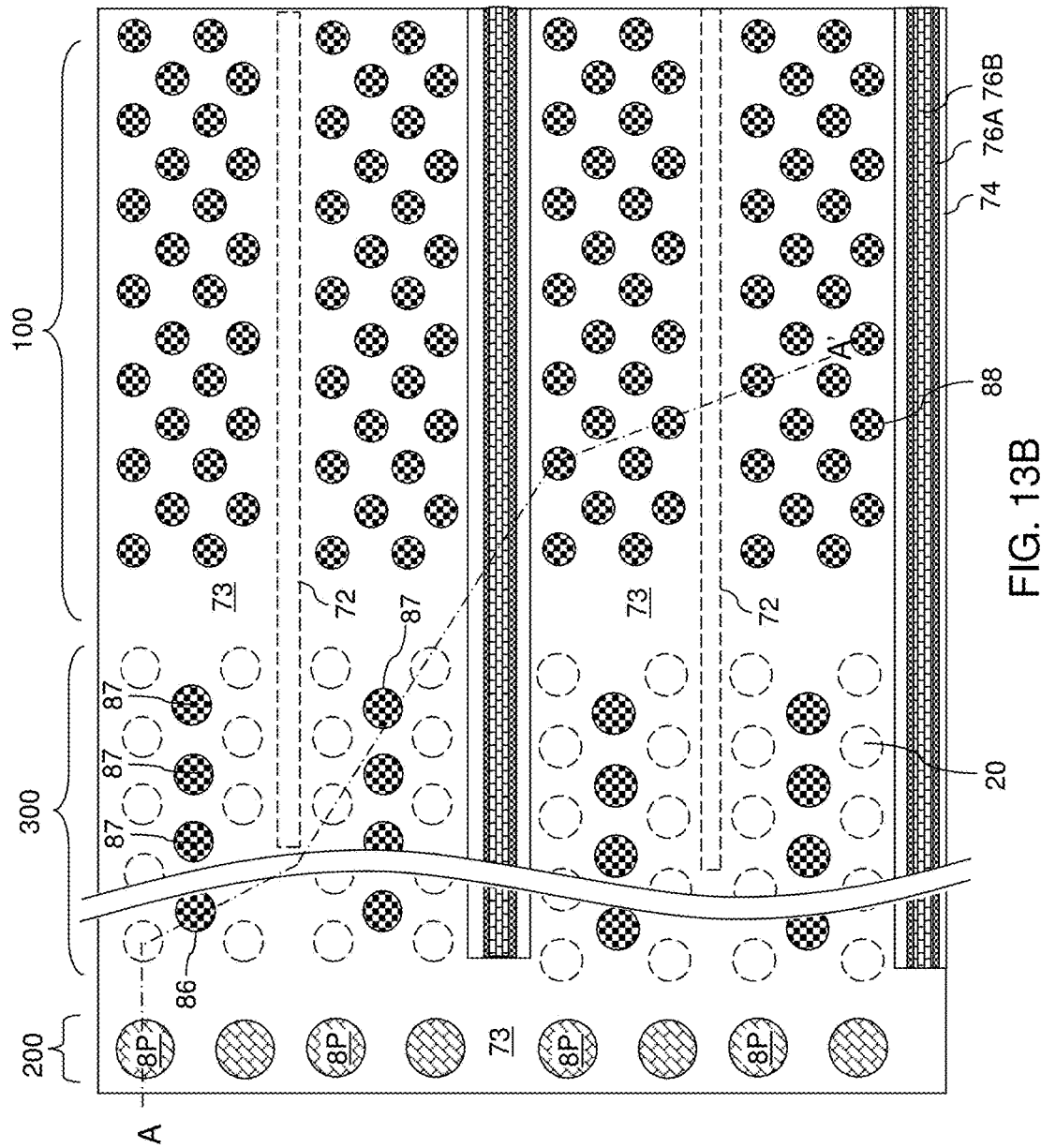
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Peripheral device contact via structures 8P can be formed through the retro-stepped dielectric material portion 65 directly on respective nodes of the peripheral devices.

The electrically conductive layers 46 can include word line electrically conductive layers 46W that function as word lines for the memory stack structures 55, drain select gate level electrically conductive layers 46D that function as drain select gate electrodes for the vertical semiconductor channels 60, and one or more source select gate level electrically conductive layers 46S that function as one or more source select gate electrodes for the vertical semiconductor channels 60. Word line contact via structures 86 can be formed on the top surfaces of the word line electrically conductive layers 46W through the contact level dielectric layer 73, and through the retro-stepped dielectric material portion 65. Drain select gate contact via structures 87 are formed on top surfaces of drain select gate level electrically conductive layers 46D through the contact level dielectric layer 73, and through the retro-stepped dielectric material portion 65. Source select gate contact via structures (not expressly shown) are formed on top surfaces of the one or more source select gate level electrically conductive layers 46S through the contact level dielectric layer 73, and through the retro-stepped dielectric material portion 65.

In one embodiment, the drain select gate level electrically conductive layers 46D can include first select gate electrodes SGD1 located at the level of the drain select level isolation structures 72, and second select gate electrodes SGD2 located at levels located below the drain select level isolation structures 72 (e.g., the isolation structures 72 do not extend through the second select gate electrodes SGD2). Each first select gate electrode SGD1 may be located between a backside trench 79 and a drain select level isolation structure 72, and each second select gate electrode SGD2 can be located between a pair of backside trenches 79 and thus, laterally extends from a first insulating material portion (such as a first one of the insulating spacers 74) to a second insulating material portion (such as a second one of the insulating spacers 74). Each first select gate electrode SGD1 includes at least one of the drain select gate level electrically conductive layers 46D, and each second select gate electrode SGD2 includes at least another of the drain select gate level electrically conductive layers 46D.

A plurality of memory stack structures 55 can be arranged as multiple rows that extend along the lengthwise direction of the backside trenches 79 (e.g., in the word line direction perpendicular to the bit line direction) and the drain select level isolation structures 72. In one embodiments, at least one of the drain select gate level electrically conductive layers 46D comprises a first select gate electrode SGD1 for multiple rows of memory stack structures 55, and at least another of the drain select gate level electrically conductive layers 46D comprise a second select gate electrode SGD2 for the multiple rows of memory stack structures 55.

According to an aspect of the present disclosure, threshold voltages for the vertical field effect transistors employing the vertical semiconductor channels 60 as channel regions of the memory stack structures are locally modified for at least one of the first and second select gate electrodes (SGD1, SGD2). Specifically, the threshold voltages for the vertical transistors employing the first select gate electrodes SGD1 as control gate electrodes are locally modified so that a first set of vertical semiconductor channels 60 displays a different threshold voltage than a second set of vertical semiconductor channels 60 at the level of the first select gate electrodes. Further, the threshold voltages for the vertical transistors employing the second select gate electrodes SGD2 as control gate electrodes are optionally locally modified so that the first set of vertical semiconductor channels 60 displays a different threshold voltage than the second set of vertical semiconductor channels 60 at the level of the second select gate electrodes SGD2. As used herein, a "threshold voltage" refers to the minimum gate-to-source voltage differential that is needed to provide a conducting path in a semiconductor channel located between the source and drain terminals of a field effect transistor.

In one embodiment, a first row of memory stack structures 55 among the multiple rows of memory stack structures 55 extending through an alternating stack (32, 46) between a pair of backside trenches 79 has a higher threshold voltage for the first select gate electrode SGD1 than a second row of memory stack structures 55 among the multiple rows of memory stack structures 55 has for the first select gate electrode SGD1 extending between the same pair of backside trenches 79. Further, the first row of memory stack structures 55 optionally has a lower threshold voltage for the second select gate electrode SGD2 than the second row of memory stack structures 55 has for the second select gate electrode SGD2. Various configurations can be employed to provide such local modification of threshold voltages at the levels of the first and second select gate electrodes (SGD1, SGD2).

Figure 14C:
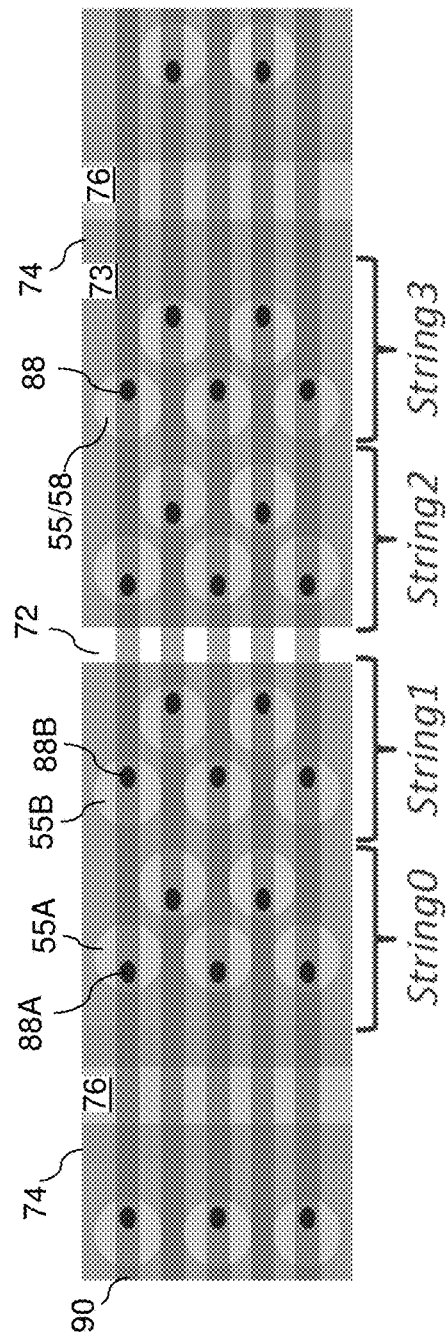
FIG. 14C is a see-through top-down view showing the location of bit lines in the first configuration of the exemplary structure of FIG. 14A.

Referring to FIGS. 14A-14C, a first configuration of the exemplary structure for providing local modification of threshold voltages is illustrated. Multiple rows of memory opening fill structures 58 are provided within an alternating stack of insulating layers 32 and electrically conductive layers 46 located between a pair of insulating material portions (such as insulating spacers 74) located within a neighboring pair of backside trenches 79. Each memory opening fill structure 58 includes a respective memory stack structure 55. A drain select level isolation structure 72 can be located between the pair of insulating material portions such that a first set of first select gate electrode SGD1 is located on one side of the drain select level isolation structure 72 and a second set of first drain select gate electrodes SGD1 is located on an opposite side of the drain select level isolation structure 72. Thus, each set of first drain select gate electrodes SGD1 can laterally extend from an insulating material portion 74 located in a backside trench 79 that vertically extends through all levels of the alternating stack (32, 46) to a drain select level isolation structure 72. Second select gate electrodes SGD2 can contact sidewalls of a pair of insulating material portions 74 located in the neighboring pair of backside trenches 79.

The rows of memory opening fill structures 58 can laterally extend along the same horizontal direction (e.g., the word line direction of the word lines 46W) as the lengthwise direction of the backside trenches 79 and the drain select level isolation structures 72. Each memory opening fill structure 58 includes a respective set of a memory stack structure 55, an optional pedestal channel portion 11, an optional dielectric core 62, and a drain region 63. As such, rows of memory stack structures 55 can laterally extend along the same horizontal direction as the lengthwise direction of the backside trenches 79 and the drain select level isolation structures 72. Each set of at least one row of memory stack structures 55 that can be selected by a combination of bias voltages applied to the first drain select gate electrodes SGD1 and the second select gate electrodes SGD2 constitutes a string. Four strings including string 0, string 1, string 2, and string 3 are illustrated in FIGS. 14A-14C. One drain region 63 per string can be attached to each bit line 90, as shown in FIG. 14C. The bit lines 90 can be subsequently formed above the contact level dielectric layer 73 along the bit line direction that is perpendicular to the word line direction of the rows of the memory stack structures 55, i.e., along the direction that is perpendicular to the direction of each string. Each of the drain regions 63 can be electrically connected (i.e., shorted) by a respective drain contact via structure 88 to a respective bit line among the bit lines that overlie the contact level dielectric layer 73. A single memory stack structure 55 can be selected for programming or reading by selecting a bit line by electrically biasing only the selected bit line and by selecting a string by applying a combination of bias voltages applied to the first drain select gate electrodes SGD1 and the second select gate electrodes SGD2.

As shown in FIG. 14C, each bit line 90 is electrically connected via the respective drain contact via structure (88A, 88B) to more than one memory stack structure (55A, 55B) (i.e., each bit line 90 is electrically connected to drain regions 63 of more than one memory opening fill structures 58) in different memory strings located in a region between nearest neighbor backside trenches 79 and/or dielectric isolation structures 72. In other words, each bit line 90 is electrically connected via the respective drain contact via structure (88A, 88B) to more than one memory stack structure (55A, 55B) in different memory strings located in a region that is not interrupted by a backside trench 79 and/or dielectric isolation structure 72. Thus, there is no backside trench 79 and/or dielectric isolation structure 72 located between the memory stack structures 55A and 55B that are electrically contacted by the same bit line 90.

In the first configuration, a dielectric isolation structure 72 laterally divides each of the at least one of the electrically conductive layers 46 (i.e., the drain select gate level electrically conductive layers 46D) located at each level of the first drain select gate electrodes SGD1 into first select gate electrodes SGD1. A first string (such as string 0) and a second string (such as string 1) can pass through one of the first drain select gate electrodes SGD1 and the second drain select gate electrode SGD2. A third string (such as string 2) and a fourth string (such as string 3) can pass through an additional first drain select gate electrode SGD1 (i.e., another of the first drain select gate electrodes SGD1) and the second drain select gate electrode SGD2. The group of the first string and the second string is laterally spaced from the group of the third string and the fourth string by the dielectric isolation structure 72.

The first string includes a first row of memory stack structures 55 (that can include, for example, the in-plane memory stack structure of string 0 that the plane B-B' intersects) and can optionally include an additional first row of memory stack structures 55 (that can include, for example, an off plane memory stack structures of string 0 shown in shade in FIG. 14A and is not intersected by the plane B-B'). The second string includes a second row of memory stack structures 55 (that can include, for example, the in-plane memory stack structure of string 1 that the plane B-B' intersects) and can optionally include an additional second row of memory stack structures 55 (that can include, for example, an off plane memory stack structures of string 1 shown in shade in FIG. 14A and is not intersected by the plane B-B'). The third string includes a third row of memory stack structures 55 (that can include, for example, the in-plane memory stack structure of string 2 that the plane B-B' intersects) and can optionally include an additional third row of memory stack structures 55 (that can include, for example, an off plane memory stack structures of string 2 shown in shade in FIG. 14A and is not intersected by the plane B-B'). The fourth string includes a fourth row of memory stack structures 55 (that can include, for example, the in-plane memory stack structure of string 3 that the plane B-B' intersects) and can optionally include an additional fourth row of memory stack structures 55 (that can include, for example, an off plane memory stack structures of string 3 shown in shade in FIG. 14A and is not intersected by the plane B-B'). For example, as shown in FIG. 14A, one string includes two rows in this embodiment.

The first row of memory stack structures 55 in the first string (string 0) has a higher threshold voltage for the first select gate electrode SGD1 than the second row of memory stack structures 55 in the second string (string 1) has for the first select gate electrode SGD1. The first row of memory stack structures 55 in the first string (string 0) has a lower threshold voltage for the second select gate electrode SGD2 than the second row of memory stack structures 55 in the second string (string 1) has for the second select gate electrode SGD2. The third row of memory stack structures 55 in the third string (string 2) has a higher threshold voltage for the additional first select gate electrode SGD1 than the fourth row of memory stack structures 55 in the fourth string (string 3) has for the additional first select gate electrode SGD1. The third row of memory stack structures 55 in the third string (string 2) has a lower threshold voltage for the second select gate electrode SGD2 than the fourth row of memory stack structures 55 in the fourth string (string 3) has for the second select gate electrode SGD2.

Referring to FIGS. 13A-13B, 14A-14C and 15A-15B, a three-dimensional NAND memory device contains an alternating stack of insulating layers 32 and electrically conductive word line layers 46W located over a substrate (9, 10). At least one first drain select gate electrode 46D (e.g. SGD1) is located over the alternating stack (32, 46W) and extending through a first drain select transistor 111 and a second drain select transistor 112, at least one second drain select gate electrode SGD2 is located between the first drain select electrode SGD2 and the alternating stack (32, 46W) and extending through a third drain select transistor 113 and a fourth drain select transistor 114. The drain select transistors are shown in dashed lines in FIGS. 14A and 15A. Each drain select transistor may be a multi select gate transistor (e.g., having more than two select gate electrodes, such as three select gate electrodes) or a single select gate transistor. The first drain select transistor 111 and the third drain select transistor 113 are located in a first NAND memory string (string 0). The second drain select transistor 112 and the fourth drain select transistor 114 are located in a second NAND memory string (string 1) different from the first NAND memory string. The first drain select transistor 111 has a higher threshold voltage than the second drain select transistor 112. The third drain select 113 transistor has a lower threshold voltage than the fourth drain select transistor 114.

As described above with respect to FIG. 14C, a bit line 90 is electrically connected by first drain contact via structure 88A to a first memory stack structure 55A in the first NAND memory string (string 0) and is electrically connected by a second drain contact via structure 88B to a second memory stack structure 55B in the second NAND memory string (string 1). The first memory stack structure 55A comprises a first vertical semiconductor channel 60 surrounded by first charge storage elements 54 and the second memory stack structure 55B comprises a second vertical semiconductor channel 60 surrounded by second charge storage elements 54. The word lines 46W contact the first memory stack structure 55A and the second memory stack structure 55B without being cut by a trench 79 or a dielectric isolation structure 72.

Figure 15A:
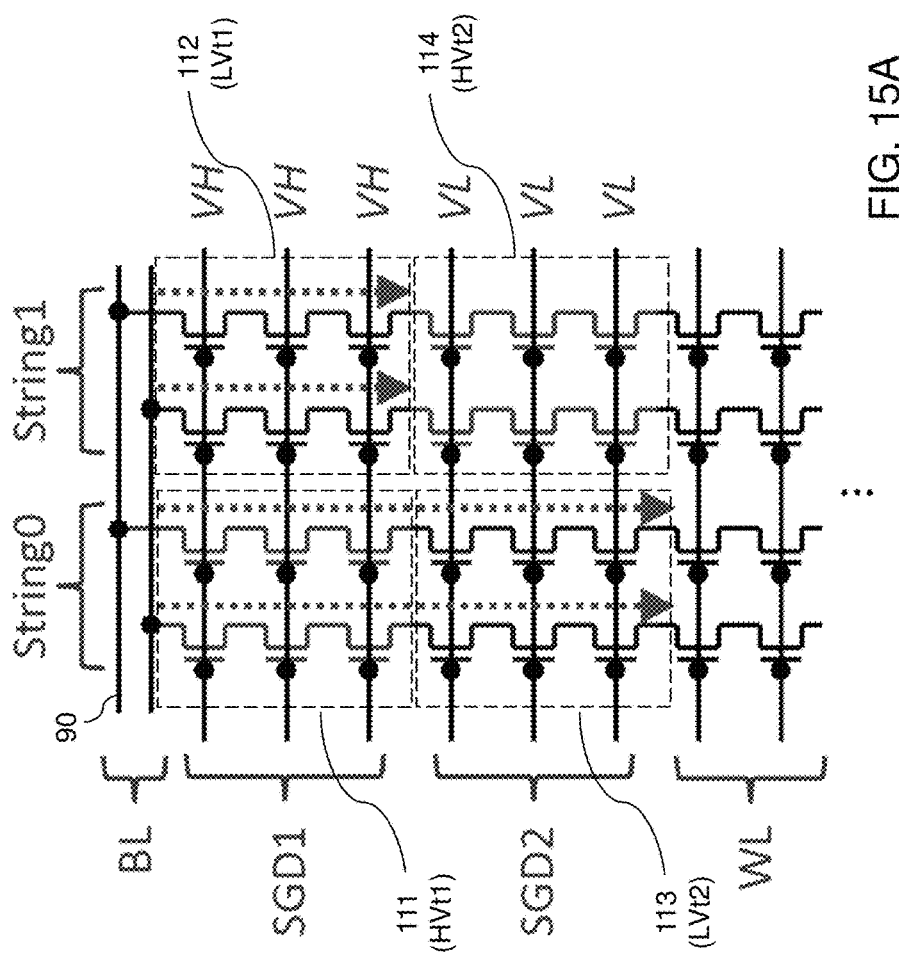
FIG. 15A is a circuit diagram during selection of string 0 of the first configuration of the exemplary structure of FIGS. 14A-14C.

Referring to FIG. 15A, a circuit diagram with a bias voltage scheme is illustrated during selection of string 0 of the first configuration of the exemplary structure of FIGS. 14A-14C. The source regions can be biased at 0 V, and a selected bit line 90 among a plurality of bit lines BL can be biased at a drain-to-source bias voltage. If the vertical semiconductor channels 60 include p-type channels, the selected bit line can be biased, for example, with a drain-to-source bias voltage in a range from 1 V to 6 V. If the vertical semiconductor channels 60 include n-type channels, the selected bit line can be biased, for example, with a drain-to-source bias voltage in a range from −1 V to −6 V. The various threshold voltages for turning on portions of a respective vertical semiconductor channel 60 are marked as HVt and LVt, which represent a high threshold voltage and a low threshold voltage, respectively.

Portions of the vertical semiconductor channels 60 of string 0 at the level(s) of the first select gate electrode SGD1 have a first high threshold voltage HVt1 for the first select gate electrode SGD1. Portions of the vertical semiconductor channels 60 of string 1 at the level(s) of the first select gate electrode SGD1 have a first low threshold voltage LVt1 for the first select gate electrode SGD1. The first high threshold voltage HVt1 is greater in magnitude than the first low threshold voltage LVt1. For example, if the vertical semiconductor channels 60 are p-type channels, the first high threshold voltage HVt1 can be in a range from 2 V to 20 V and the first low threshold voltage LVt1 can be in a range from 0.1 V to 5 V. Alternatively, if the vertical semiconductor channels 60 are n-type channels, the first high threshold voltage HVt1 can be in a range from −2 V to −20 V and the first low threshold voltage LVt1 can be in a range from −0.1 V to −5 V. Portions of the vertical semiconductor channels 60 of string 0 at the level(s) of the second select gate electrode SGD2 have a second low threshold voltage LVt2 for the second select gate electrode SGD2. Portions of the vertical semiconductor channels 60 of string 1 at the level(s) of the second select gate electrode SGD2 have a second high threshold voltage HVt2 for the second select gate electrode SGD2. Thus, the first string (string 0) and the second string (string 1) have opposite high and low threshold voltages for each of the first and second select gate electrodes. The second high threshold voltage HVt2 is greater in magnitude than the second low threshold voltage LVt2. For example, if the vertical semiconductor channels 60 are p-type channels, the second high threshold voltage HVt2 can be in a range from 2 V to 20 V and the second low threshold voltage LVt2 can be in a range from 0.2 V to 5 V. Alternatively, if the vertical semiconductor channels 60 are n-type channels, the second high threshold voltage HVt2 can be in a range from −2 V to −20 V and the second low threshold voltage LVt2 can be in a range from −0.2 V to −5 V.

To select the memory stack structure 55 within string 0, the first select gate electrode SGD1 laterally surrounding string 0 (and string 1) can be electrically biased at a high drain select gate bias voltage VH, which is greater in magnitude than a first high threshold voltage HVt1 for the first select gate electrode SGD1 and which is sufficient to turn on the portions of the vertical semiconductor channels 60 of string 0 (and of string 1) at the level(s) of the first select gate electrode SGD1. Application of the high drain select gate bias voltage VH to the first select gate electrode SGD1 turns on the portions of the vertical semiconductor channels 60 at the level(s) of the first select gate electrode SGD1 for each memory stack structure 55 in string 0 and string 1. Concurrently, the second select gate electrode SGD2 laterally surrounding string 0 (and string 1) can be electrically biased at a low drain select gate bias voltage VL, which is greater in magnitude than a second low threshold voltage LVt2 for the second select gate electrode SGD2 and which is sufficient to turn on the portions of the vertical semiconductor channels 60 of string 0 at the level(s) of the second select gate electrode SGD2, and is less in magnitude than a second high threshold voltage HVt2 that is sufficient to turn on the portions of the vertical semiconductor channels 60 of string 1 at the level(s) of the second select gate electrode SGD2. Application of the low drain select gate bias voltage VL to the second select gate electrode SGD2 turns on the portions of the vertical semiconductor channels 60 at the level(s) of the second select gate electrode SGD2 for each memory stack structure 55 in string 0, but is insufficient to turn on the portions of the vertical semiconductor channels 60 at the level(s) of the second select gate electrode SGD2 for each memory stack structure 55 in string 1.

Thus, the vertical semiconductor channels 60 of string 0 are turned on at the levels of the first select gate electrode SGD1 and the second select gate electrode SGD2, as shown by the dashed arrows on the left, while the vertical semiconductor channels 60 of string 1 are turned on at the levels of the first select gate electrode SGD1 and are turned off at the levels of the second select gate electrode SGD2, as shown by the dashed arrows on the right. Therefore, the biasing scheme of FIG. 15A turns on the vertical semiconductor channels 60 of string 0 through the levels of the first and second select gate electrodes (SGD1, SGD2), and turns off the vertical semiconductor channels 60 of string 1 through the levels of the first and second select gate electrodes (SGD1, SGD2).

Figure 15B:
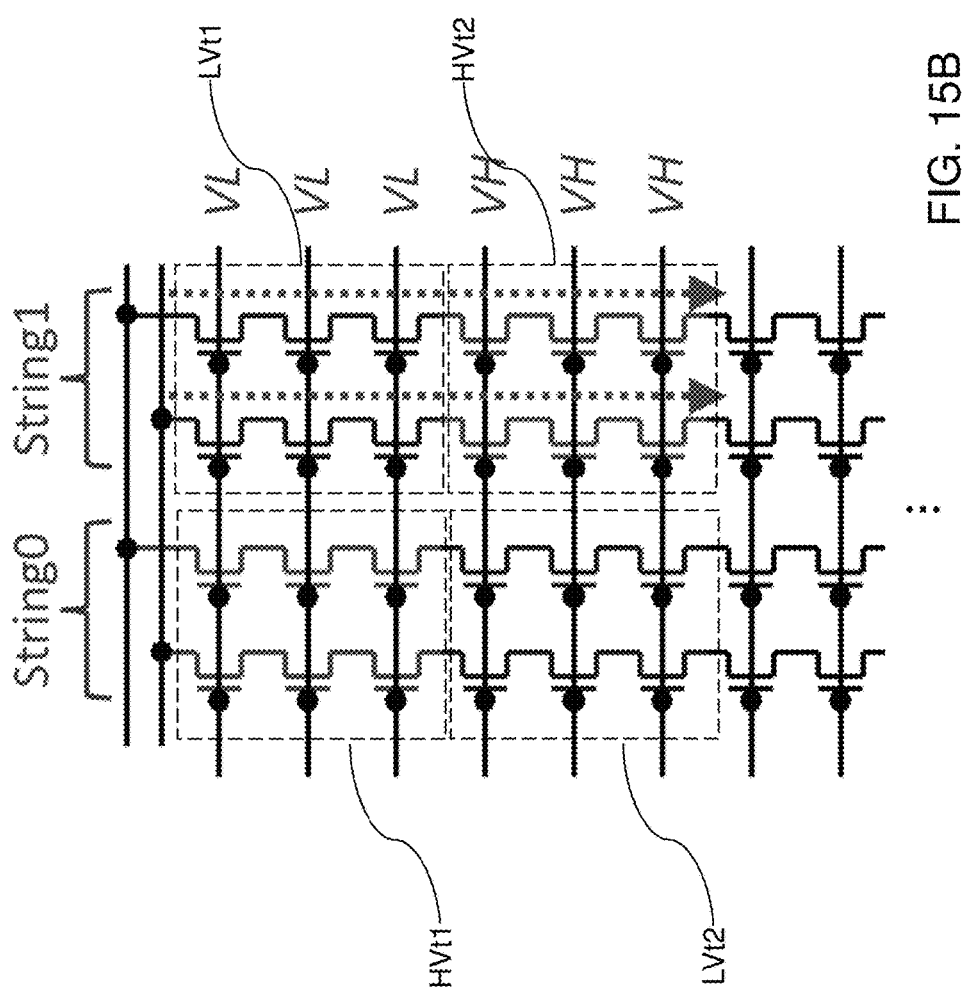
FIG. 15B is a circuit diagram during selection of string 1 of the first configuration of the exemplary structure of FIGS. 14A-14C.

Referring to FIG. 15B, a circuit diagram with a bias voltage scheme is illustrated during selection of string 1 of the first configuration of the exemplary structure of FIGS. 14A-14C. The source regions can be biased at 0 V, and a selected bit line 90 among a plurality of bit lines BL can be biased at a drain-to-source bias voltage. The biasing schemes for the source and the drain of the vertical field effect transistors can be the same as in FIG. 15A.

To select the memory stack structure 55 within string 1, the first select gate electrode SGD1 laterally surrounding string 1 (and string 0) can be electrically biased at a low drain select gate bias voltage VL, which is greater in magnitude than the first low threshold voltage LVt1 for the first select gate electrode SGD1 and which is sufficient to turn on the portions of the vertical semiconductor channels 60 of string 1 at the level(s) of the first select gate electrode SGD1, and is less in magnitude than the first high threshold voltage HVt1 that is sufficient to turn on the portions of the vertical semiconductor channels 60 of string 0 at the level(s) of the first select gate electrode SGD1. Application of the low drain select gate bias voltage VL to the first select gate electrode SGD1 turns on the portions of the vertical semiconductor channels 60 at the level(s) of the first select gate electrode SGD1 for each memory stack structure 55 in string 1, but is insufficient to turn on the portions of the vertical semiconductor channels 60 at the level(s) of the first select gate electrode SGD1 for each memory stack structure 55 in string 0. Concurrently, the second select gate electrode SGD2 laterally surrounding string 1 (and string 0) can be electrically biased at a high drain select gate bias voltage VH, which is greater in magnitude than the second high threshold voltage HVt2 for the second select gate electrode SGD2 and which is sufficient to turn on the portions of the vertical semiconductor channels 60 of string 1 (and of string 0) at the level(s) of the second select gate electrode SGD2. Application of the high drain select gate bias voltage VH to the second select gate electrode SGD2 turns on the portions of the vertical semiconductor channels 60 at the level(s) of the second select gate electrode SGD2 for each memory stack structure 55 in string 0 and string 1, as shown by the dashed arrows.

Thus, the vertical semiconductor channels 60 of string 1 are turned on at the levels of the first select gate electrode SGD1 and the second select gate electrode SGD2, while the vertical semiconductor channels 60 of string 0 are turned on at the levels of the second select gate electrode SGD2 and is turned off at the levels of the first select gate electrode SGD1. Therefore, the biasing scheme of FIG. 15B turns on the vertical semiconductor channels 60 of string 1 through the levels of the first and second select gate electrodes (SGD1, SGD2), and turns off the vertical semiconductor channels 60 of string 0 through the levels of the first and second select gate electrodes (SGD1, SGD2). By selecting one of the bias schemes of FIG. 15A and FIG. 15B, string 0 or string 1 can be alternatively selected for programming and/or reading.

Configuring the exemplary structure to provide the various threshold voltages illustrated in FIGS. 15A and 15B can be effected by ion implantation of electrical dopants. If the vertical semiconductor channels 60 are p-type channels, the vertical semiconductor channels can be formed with a sufficient level of p-type doping to provide the first low threshold voltage LVt1 at the level(s) of the first select gate electrode SGD1, and to provide the second low threshold voltage LVt2 at the level(s) of the second select gate electrode SGD2. If the vertical semiconductor channels 60 are n-type channels, the vertical semiconductor channels can be formed with a sufficient level of n-type doping to provide the first low threshold voltage LVt1 at the level(s) of the first select gate electrode SGD1, and to provide the second low threshold voltage LVt2 at the level(s) of the second select gate electrode SGD2. The first low threshold voltage LVt1 may be the same as the second low threshold voltage LVt2. Thus, the vertical semiconductor channels 60 are formed with different level of doping in different strings at the level of the same select gate electrode to provide the different threshold voltages in different strings at the level of the same select gate electrode.

The ion implantation process can be performed at any processing step between completion of the memory opening fill structures 58 and formation of the various contact via structures (86, 87) to the electrically conductive layers 46. For example, the ion implantation process can be performed at the processing steps of FIG. 6.

In one embodiment, two masked ion implantation processes can be employed to provide the exemplary structure of FIGS. 14A-14C. Referring to FIG. 16A, the exemplary structure for providing the first configuration is illustrated during a first ion implantation step that is performed after formation of the contact level dielectric layer 73 and prior to formation of backside trenches 79. A first photoresist layer 17 can be applied over the contact level dielectric layer 73, and can be lithographically patterned to cover areas in which the vertical semiconductor channels 60 will provide the first low threshold voltage LVt1 for the first select gate electrodes SGD1. For example, the patterned first photoresist layer 17 can cover strings 1 and 2, but expose strings 0 and 3. The thickness of the first photoresist layer 17 can be selected such that the electrical dopants to be implanted do not reach below the contact level dielectric layer 73. The patterned first photoresist layer 17 includes an opening in each area (e.g., over strings 0 and 3) in which the vertical semiconductor channels 60 are designed to provide the first high threshold voltage HVt1 for the first select gate electrodes SGD1.

Dopants of the same conductivity type as the doping within the vertical semiconductor channels 60 can be implanted into portions of the vertical semiconductor channels 60 located at each level of the first select gate electrodes SGD1 to be subsequently formed, which corresponds to each level of the sacrificial material layers 42 through which the drain select level isolation structures 72 extend. The energy and the species of the implanted ions are selected such that the vertical semiconductor channels 60 are implanted with the electrical dopants only at the level(s) of the first select gate electrodes SGD1. In other words, the vertical semiconductor channels 60 are not implanted with the electrical dopants at any level of the second select gate electrodes SGD2, which are located below the levels of the drain select level isolation structures 72. The dose of the implanted ions can be selected such that the implanted portions of the vertical semiconductor channels 60 provide the first high threshold voltage HVt1 for the first select gate electrodes SGD1 to be subsequently formed. First implanted regions IR1 (e.g., in strings 0 and 3) into which the electrical dopants are implanted include regions of the vertical semiconductor channels 60 that provide the first high threshold voltage HVt1 for the first select gate electrodes SGD1. The first photoresist layer 17 can be subsequently removed, for example, by ashing.

Figure 16B:
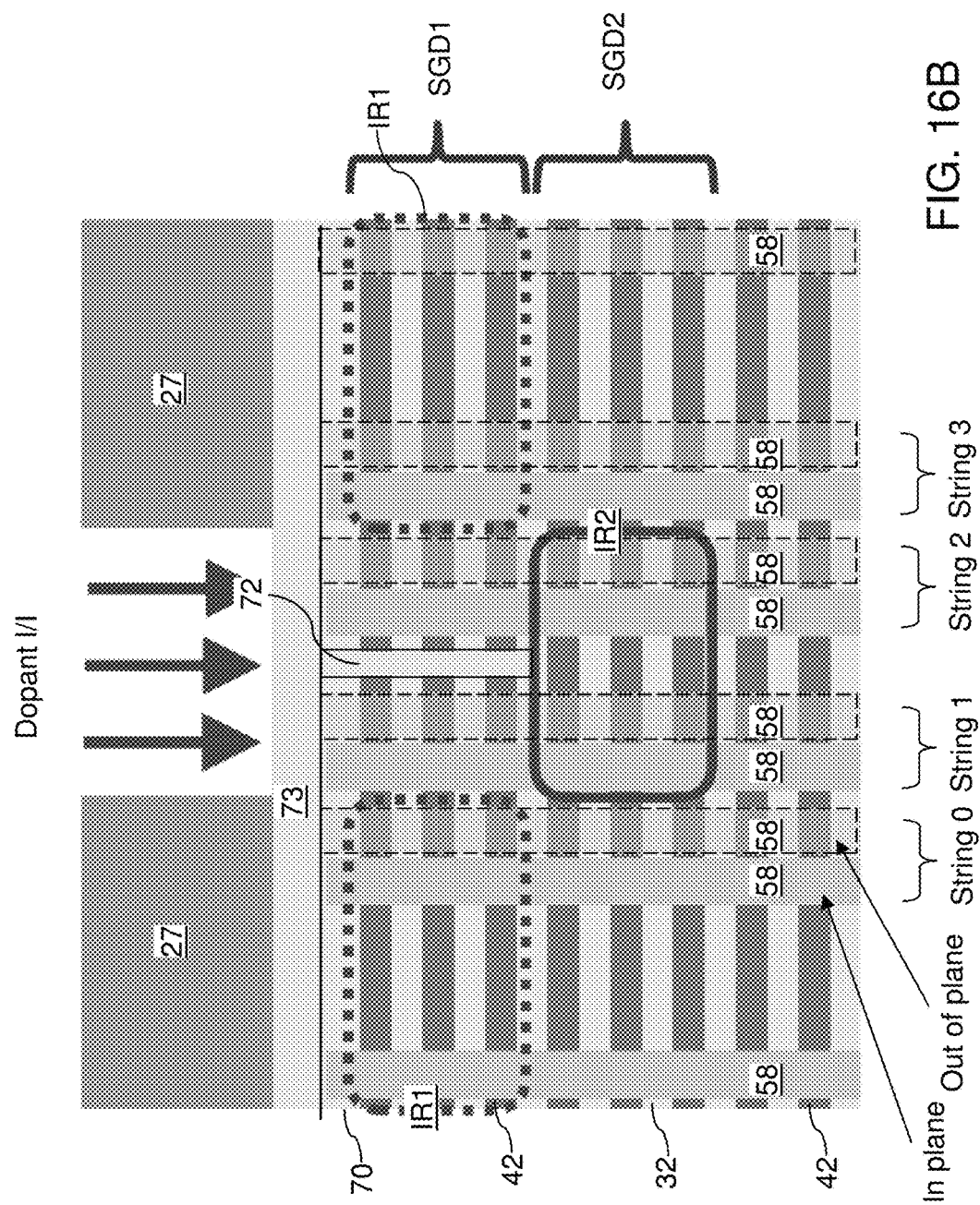
FIG. 16B is a vertical cross-sectional view of the exemplary structure for providing the first configuration during a second ion implantation step that is performed after formation of the contact level dielectric layer and prior to formation of backside trenches according to the first embodiment of the present disclosure.

Referring to FIG. 16B, a second photoresist layer 27 can be applied over the contact level dielectric layer 73, and can be lithographically patterned to form cover areas in which the vertical semiconductor channels 60 will provide the second low threshold voltage LVt2 for the second select gate electrodes SGD2. The thickness of the second photoresist layer 27 can be selected such that the electrical dopants to be implanted do not reach below the contact level dielectric layer 73. The patterned second photoresist layer 27 includes an opening in each area in which the vertical semiconductor channels 60 will provide the second high threshold voltage HVt2 for the second select gate electrodes SGD2. The covered and exposed regions in the patterned second photoresist layer 27 are complementary to those of the patterned first photoresist layer 17. Thus, the patterned second photoresist layer 27 can expose strings 1 and 2, and cover strings 0 and 3.

Dopants of the same conductivity type as the doping within the vertical semiconductor channels 60 can be implanted into portions of the vertical semiconductor channels 60 located at each level of the second select gate electrodes SGD2 to be subsequently formed, which care located underneath the levels of the drain select level isolation structures 72. The energy and the species of the implanted ions are selected such that the vertical semiconductor channels 60 are implanted with the electrical dopants only at the level(s) of the second select gate electrodes SGD2. In other words, the vertical semiconductor channels 60 are not implanted with the electrical dopants at any level of the first select gate electrodes SGD1 or at any level below the levels of the second select gate electrodes SGD2. The dose of the implanted ions can be selected such that the implanted portions of the vertical semiconductor channels 60 provide the second high threshold voltage HVt2 for the second select gate electrodes SGD2 to be subsequently formed. Second implanted regions IR2 (e.g., in strings 1 and 2) into which the electrical dopants are implanted include regions of the vertical semiconductor channels 60 that provide the second high threshold voltage HVt2 for the second select gate electrodes SGD2. The second photoresist layer 27 can be subsequently removed, for example, by ashing. The unimplanted areas in each string have the low threshold voltage.

Generally, electrical dopants can be implanted into portions of the vertical semiconductor channels 60 employing two masked ion implantation processes in some embodiments. Portions of the vertical semiconductor channels 60 at a level of the first select gate electrode SGD1 within a first row of memory stack structures 55 (such as any row within string 0 or string 3) have a greater dopant concentration of electrical dopants than portions of the vertical semiconductor channels 60 at the level of the first select gate electrode SGD1 within the second row of memory stack structures 55 (such as any row within string 1 and string 2). Portions of the vertical semiconductor channels 60 at a level of the second select gate electrode SGD2 within the second row of memory stack structures 55 (such as any row within string 1 and string 2) have a greater dopant concentration of electrical dopants than portions of the vertical semiconductor channels 60 at the level of the second select gate electrode SGD2 within the first row of memory stack structures 55 (such as any row within string 0 and string 3). If the implanted electrical dopants in the vertical semiconductor channels 60 are p-type electrical dopants, a top end of each of the vertical semiconductor channels 60 adjoins an n-doped active region, i.e., an n-doped drain region 63. If the implanted electrical dopants in the vertical semiconductor channels 60 are n-type electrical dopants, a top end of each of the vertical semiconductor channels 60 adjoins a p-doped active region, i.e., a p-doped drain region 63.

Figure 17A:
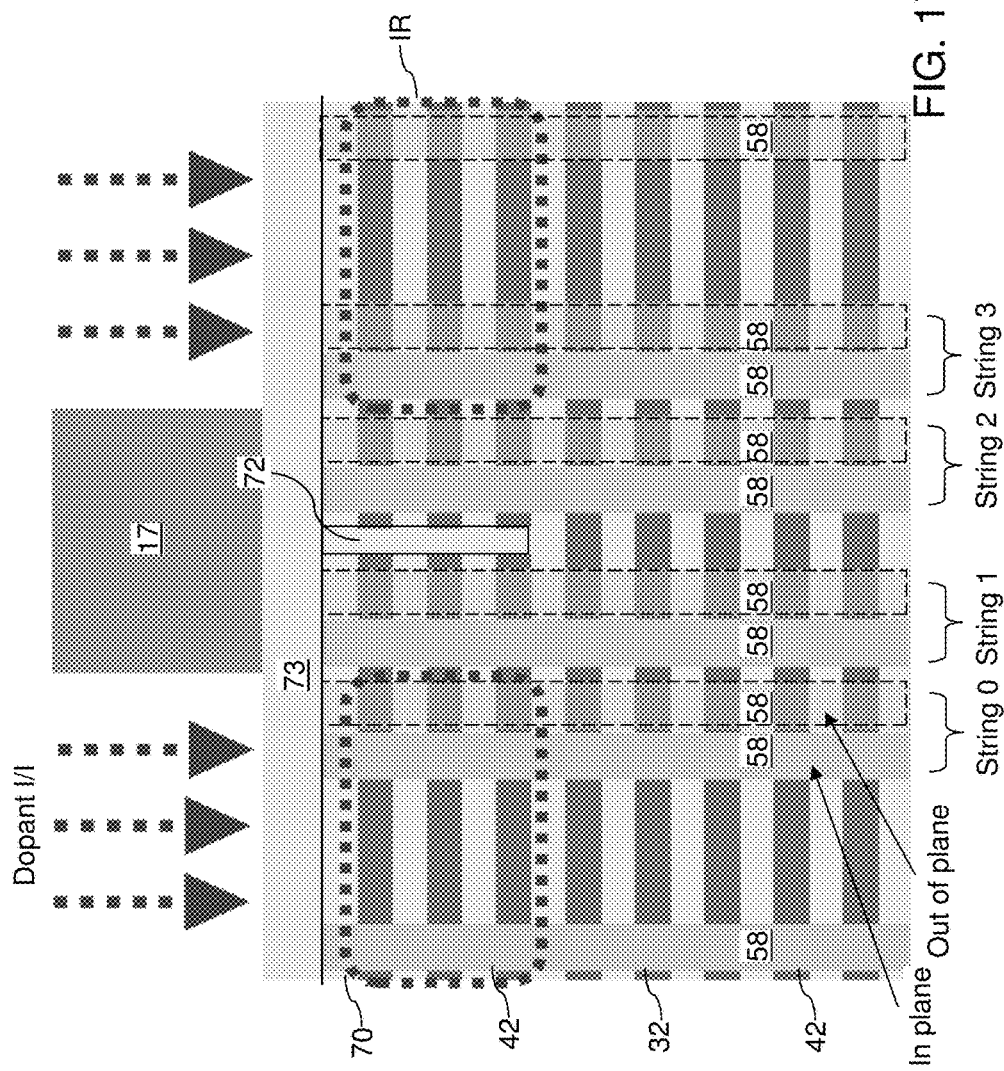
FIG. 17A is a vertical cross-sectional view of an alternative exemplary structure for providing the first configuration during an ion implantation step that is performed after formation of the contact level dielectric layer and prior to formation of backside trenches according to the first embodiment of the present disclosure.

Referring to FIG. 17A, an alternative exemplary structure for providing the first configuration is illustrated during a single ion implantation step that is performed after formation of the contact level dielectric layer 73 and prior to formation of backside trenches 79. The alternative exemplary structure of FIG. 17A can be identical to the exemplary structure of FIG. 16A, and the processing steps can be identical to the processing steps of FIG. 16A.

Figure 17B:
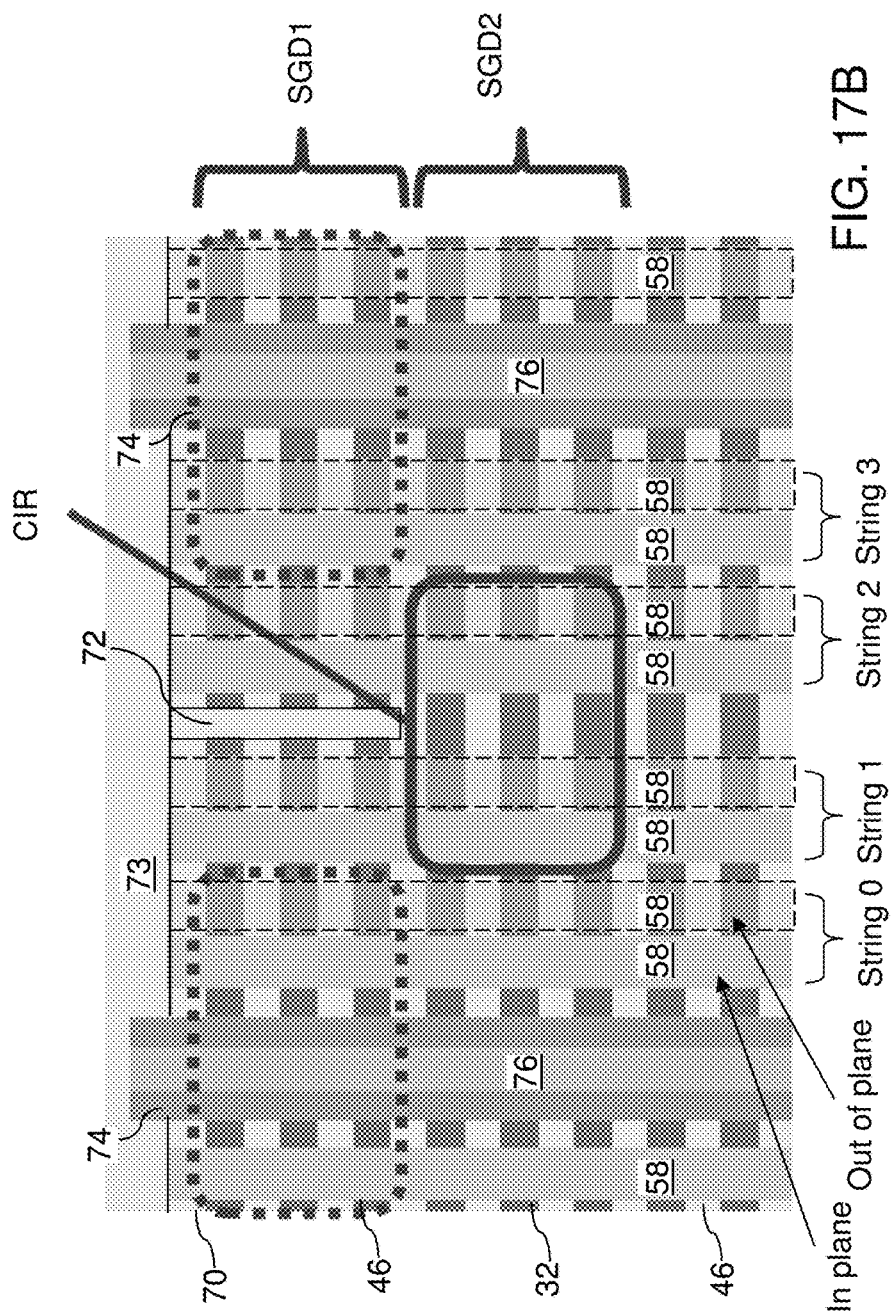
FIG. 17B is a vertical cross-sectional view of the alternative exemplary structure for providing the first configuration after a charge injection step that is performed after formation of the contact level dielectric layer and prior to formation of backside trenches according to the first embodiment of the present disclosure.

Referring to FIG. 17B, subsequent processing steps after the processing steps of FIG. 6 can be performed to replace the sacrificial material layers 42 with electrically conductive layers 46 and to form contact via structures (86, 87) to each of the electrically conductive layers 46. First select gate electrodes SGD1 and second select gate electrodes SGD2 are formed as subsets of the electrically conductive layers 46. The exemplary structure can be diced as needed, and can be packaged in a product module. Prior to usage as a three-dimensional memory device, all memory stack structures 55 that have the first low threshold voltage LVt1 at the level of the first select gate electrodes SGD1 are selected by applying a low drain select gate bias voltage VL. The unselected memory stack structures 55 have the first high threshold voltage HVt1 at the level of the first select gate electrodes SGD1, and are not turned on during the threshold voltage programming operation.

By applying a suitable bias voltage to each of the drain select gate level electrically conductive layers 46D within the second select gate electrodes SGD2, electrical charges can be injected from the vertical semiconductor channels 60 through tunneling dielectric layers 56 into the charge storage elements located around the selected memory stack structures at each level of the second select gate electrodes SGD2. For example, the charge storage elements can be portions of the charge storage layers 54 within the selected memory stack structures 55 structures at each level of the second select gate electrodes SGD2. The injected and stored electrical charges within the charge storage elements have the effect of raising the threshold voltage of the portions of the vertical semiconductor channels 60 within the selected memory stack structures 55 to the second high threshold voltage HVt2. A region including the programmed (charge-injected) charge storage elements is herein referred to as a charge injected region CIR. The unselected memory stack structures 55 have the original threshold voltage at the level of the second select gate electrodes SGD2, which is the second low threshold voltage LVt2.

Generally, electrical dopants can be implanted into portions of the vertical semiconductor channels 60 employing a single masked ion implantation processes in some embodiments. Portions of the vertical semiconductor channels 60 at a level of the first select gate electrode SGD1 within a first row of memory stack structures 55 (such as any row within string 0 or string 3) have a greater dopant concentration of electrical dopants than portions of the vertical semiconductor channels 60 at the level of the first select gate electrode SGD1 within the second row of memory stack structures 55 (such as any row within string 1 and string 2). Electrical charges can be stored in charge storage elements located around portions of the vertical semiconductor channels 60 at a level of the second select gate electrode SGD2 within the second row of memory stack structures 55 (such as any row within string 1 and string 2), while charge storage elements laterally surrounding portions of the vertical semiconductor channels 60 at the level of the second select gate electrode SGD2 within the first row of memory stack structures 55 (such as any row within string 0 and string 3) remain free, or substantially free, of trapped electrical charges therein.

Each string (such as string 0, string 1, string 2, and string 3) can have a single row of memory stack structures 55, two rows of memory stack structures 55 (e.g., as shown in FIGS. 14A-14C), three rows of memory stack structures 55, or more rows (such as any integer from 4 to 16) of memory stack structures 55.

Figure 18:
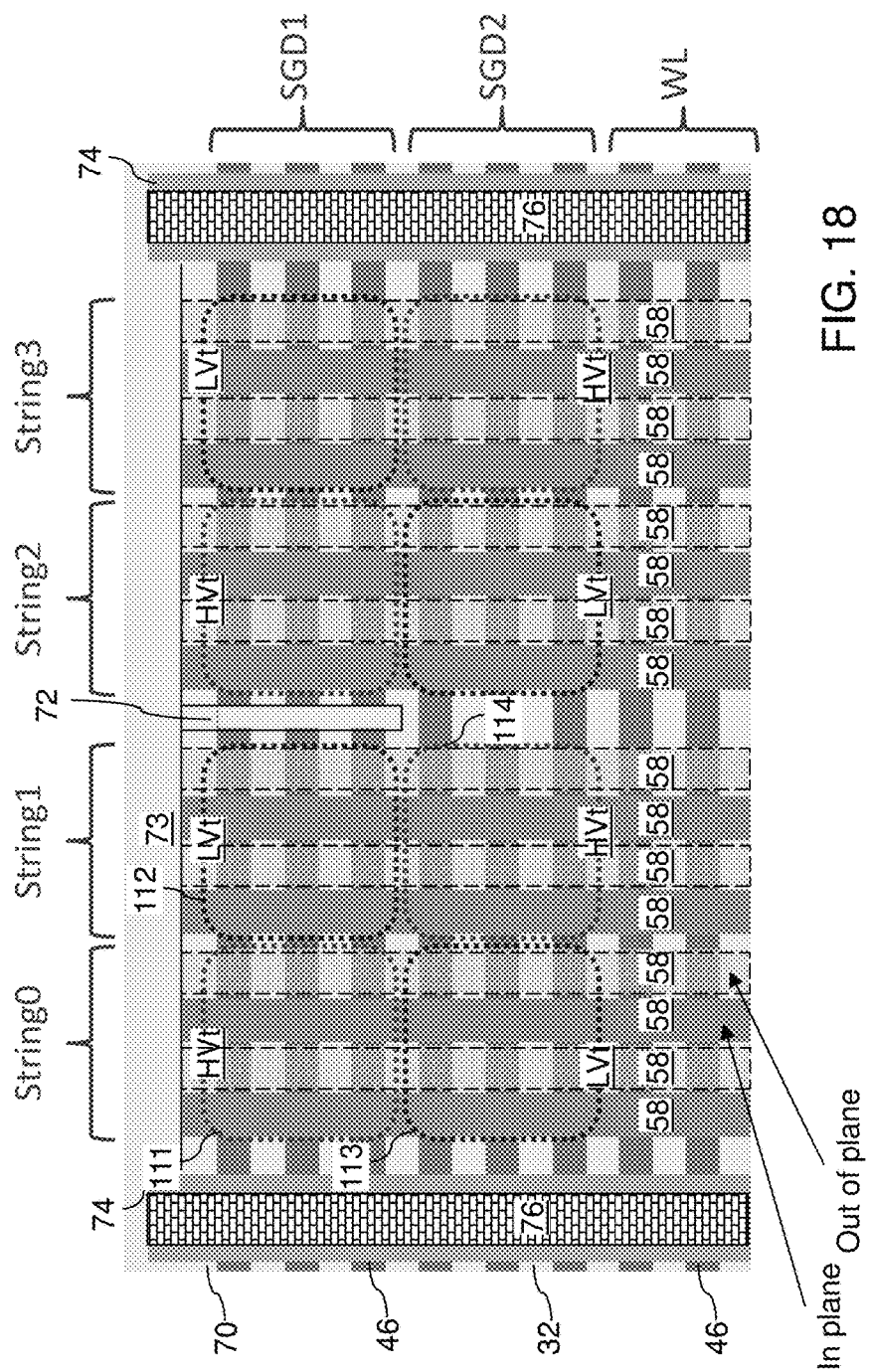
FIG. 18 is a vertical cross-sectional view of a modification of the first configuration of the exemplary structure according to the first embodiment of the present disclosure.

Referring to FIG. 18, a modification of the first configuration of the exemplary structure according to the first embodiment of the present disclosure is illustrated, which illustrates four rows of memory stack structures 55 per string.

The drain select level isolation structures 72 are optional structures. As such, the drain select level isolation structures 72 can be omitted in some configurations.

Referring to FIGS. 19A and 19B, a second configuration of the exemplary structure according to a second embodiment of the present disclosure is illustrated, which can be derived from the first configuration of the exemplary structure of FIG. 18 by omitting formation of the drain select level isolation structures 72. In the illustrated configuration, each string includes four rows of memory stack structures 55. Two strings (string 0 and string 1) are provided between a neighboring pair of insulating material portions, between which an alternating stack of insulating layers 32 and electrically conductive layers 46 is provided.

Figure 20A:
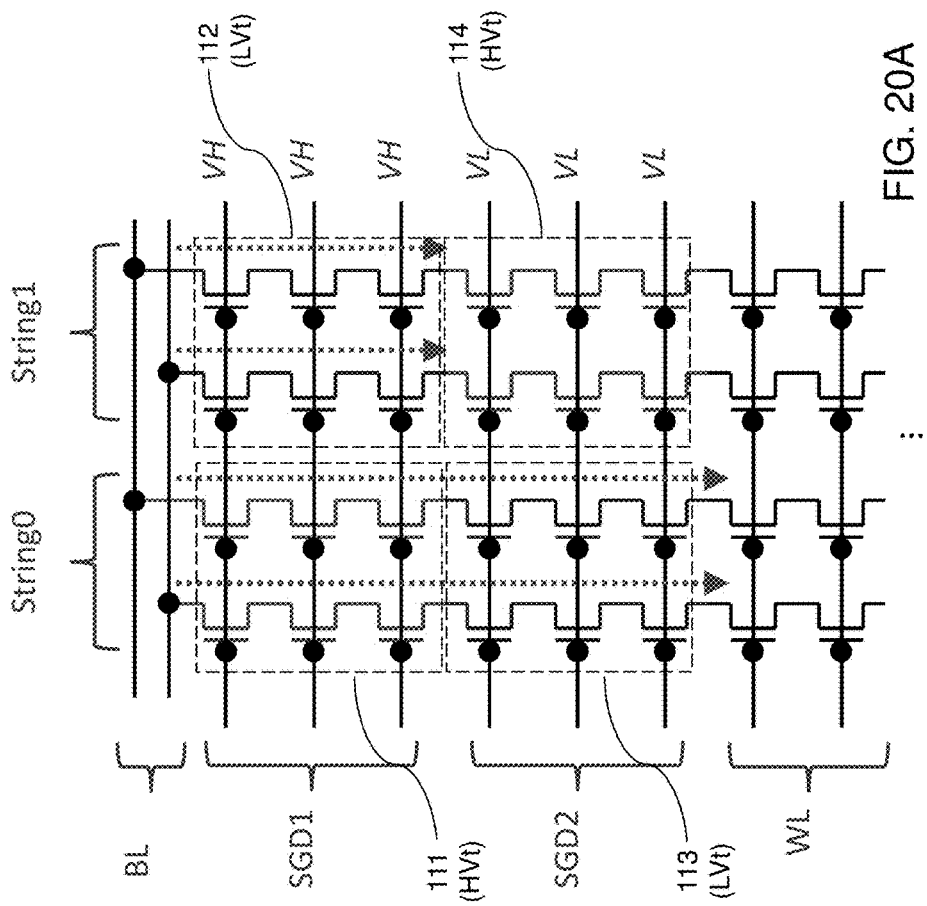
FIG. 20A is a circuit diagram during selection of string 0 of the second configuration of the exemplary structure of FIGS. 19A and 19B.

Referring to FIG. 20A, a circuit diagram with a bias voltage scheme is illustrated during selection of string 0 of the second configuration of the exemplary structure of FIGS. 19A and 19B. The bias voltage scheme of FIG. 20A can be identical to the bias voltage scheme of FIG. 15A.

Figure 20B:
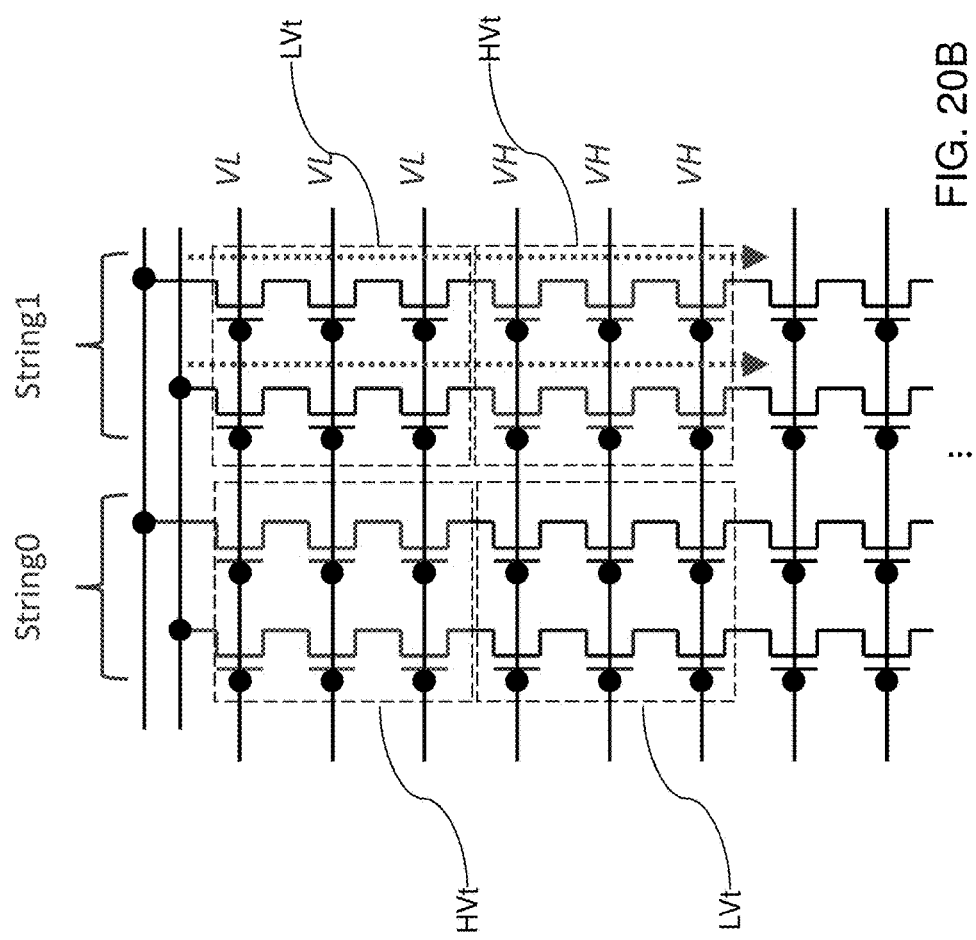
FIG. 20B is a circuit diagram during selection of string 1 of the second configuration of the exemplary structure of FIGS. 19A and 19B.

Referring to FIG. 20B, a circuit diagram with a bias voltage scheme is illustrated during selection of string 1 of the second configuration of the exemplary structure of FIGS. 19A and 19B. The bias voltage scheme of FIG. 20B can be identical to the bias voltage scheme of FIG. 15B.

Figure 21A:
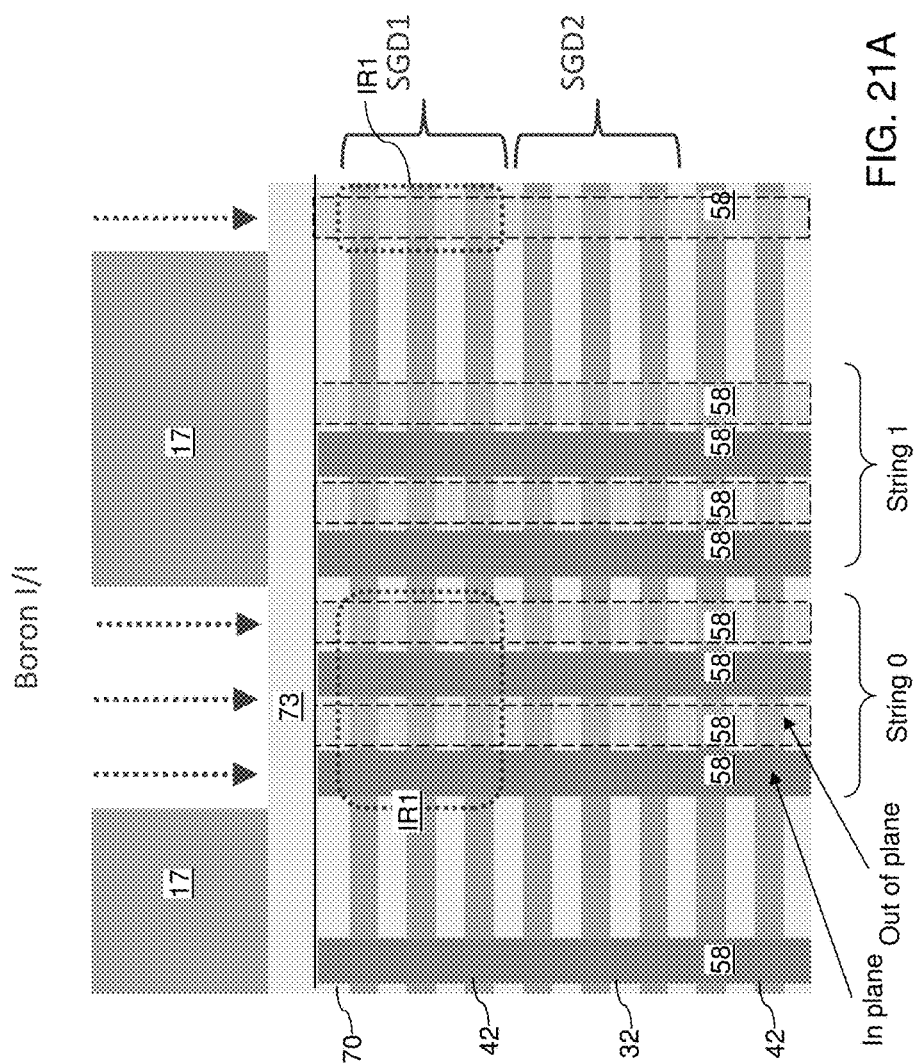
FIG. 21A is a vertical cross-sectional view of an exemplary structure for providing the second configuration during a first ion implantation step that is performed after formation of the contact level dielectric layer and prior to formation of backside trenches according to the second embodiment of the present disclosure.

Referring to FIG. 21A, an exemplary structure for providing the second configuration is illustrated during a first ion implantation step that is performed after formation of the contact level dielectric layer 73 and prior to formation of backside trenches 79. The exemplary structure for providing the second configuration can be derived from the exemplary structure for providing the first configuration illustrated in FIG. 16A by removing the drain select level isolation structures 72, with consequent removal of string 2 and string 3. The pattern of the first photoresist layer 17 is modified to accommodate removal of the drain select level isolation structures 72, string 2, and string 3. The processing steps of FIG. 21A can be identical to the processing steps of FIG. 16A.

Figure 21B:
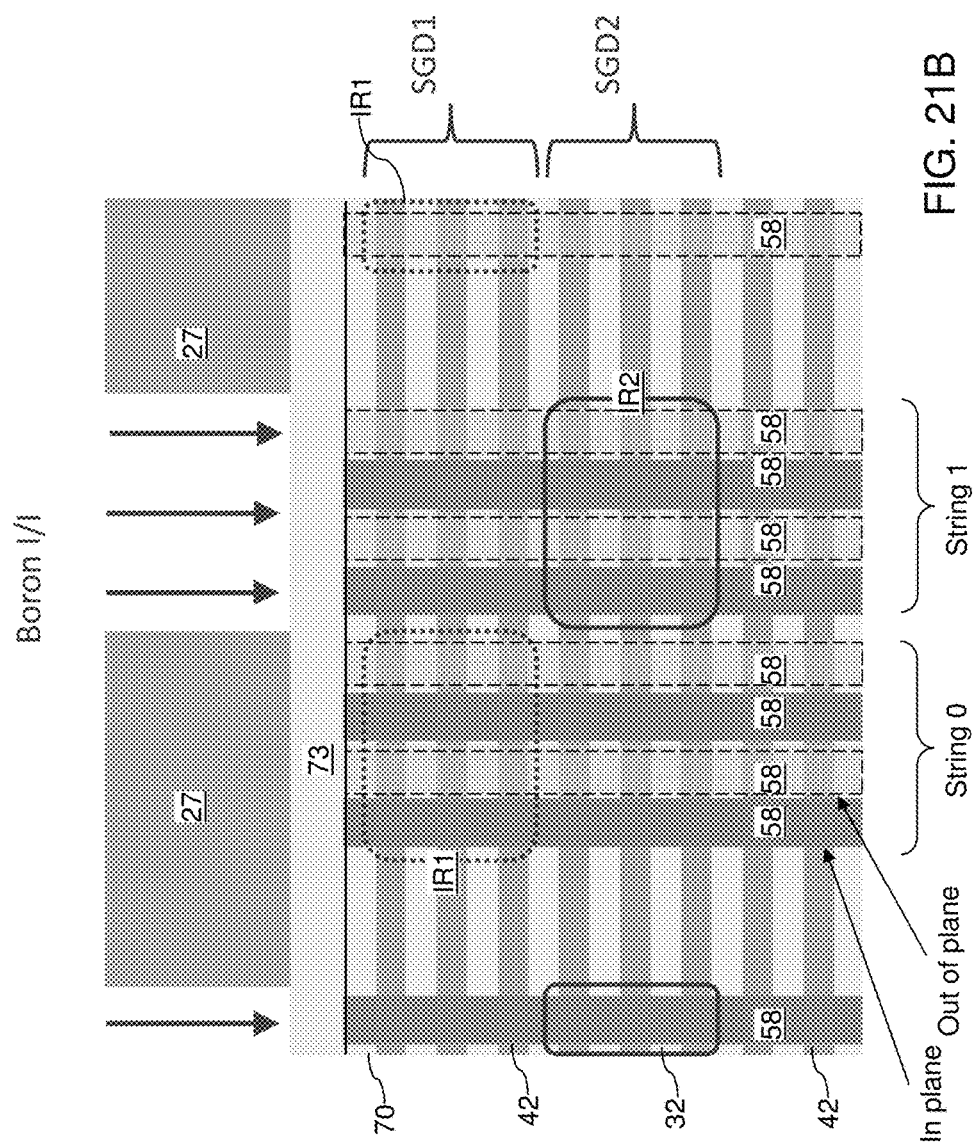
FIG. 21B is a vertical cross-sectional view of the exemplary structure for providing the second configuration during a second ion implantation step that is performed after formation of the contact level dielectric layer and prior to formation of backside trenches according to the second embodiment of the present disclosure.

Referring to FIG. 21B, the processing steps of FIG. 16B with modification of the pattern for the second photoresist layer 27 to accommodate removal of the drain select level isolation structures 72. Subsequently, the processing steps of FIGS. 7A and 7B through FIGS. 13A and 13B can be performed to provide the second configuration of the exemplary structure illustrated in FIGS. 19A and 19B.

Figure 22A:
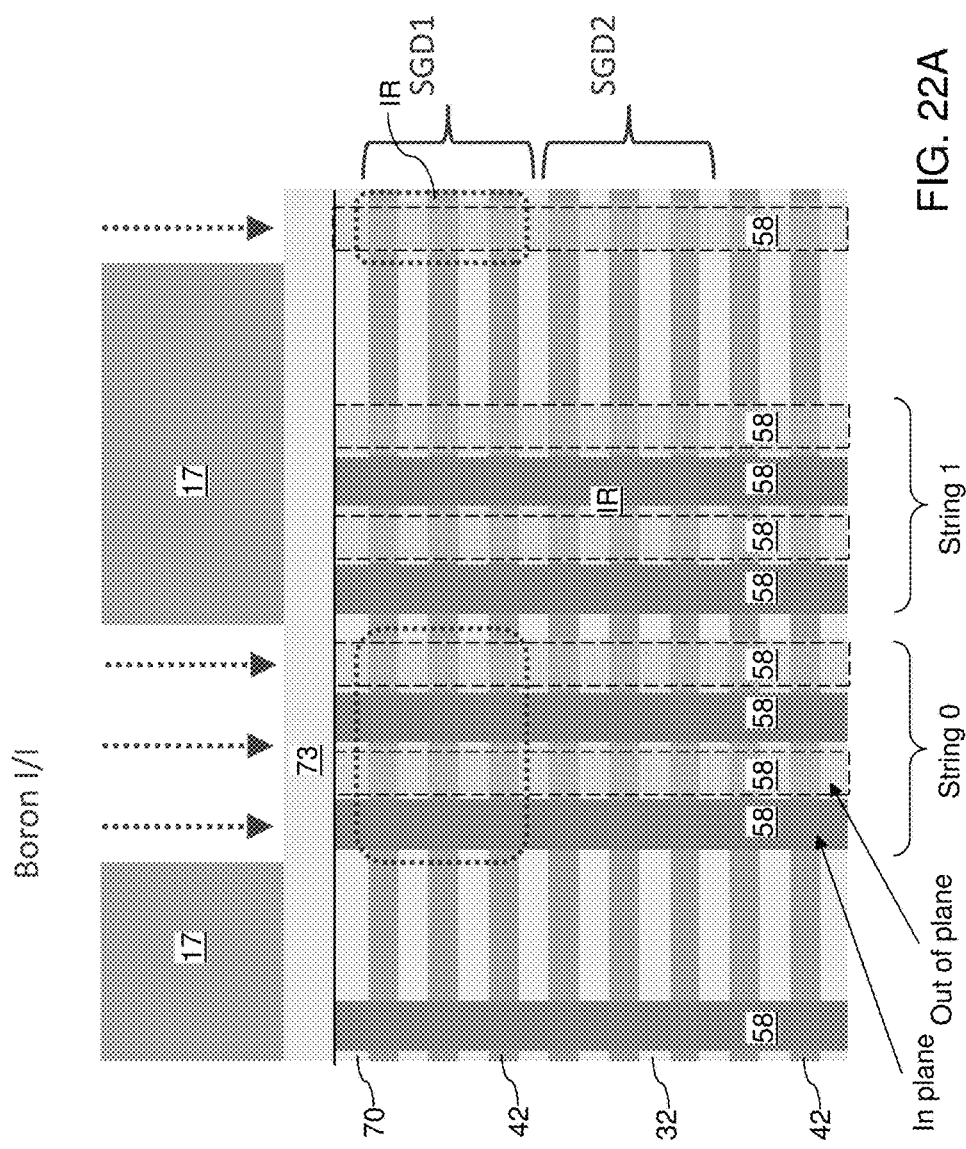
FIG. 22A is a vertical cross-sectional view of an alternative exemplary structure for providing the second configuration during an ion implantation step that is performed after formation of the contact level dielectric layer and prior to formation of backside trenches according to the second embodiment of the present disclosure.

Referring to FIG. 22A, an alternative exemplary structure for providing the second configuration is illustrated during an ion implantation step that is performed after formation of the contact level dielectric layer 73 and prior to formation of backside trenches 79. The alternative exemplary structure of FIG. 22A can be identical to the exemplary structure of FIG. 21A.

Figure 22B:
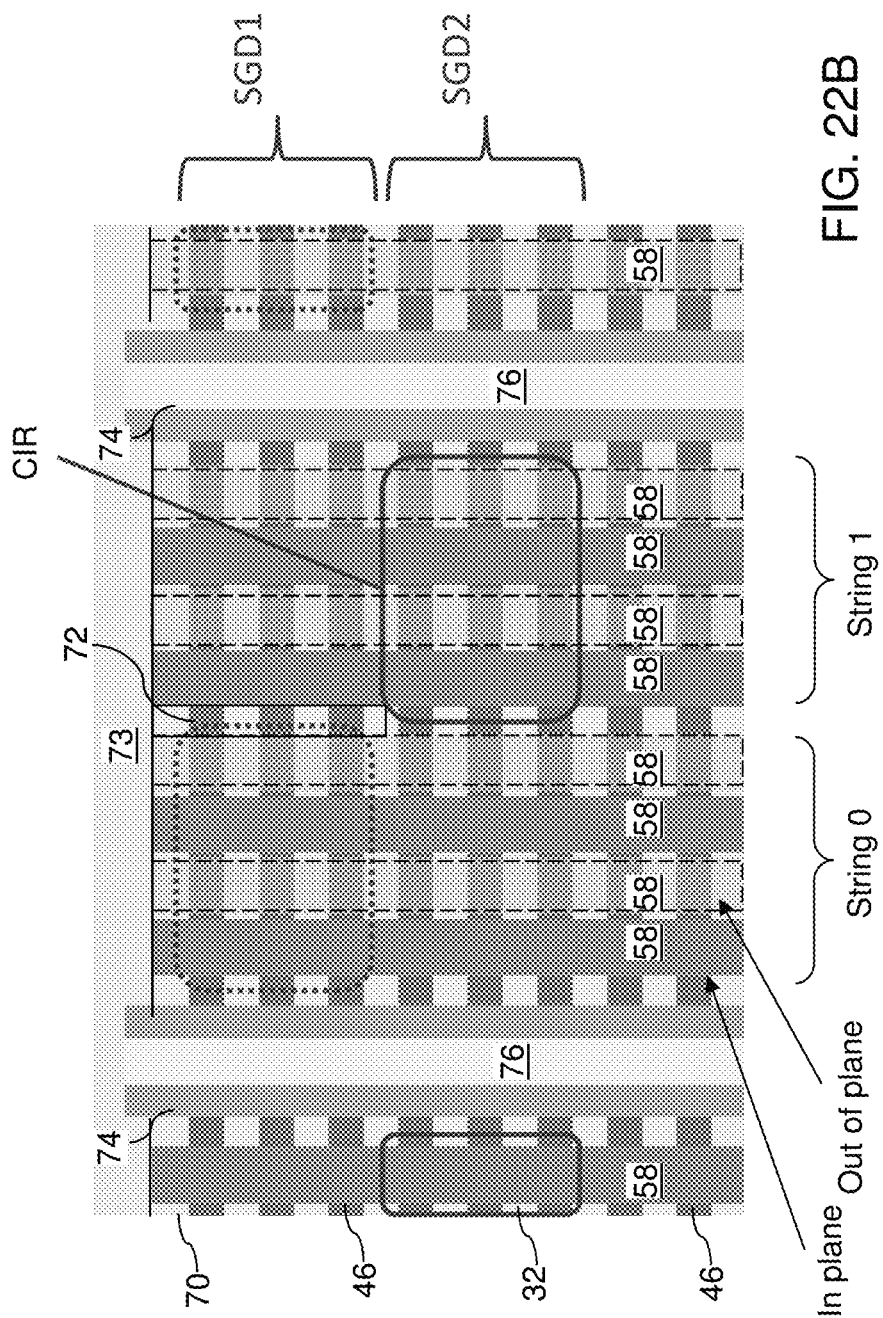
FIG. 22B is a vertical cross-sectional view of the alternative exemplary structure for providing the second configuration after a charge injection step that is performed after formation of the contact level dielectric layer and prior to formation of backside trenches according to the second embodiment of the present disclosure.

Referring FIG. 22B, subsequent processing steps after the processing steps of FIG. 6 can be performed to replace the sacrificial material layers 42 with electrically conductive layers 46 and to form contact via structures (86, 87) to each of the electrically conductive layers 46. First select gate electrodes SGD1 and second select gate electrodes SGD2 are formed as subsets of the electrically conductive layers 46. The exemplary structure can be diced as needed, and can be packaged in a product module. Prior to usage as a three-dimensional memory device, all memory stack structures 55 that have the first low threshold voltage LVt1 at the level of the first select gate electrodes SGD1 are selected by applying a low drain select gate bias voltage VL. The unselected memory stack structures 55 have the first high threshold voltage HVt1 at the level of the first select gate electrodes SGD1, and are not turned on during the threshold voltage programming operation.

The processing steps of FIG. 17B can be performed to form charge injected regions CIR. The injected and stored electrical charges within the charge storage elements have the effect of raising the threshold voltage of the portions of the vertical semiconductor channels 60 within the selected memory stack structures 55 to the second high threshold voltage HVt2. A region including the programmed (charge-injected) charge storage elements is herein referred to as a charge injected region CIR. The unselected memory stack structures 55 have the original threshold voltage at the level of the second select gate electrodes SGD2, which is the second low threshold voltage LVt2.

Generally, electrical dopants can be implanted into portions of the vertical semiconductor channels 60 employing a single masked ion implantation processes in some embodiments. Portions of the vertical semiconductor channels 60 at a level of the first select gate electrode SGD1 within a first row of memory stack structures 55 (such as any row within string 0) have a greater dopant concentration of electrical dopants than portions of the vertical semiconductor channels 60 at the level of the first select gate electrode SGD1 within the second row of memory stack structures 55 (such as any row within string 1). Electrical charges can be stored in charge storage elements located around portions of the vertical semiconductor channels 60 at a level of the second select gate electrode SGD2 within the second row of memory stack structures 55 (such as any row within string 1), while charge storage elements laterally surrounding portions of the vertical semiconductor channels 60 at the level of the second select gate electrode SGD2 within the first row of memory stack structures 55 (such as any row within string 0) remain free, or substantially free, of trapped electrical charges therein.

Each string (such as string 0 and string 1) can have a single row of memory stack structures 55, two rows of memory stack structures 55, three rows of memory stack structures 55, or more rows (such as any integer from 4 to 16) of memory stack structures 55, for example four rows shown in FIGS. 19A-19B.

Figure 23:
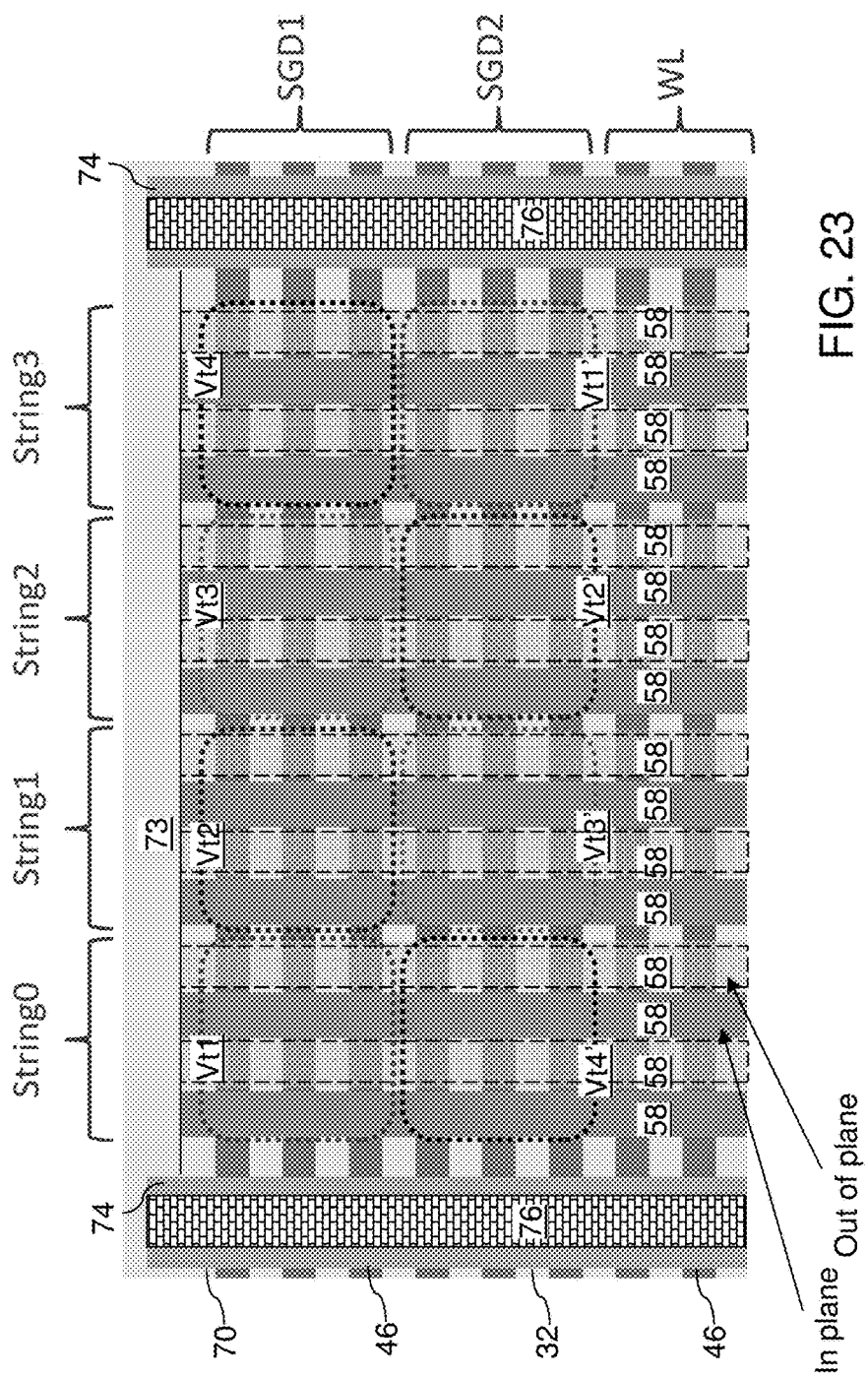
FIG. 23 is a vertical cross-sectional view of a third configuration of the exemplary structure according to a third embodiment of the present disclosure.

Referring to FIG. 23, a third configuration of the exemplary structure according to a third embodiment of the present disclosure is illustrated. The third configuration of the exemplary structure can be derived from the first configuration or the second configuration by providing multiple (e.g., more than 2) threshold voltages for a first select gate electrode SGD1 among the various strings (such as string 0, string 1, string 2, and string 3) that are laterally surrounded by the first select gate electrode SGD1, and by providing multiple (e.g., more than 2) threshold voltages for a second select gate electrode SGD2 among the various string that are laterally surrounded by the second select gate electrode SGD2. A drain select level isolation structure 72 may, or may not be employed in the third configuration. In this configuration, there are four drain select transistors in the first select gate electrode SGD1 level and four additional drain select transistors in the second select gate electrode SGD2 level.

For example, multiple ion implantation steps can be performed to provide different concentrations of electrical dopants into portions of the vertical semiconductor channels 60 within different strings at levels of the first select gate electrodes SGD1 and at levels of the second select gate electrodes SGD2. In an illustrative example, the concentrations of the implanted dopants can be selected such that a first threshold voltage Vt1 for string 0 at the level of the first select gate electrodes SGD1 is greater in magnitude than a second threshold voltage Vt2 for string 1 at the level of the first select gate electrodes SGD1, the second threshold voltage Vt2 for string 1 at the level of the first select gate electrodes SGD1 is greater in magnitude than a third threshold voltage Vt3 for string 2 at the level of the first select gate electrodes SGD1, and the third threshold voltage Vt3 for string 2 at the level of the first select gate electrodes SGD1 is greater in magnitude than a fourth threshold voltage Vt4 for string 3 at the level of the first select gate electrodes SGD1. The order of the magnitude of the threshold voltages can be reversed at the level of the second select gate electrodes SGD2. Specifically, the concentrations of the implanted dopants can be selected such that a first threshold voltage Vt1' for string 3 at the level of the second select gate electrodes SGD2 is greater in magnitude than a second threshold voltage Vt2' for string 2 at the level of the second select gate electrodes SGD2, the second threshold voltage Vt2' for string 2 at the level of the second select gate electrodes SGD2 is greater in magnitude than a third threshold voltage Vt3' for string 1 at the second select gate electrodes SGD2, and the third threshold voltage Vt3' for string 1 at the level of the first select gate electrodes SGD1 is greater in magnitude than a fourth threshold voltage Vt4' for string 0 at the second select gate electrodes SGD2.

Generally, a first row of memory stack structures 55 among the multiple rows of memory stack structures 55 extending through an alternating stack (32, 46) between a pair of backside trenches 79 has a higher threshold voltage for the first select gate electrode SGD1 than a second row of memory stack structures 55 among the multiple rows of memory stack structures 55 has for the first select gate electrode SGD1. A third row of memory stack structures 55 among the multiple rows of memory stack structures 55 has a lower threshold voltage for the first select gate electrode SGD1 than the second row of memory stack structures 55 has for the first select gate electrode SGD1. A fourth row of memory stack structures 55, if present, among the multiple rows of memory stack structures 55 has a lower threshold voltage for the first select gate electrode SGD1 than the third row of memory stack structures 55 has for the first select gate electrode SGD1. If present, an i-th row of memory stack structures 55 among the multiple rows of memory stack structures 55 has a lower threshold voltage for the first select gate electrode SGD1 than the (i−1)-th row of memory stack structures 55 among the multiple rows of memory stack structures has for the first select gate electrode SGD1 for each i greater than 1.

Further, the second row of memory stack structures 55 has a higher threshold voltage for the second select gate electrode SGD2 than the first row of memory stack structures 55 has for the second select gate electrode SGD2. The third row of memory stack structures 55 has a higher threshold voltage for the second select gate electrode SGD2 than the second row of memory stack structures has for the second select gate electrode SGD2. The fourth row of memory stack structures 55, if present, among the multiple rows of memory stack structures 55 has a higher threshold voltage for the second select gate electrode SGD2 than the third row of memory stack structures 55 has for the second select gate electrode SGD2. If present, an i-th row of memory stack structures 55 among the multiple rows of memory stack structures 55 has a higher threshold voltage for the second select gate electrode SGD2 than the (i−1)-th row of memory stack structures 55 among the multiple rows of memory stack structures has for the second select gate electrode SGD2 for each i greater than 1.

In such cases, selection of the first row of memory stack structures 55 can be effected by applying a first bias voltage to the first select gate electrode SGD1 that is greater than the threshold voltage of the first row of memory stack structures 55 for the first select gate electrode SGD1, and by applying a second bias voltage to the second select gate electrode SGD2 that is greater than the threshold voltage of the first row of memory stack structures 55 for the second select gate electrode SGD2 and is less than the threshold voltage of the second row of memory stack structures 55 for the second select gate electrode SGD2. In this case, the vertical semiconductor channels 60 of only the first row of memory stack structures 55 are turned on at the levels of the second select gate electrode SGD2, while the vertical semiconductor channels 60 of the second through last rows of memory stack structures 55 are turned off at the levels of the second select gate electrode SGD2, thereby un-selecting the second through last rows of memory stack structures 55. Thus, only the first row of memory stack structures 55 and any additional row of memory stack structures 55 located within the same string as the first row memory stack structures 55 can be selected.

If n different strings are provided, selection of the n-th (e.g., fourth in the illustrated example) row of memory stack structures 55 can be effected by applying a first bias voltage to the first select gate electrode SGD1 that is greater than the threshold voltage of the n-th row of memory stack structures 55 for the first select gate electrode SGD1 and is less than the threshold voltage of the (n−1)-th row of memory stack structures 55 for the first select gate electrode SGD1, and by a applying a second bias voltage to the second select gate electrode SGD2 that is greater than the threshold voltage of the n-th row of memory stack structures 55 for the second select gate electrode SGD2. In this case, the vertical semiconductor channels 60 of only the n-th row of memory stack structures 55 are turned on at the levels of the first select gate electrode SGD1, while the vertical semiconductor channels 60 of the first through (n−1)-th rows of memory stack structures 55 are turned off at the levels of the first select gate electrode SGD1, thereby un-selecting the first through (n−1)-th memory stack structures 55. Thus, only the n-th row of memory stack structures 55 and any additional row of memory stack structures 55 located within the same string as the n-th row memory stack structures 55 can be selected.

If n different strings are provided, selection of the i-th row of memory stack structures 55 for each i between 1 and n can be effected by applying a first bias voltage to the first select gate electrode SGD1 that is greater than the threshold voltage of the i-th row of memory stack structures 55 for the first select gate electrode SGD1 and is less than the threshold voltage of the (i−1)-th row of memory stack structures 55 for the first select gate electrode SGD1, and by a applying a second bias voltage to the second select gate electrode SGD2 that is greater than the threshold voltage of the i-th row of memory stack structures 55 for the second select gate electrode SGD2 and is less than the threshold voltage of the (i+1)-th row of memory stack structures 55 for the second select gate electrode SGD2. In this case, the vertical semiconductor channels 60 of the i-th through n-th rows of memory stack structures 55 are turned on at the levels of the first select gate electrode SGD1, while the vertical semiconductor channels 60 of the first through (i−1)-th rows of memory stack structures 55 are turned off at the levels of the first select gate electrode SGD1. The vertical semiconductor channels 60 of the first through i-th rows of memory stack structures 55 are turned on at the levels of the second select gate electrode SGD2, while the vertical semiconductor channels 60 of the (i+1)-th to n-th rows of memory stack structures 55 are turned off at the levels of the second select gate electrode SGD2. Thus, only the i-th row of memory stack structures 55 and any additional row of memory stack structures 55 located within the same string as the i-th row memory stack structures 55 can be selected.

Figure 24:
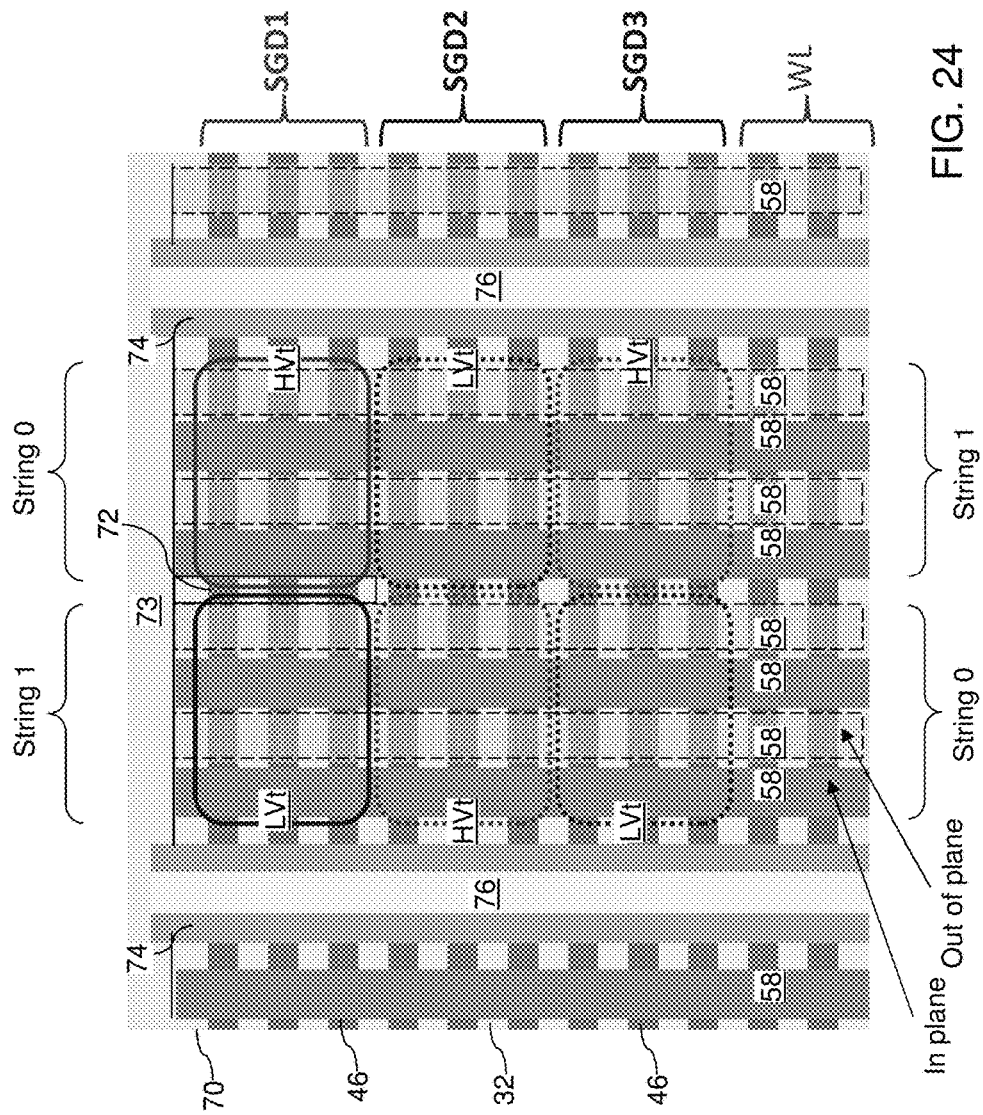
FIG. 24 is a vertical cross-sectional view of a fourth configuration of the exemplary structure according to a fourth embodiment of the present disclosure.

Referring to FIG. 24, a fourth configuration of the exemplary structure according to a fourth embodiment of the present disclosure can be derived from the first, second, or third configuration by forming an additional select gate electrode such as a third select gate electrode SGD3. In this configuration, there are two drain select transistors in the first select gate electrode SGD1 level, two drain select transistors in the second select gate electrode SGD2 level, and two additional drain select transistors in the third select gate electrode SGD3 level.

Optionally, still additional select gate electrode(s), such as a fourth select gate electrode SGD4 (not shown), may be formed below the third select gate electrode SGD3. Generally, at least one additional one of the electrically conductive layers 46 may comprise a third select gate electrode SGD3 for the multiple rows of memory stack structures 55. In this case, threshold voltages for the third select gate electrode SGD3 can be locally modified for the memory stack structures 55 employing any of the methods described above. For example, masked ion implantation can be employed to locally modify the threshold voltages for the first select gate electrode SGD1 for the portions of the vertical semiconductor channels 60 located at the level(s) of the first select gate electrode SGD1, while the threshold voltages for the second and third select gate electrodes can be modified by programming (and verifying) steps described above with respect to FIGS. 17A and 17B, or FIGS. 21A and 21B. In this case, each of the second and third select gate electrodes may include a lower number of electrodes (e.g., one or two electrodes 46D) than the first select gate electrodes.

In one embodiment, a first row of memory stack structures 55 can have a higher threshold voltage for the third select gate electrode SGD3 than a second row of memory stack structures has for the third select gate electrode SGD3 as illustrated in FIG. 24. In this case, the additional control provided by the third select gate electrode SGD3 (and any additional select gate electrodes (not shown) provided underneath) may be employed to provide enhanced control over selection of strings and to reduce leakage current through vertical semiconductor channels 60 of unselected strings.

FIG. 25A is a circuit diagram during selection of string 0 of the fourth configuration of the exemplary structure of FIG. 20. In this case, low bias voltages VL can be applied to the third select gate electrode SGD3, thereby turning on the portions of the vertical semiconductor channels at levels of the third select gate electrode SGD3 only for string 0, while the portions of the vertical semiconductor channels at levels of the third select gate electrode SGD3 for string 1 are turned off. The high bias voltage VH applied to the first and second select gate electrodes turns on portions of the vertical semiconductor channels 60 at the first and second select gate electrodes for each string. The result is turn-on of string 0, and turn-off of string 1.

Figure 25B:
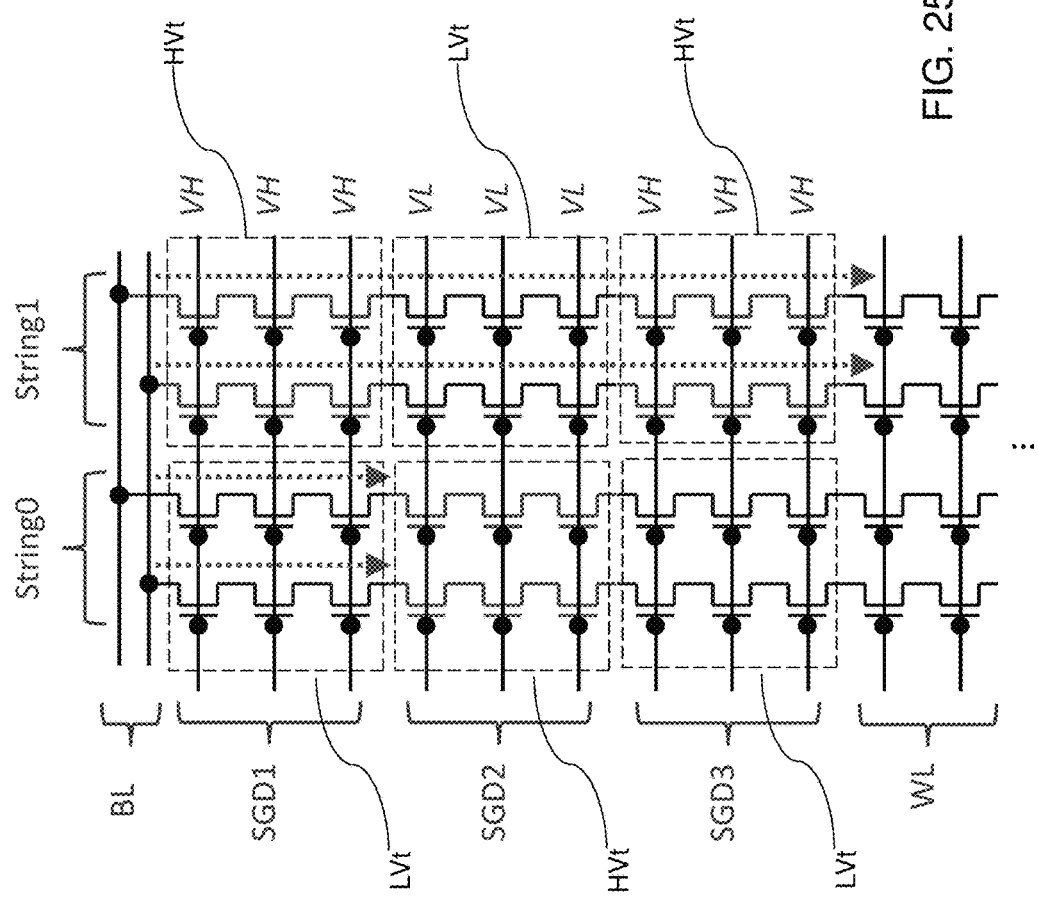
FIG. 25B is a circuit diagram during selection of string 1 of the fourth configuration of the exemplary structure of FIG. 24.

FIG. 25B is a circuit diagram during selection of string 1 of the fourth configuration of the exemplary structure of FIG. 20. In this case, high bias voltages VH can be applied to the first select gate electrode SGD1 and to the third select gate electrode SGD3, thereby turning on the portions of the vertical semiconductor channels at levels of the first select gate electrode SGD1 and the third select gate electrode SGD3 for all strings. The low bias voltage VL applied to the second select gate electrode SGD2 turns on portions of the vertical semiconductor channels 60 at the second select gate electrode SGD2 only for string 1, while the portions of the vertical semiconductor channels at levels of the second select gate electrode SGD3 for string 0 are turned off. The result is turn-on of string 1, and turn-off of string 0.

While only two world lines WL are expressly illustrated in circuit diagrams, it is understood that the total number of word lines WL may be in a range from 8 to 1,024. Further, while three physical drain select gate level electrically conductive layers 46D are illustrated per each select gate electrode (SGD1, SGD2, SGD3), it is understood that the total number of drain select gate level electrically conductive layer(s) 46D per select gate electrode may be one, two, three, four, or any integer number greater than four. If two or more drain select gate level electrically conductive layers 46D are employed for any select gate electrode, the set of all drain select gate level electrically conductive layers 46D for a same select gate electrode may be electrically shorted to so that each drain select gate level electrically conductive layers 46D for the same select gate electrode applies the same bias voltage.

Referring to all drawings and according to various embodiments of the present disclosure, a three-dimensional memory device is provided, which comprises: an alternating stack of insulating layers 32 and electrically conductive layers 46 located over a substrate (9, 10); and a plurality of rows of memory stack structures 55 extending through the alternating stack (32, 46), wherein each of the memory stack structures 55 comprises charge storage elements located at levels of the electrically conductive layers 46 and laterally surrounding a respective vertical semiconductor channel 60, wherein: at least one of the electrically conductive layers 46 comprises a first select gate electrode SGD1 for multiple rows of memory stack structures within the plurality of rows; at least another of the electrically conductive layers 46 comprises a second select gate electrode SGD2 for the multiple rows of memory stack structures; a first row of memory stack structures 55 (such as one in string 0) among the multiple rows of memory stack structures 55 has a higher threshold voltage for the first select gate electrode SGD1 than a second row of memory stack structures 55 (such as one in string 1) among the multiple rows of memory stack structures 55 has for the first select gate electrode SGD1; and the first row of memory stack structures 55 has a lower threshold voltage for the second select gate electrode SGD2 than the second row of memory stack structures 55 has for the second select gate electrode SGD2.

In one embodiment, portions of the vertical semiconductor channels 60 at a level of the first select gate electrode SGD1 within the first row of memory stack structures 55 have a greater dopant concentration of electrical dopants than portions of the vertical semiconductor channels 60 at the level of the first select gate electrode SGD1 within the second row of memory stack structures 55; and portions of the vertical semiconductor channels 60 at a level of the second select gate electrode SGD2 within the second row of memory stack structures 55 have a greater dopant concentration of electrical dopants than portions of the vertical semiconductor channels 60 at the level of the second select gate electrode SGD2 within the first row of memory stack structures 55. In one embodiment, the electrical dopants in the vertical semiconductor channels 60 are p-type electrical dopants; and a top end of each of the vertical semiconductor channels 60 adjoins an n-doped active region such as a drain region 63.

In one embodiment, portions of the vertical semiconductor channels 60 at a level of the first select gate electrode SGD1 within the first row of memory stack structures 55 have a greater dopant concentration of electrical dopants than portions of the vertical semiconductor channels 60 at the level of the first select gate electrode SGD1 within the second row of memory stack structures 55; and charge storage elements (such as portions of the charge storage layer 54) laterally surrounding portions of the vertical semiconductor channels 60 at a level of the second select gate electrode SGD2 within the second row of memory stack structures 55 has more stored electrical charges per charge storage element than charge storage elements laterally surrounding portions of the vertical semiconductor channels 55 at the level of the second select gate electrode SGD2 within the first row of memory stack structures 55, which may be free, or substantially free, of electrical charges.

In one embodiment, the three-dimensional memory device can further comprise a first insulating material portion and a second insulating material portion (such as insulating spacers 74) vertically extending from a topmost one of the electrically conductive layers 46 to a bottommost one of the electrically conductive layers 46, wherein each insulating layer 32 in the alternating stack (32, 46) laterally extend from the first insulating material portion to the second insulating material portion.

In one embodiment, each of the at least one of the electrically conductive layers 46D comprising the first select gate electrode SGD1 and each of the at least another of the electrically conductive layers 46D comprising the second select gate electrode SGD2 laterally extends from the first insulating material portion to the second insulating material portion.

In one embodiment, the three-dimensional memory device further comprises a dielectric isolation structure 72 embedded in an upper portion of the alternating stack (32, 46), wherein: the at least one of the electrically conductive layers 46D overlie the at least another of the electrically conductive layers 46D; the dielectric isolation structure 72 laterally divides each of the at least one of the electrically conductive layers 46D into the first select gate electrode SGD1 and an additional first select gate electrode SGD1; each of the first select gate electrode SGD1 and the additional first select gate electrode SGD1 has a lateral extent that is less than a lateral distance between the first insulating material portion and the second insulating material portion; and each of the at least another of the electrically conductive layers 46 laterally extends from the first insulating material portion to the second insulating material portion.

In one embodiment, a third row (such as one in string 2) of memory stack structures 55 and a fourth row (such as one in string 3) of memory stack structures 55 among the memory stack structures 55 extend through the additional first select gate electrode SGD1 and the second select gate electrode SGD2; the third row of memory stack structures 55 has a higher threshold voltage for the additional first select gate electrode SGD1 than the fourth row of memory stack structures 55 has for the additional first select gate electrode SGD1; and the third row of memory stack structures 55 has a lower threshold voltage for the second select gate electrode SGD2 than the fourth row of memory stack structures 55 has for the second select gate electrode SGD2.

In one embodiment, a third row (such as string 2 of FIG. 23) of memory stack structures 55 among the multiple rows of memory stack structures 55 has a lower threshold voltage for the first select gate electrode SGD1 than the second row (such as string 1 of FIG. 23) of memory stack structures 55 has for the first select gate electrode SGD1; and the third row of memory stack structures 55 has a higher threshold voltage for the second select gate electrode SGD2 than the second row of memory stack structures 55 has for the second select gate electrode SGD2.

In one embodiment, at least one additional one of the electrically conductive layers 46 comprise a third select gate electrode SGD3 for the multiple rows of memory stack structures 55; and the first row (such as string 0 of FIG. 24) of memory stack structures 55 has a higher threshold voltage for the third select gate electrode SGD3 than the second row of memory stack structures 55 has for the third select gate electrode SGD3.

In one embodiment, the first row of memory stack structures 55 is located in a first memory string (string 0), and the second row of memory stack structures 55 is located in a second memory string (string 1). A first bit line 90 of a plurality of bit lines is electrically connected by first drain contact via structure 88A to a first memory stack structure 55A in the first memory string (string 0) and is electrically connected by a second drain contact via structure 88B to a second memory stack structure 55B in the second memory string (string 1). A portion of the electrically conductive layers 46 located under the first and the second select gate electrodes 46D comprise word lines 46W. The word lines 46W contact the first memory stack structure 55A and the second memory stack structure 55B without being cut by a backside trench 79 or a dielectric isolation structure 72. In other words, each bit line 90 is electrically connected via the respective drain contact via structure (88A, 88B) to more than one memory stack structure (55A, 55B) in different memory strings located in a region that is not interrupted by a backside trench 79 and/or dielectric isolation structure 72. Thus, there is no backside trench 79 and/or dielectric isolation structure 72 located between the memory stack structures 55A and 55B that are electrically contacted by the same bit line 90.

In one embodiment, the alternating stack (32, 46) comprises a terrace region in which each electrically conductive layer 46 other than a topmost electrically conductive layer 46D within the alternating stack (32, 46) laterally extends farther than an overlying electrically conductive layer 46 within the alternating stack (32, 46); the terrace region includes stepped surfaces of the alternating stack (32, 46)

that continuously extend from a bottommost layer within the alternating stack (32, 46) to a topmost layer within the alternating stack (32, 46); and support pillar structures 20 extend through a retro-stepped dielectric material portion 65 that overlies the stepped surfaces, through the stepped surfaces, and to a top surface of the substrate (9, 10).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The various structures of the present disclosure can be employed to provide a greater number of strings between a neighboring pair of backside trenches without forming additional drain select level isolation structures 72. Local modification of threshold voltages permits selection of strings without use of drain select level isolation structures or with a lesser number of drain select level isolation structures. Further, local modification of threshold voltages can provide a larger number of strings between a neighboring pair of backside trenches than conventional structures. Furthermore, each bit line 90 is electrically connected to more than one memory stack structure (55A, 55B) in different memory strings located in a region that is not interrupted by a backside trench 79 and/or dielectric isolation structure 72, as shown in FIG. 14C. Furthermore, wider bit lines 90 can be formed without a corresponding loss in device area. The wider bit lines 90 have a lower resistance and improve device performance. Thus, the methods and structures of embodiments of the present disclosure can increase the device density of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate; and
   a plurality of rows of memory stack structures extending through the alternating stack, wherein each of the memory stack structures comprises charge storage elements located at levels of the electrically conductive layers and laterally surrounding a respective vertical semiconductor channel, wherein:
   at least one of the electrically conductive layers comprises a first select gate electrode for multiple rows of memory stack structures within the plurality of rows;
   at least another of the electrically conductive layers comprises a second select gate electrode for the multiple rows of memory stack structures;
   a first row of memory stack structures among the multiple rows of memory stack structures has a higher threshold voltage for the first select gate electrode than a second row of memory stack structures among the multiple rows of memory stack structures has for the first select gate electrode; and
   the first row of memory stack structures has a lower threshold voltage for the second select gate electrode than the second row of memory stack structures has for the second select gate electrode.

2. The three-dimensional memory device of claim 1, wherein:
   the first select gate electrode is located above the second select gate electrode;
   portions of the vertical semiconductor channels at a level of the first select gate electrode within the first row of memory stack structures have a greater dopant concentration of electrical dopants than portions of the vertical semiconductor channels at the level of the first select gate electrode within the second row of memory stack structures; and
   portions of the vertical semiconductor channels at a level of the second select gate electrode within the second row of memory stack structures have a greater dopant concentration of electrical dopants than portions of the vertical semiconductor channels at the level of the second select gate electrode within the first row of memory stack structures.

3. The three-dimensional memory device of claim 2, wherein:
   the electrical dopants in the vertical semiconductor channels are p-type electrical dopants; and a top end of each of the vertical semiconductor channels adjoins an n-doped drain region.

4. The three-dimensional memory device of claim 1, wherein:
portions of the vertical semiconductor channels at a level of the first select gate electrode within the first row of memory stack structures have a greater dopant concentration of electrical dopants than portions of the vertical semiconductor channels at the level of the first select gate electrode within the second row of memory stack structures; and
charge storage elements laterally surrounding portions of the vertical semiconductor channels at a level of the second select gate electrode within the second row of memory stack structures have more stored electrical charges per charge storage element than charge storage elements laterally surrounding portions of the vertical semiconductor channels at the level of the second select gate electrode within the first row of memory stack structures.

5. The three-dimensional memory device of claim 1, further comprising a first insulating material portion and a second insulating material portion vertically extending from a topmost one of the electrically conductive layers to a bottommost one of the electrically conductive layers, wherein each insulating layer in the alternating stack laterally extends from the first insulating material portion to the second insulating material portion.

6. The three-dimensional memory device of claim 5, wherein each of the at least one of the electrically conductive layers comprising the first select gate electrode and each of the at least another of the electrically conductive layers comprising the second select gate electrode laterally extends from the first insulating material portion to the second insulating material portion.

7. The three-dimensional memory device of claim 5, further comprising a dielectric isolation structure embedded in an upper portion of the alternating stack, wherein:
the at least one of the electrically conductive layers overlie the at least another of the electrically conductive layers;
the dielectric isolation structure laterally divides each of the at least one of the electrically conductive layers into the first select gate electrode and an additional first select gate electrode;
each of the first select gate electrode and the additional first select gate electrode has a lateral extent that is less than a lateral distance between the first insulating material portion and the second insulating material portion;
each of the at least another of the electrically conductive layers laterally extends from the first insulating material portion to the second insulating material portion;
a third row of memory stack structures and a fourth row of memory stack structures among the memory stack structures extend through the additional first select gate electrode and the second select gate electrode;
the third row of memory stack structures has a higher threshold voltage for the additional first select gate electrode than the fourth row of memory stack structures has for the additional first select gate electrode; and
the third row of memory stack structures has a lower threshold voltage for the second select gate electrode than the fourth row of memory stack structures has for the second select gate electrode.

8. The three-dimensional memory device of claim 1, wherein:
a third row of memory stack structures among the multiple rows of memory stack structures has a lower threshold voltage for the first select gate electrode than the second row of memory stack structures has for the first select gate electrode; and
the third row of memory stack structures has a higher threshold voltage for the second select gate electrode than the second row of memory stack structures has for the second select gate electrode.

9. The three-dimensional memory device of claim 1, wherein:
at least one additional one of the electrically conductive layers comprise a third select gate electrode for the multiple rows of memory stack structures; and
the first row of memory stack structures has a higher threshold voltage for the third select gate electrode than the second row of memory stack structures has for the third select gate electrode.

10. The three-dimensional memory device of claim 1, further comprising a plurality of bit lines extending over the memory stack structures, wherein:
the first row of memory stack structures is located in a first memory string;
the second row of memory stack structures is located in a second memory string;
a first bit line of the plurality of bit lines is electrically connected by first drain contact via structure to a first memory stack structure in the first memory string and is electrically connected by a second drain contact via structure to a second memory stack structure in the second memory string;
a portion of the electrically conductive layers located under the first and the second select gate electrodes comprise word lines; and
the word lines contact the first memory stack structure and the second memory stack structure without being cut by a trench or a dielectric isolation structure.

11. The three-dimensional memory device of claim 1, wherein:
the three-dimensional memory device comprises a monolithic three-dimensional NAND memory device;
a subset of the electrically conductive layers located below the drain select gate electrodes comprises, or is electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the control gate electrodes have a strip shape extending substantially parallel to the top surface of the substrate, and the control gate electrodes comprise at least a first control gate electrode located in the first device level and a second control gate electrode located in the second device level.

* * * * *